US012727182B2

(12) United States Patent
Hsu et al.

(10) Patent No.: US 12,727,182 B2
(45) Date of Patent: Sep. 1, 2026

(54) ELECTROSTATIC DISCHARGE CIRCUITRY FOR A HIGH-VOLTAGE SEMICONDUCTOR DEVICE

(71) Applicant: Taiwan Semiconductor Manufacturing Company, Ltd., Hsinchu (TW)

(72) Inventors: Sheng-Fu Hsu, Hsinchu (TW); Shih-Fan Chen, Hsinchu City (TW); Chen-Yi Lee, Keelung City (TW); Pin-Chen Chen, New Taipei City (TW); Lin-Yu Huang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 505 days.

(21) Appl. No.: 18/338,808

(22) Filed: Jun. 21, 2023

(65) Prior Publication Data

US 2024/0429310 A1 Dec. 26, 2024

(51) Int. Cl.
*H10D 10/60* (2025.01)
*H03K 17/081* (2006.01)
(Continued)

(52) U.S. Cl.
CPC ....... *H10D 10/60* (2025.01); *H03K 17/08104* (2013.01); *H03K 17/08112* (2013.01);
(Continued)

(58) Field of Classification Search
CPC . H10D 89/10–105; H10D 89/711–713; H10D 89/611; H10D 89/813; H10D 89/60;
(Continued)

(56) References Cited

U.S. PATENT DOCUMENTS 5,077,591 A * 12/1991 Chen .................... H10D 89/711 257/551
2004/0110353 A1* 6/2004 Mallikarjunaswamy .................... H10D 10/891 257/E27.036
(Continued)

FOREIGN PATENT DOCUMENTS

CN 111739938 A * 10/2020 .......... H10D 64/111

OTHER PUBLICATIONS

Han et al., Semiconductor device, 2020, machine translation of CN 111739938 A, pp. 1-6. (Year: 2020).*

*Primary Examiner* — Natalia A Gondarenko
(74) *Attorney, Agent, or Firm* — Harrity & Harrity, LLP

(57) ABSTRACT

A semiconductor device may include a electrostatic discharge (ESD) protection circuit and a high voltage ESD triggering circuit that is configured to trigger ESD protection for high voltage circuits of the semiconductor device. The high voltage ESD triggering circuit may be implemented by one or more of the example implementations of high voltage ESD triggering circuits described herein. The example implementations of high voltage ESD triggering circuits described herein are capable of handle high voltages of the high voltage circuits included in the semiconductor device. This reduces the likelihood of and/or prevents premature triggering of ESD protection during normal operation for these high voltage circuits, and enables the high voltage circuits to be protected from high voltage ESD events.

20 Claims, 53 Drawing Sheets

(51) Int. Cl.
*H10D 10/01* (2025.01)
*H10D 62/10* (2025.01)
*H10D 64/00* (2025.01)
*H10D 89/60* (2025.01)

(52) U.S. Cl.
CPC ......... *H10D 10/061* (2025.01); *H10D 62/107* (2025.01); *H10D 62/115* (2025.01); *H10D 62/124* (2025.01); *H10D 64/112* (2025.01); *H10D 89/711* (2025.01)

(58) Field of Classification Search
CPC .......... H10D 8/00; H10D 8/045; H10D 8/411; H10D 62/10; H10D 62/107; H10D 62/115; H10D 62/123; H10D 62/124; H10D 62/126; H10D 62/128; H10D 62/134; H10D 62/137; H10D 62/177; H10D 62/60; H10D 62/133; H10D 62/184; H10D 10/061; H10D 10/00; H10D 10/40; H10D 10/60; H10D 64/112; H10D 64/281; H10D 64/231; H10D 84/00; H10D 84/121; H10D 84/0191; H10D 84/153; H10D 84/811–817; H10D 84/60; H10D 84/611–619; H10D 84/63; H10D 84/67; H10D 84/641–643; H10D 86/00; H10D 84/401–409; H10D 84/204; H10D 84/221; H03K 17/08104; H03K 17/08112; H02H 9/046; H02H 9/04; H02H 3/20
USPC ................................ 257/592, 197, 198, 369
See application file for complete search history.

(56) References Cited

U.S. PATENT DOCUMENTS

| | | | | |
|---|---|---|---|---|
| 2016/0300828 | A1* | 10/2016 | Laine | H01L 21/266 |
| 2017/0098644 | A1* | 4/2017 | Hong | H10D 89/713 |
| 2017/0345902 | A1* | 11/2017 | Chen | H10D 62/184 |
| 2018/0082994 | A1* | 3/2018 | Han | H10D 84/00 |
| 2018/0247929 | A1* | 8/2018 | Shrivastava | H10D 30/6211 |
| 2019/0207017 | A1* | 7/2019 | Sadovnikov | H01L 21/31105 |
| 2021/0249516 | A1* | 8/2021 | Li | H10D 30/62 |
| 2023/0420448 | A1* | 12/2023 | Mitra | H10D 89/713 |

* cited by examiner 302
206
400

700

206

316
326
312
308
304
316
220
314
310
306
320
802
316
224
312
308
304
322
804
316
324
222
310
306
320
802
218
302
206
806

0107-0303

1300

0107-0303

0107-0303

0107-0303

ELECTROSTATIC DISCHARGE CIRCUITRY FOR A HIGH-VOLTAGE SEMICONDUCTOR DEVICE

BACKGROUND

Electrostatic discharge (ESD) is a concern for semiconductor integrated circuits (ICs). If not handled properly, an ESD event can result in a high voltage that may damage device circuitry of a semiconductor device. To prevent ESD-related damage, a semiconductor device may include an ESD protection circuit. The ESD protection circuit may be operable to divert electrical current away from device circuitry of the semiconductor device during an ESD event, thereby protecting the device circuitry from being damaged by the ESD event.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
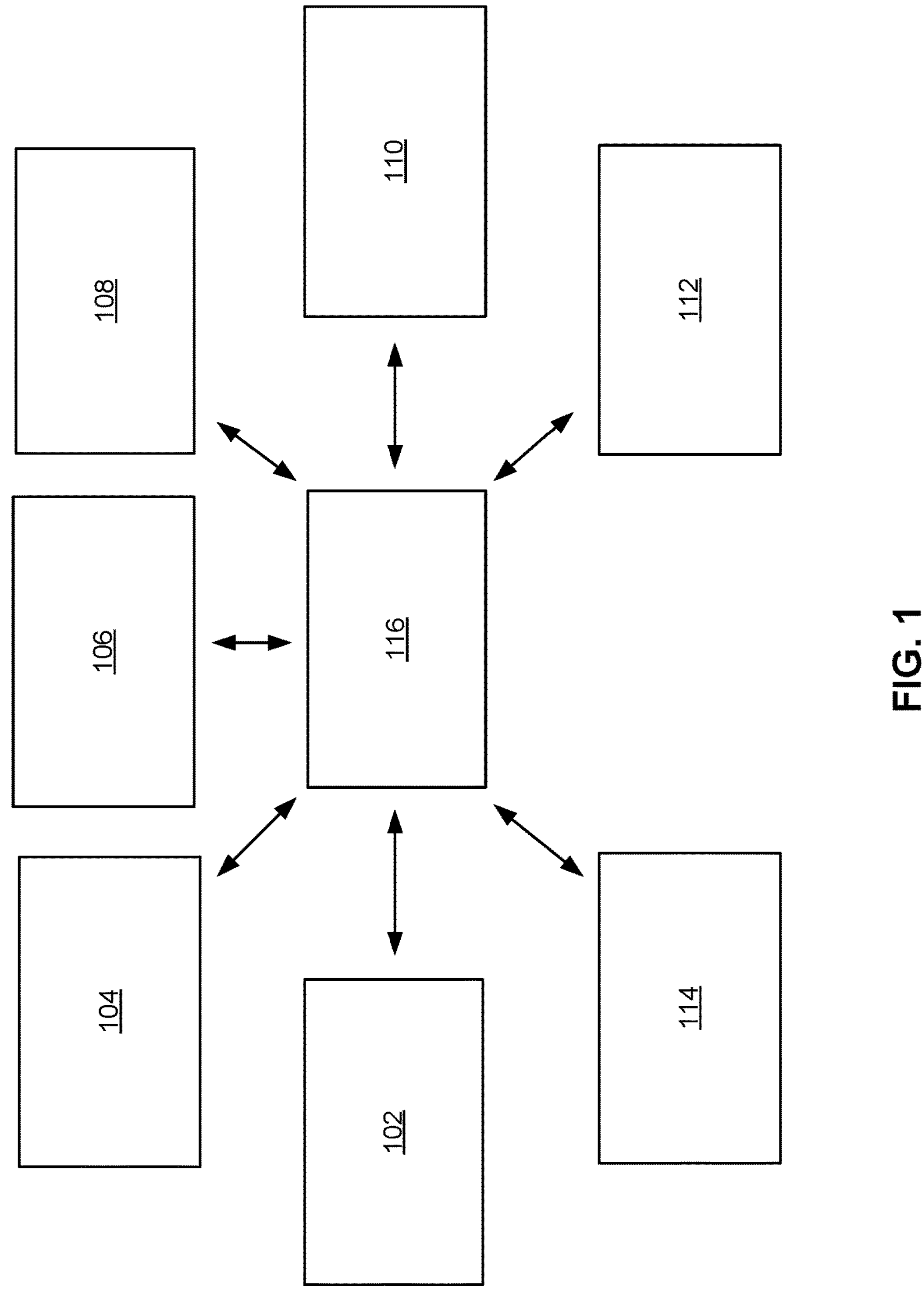
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some semiconductor devices include high voltage circuits that are configured to operate at high voltages (e.g., greater than 40 volts, for example). Traditional electrostatic discharge (ESD) protection circuits may be triggered by ESD triggering circuitry that is unable to handle the high voltages of these high voltage circuits and may prematurely trigger ESD protection during normal operation for these high voltage circuits, thereby rendering the high voltage circuits inoperable.

In some implementations described herein, a semiconductor device may include an ESD protection circuit and a high voltage ESD triggering circuit that is configured to trigger ESD protection for high voltage circuits of the semiconductor device. The high voltage ESD triggering circuit may be implemented by one or more of the example implementations of high voltage ESD triggering circuits described herein. The example implementations of high voltage ESD triggering circuits described herein are capable of handle high voltages of the high voltage circuits included in the semiconductor device. This reduces the likelihood of and/or prevents premature triggering of ESD protection during normal operation for these high voltage circuits, and enables the high voltage circuits to be protected from high voltage ESD events.

FIG. 1 is a diagram of an example environment 100 in which systems and/or methods described herein may be implemented. As shown in FIG. 1, environment 100 may include a plurality of semiconductor processing tools 102-114 and a wafer/die transport tool 116. The plurality of semiconductor processing tools 102-114 may include a deposition tool 102, an exposure tool 104, a developer tool 106, an etch tool 108, a planarization tool 110, a plating tool 112, an ion implantation tool 114, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma enhanced CVD (PECVD) tool, a low pressure CVD (LPCVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

The ion implantation tool 114 is a semiconductor processing tool that is capable of implanting ions into a substrate. The ion implantation tool 114 may generate ions in an arc chamber from a source material such as a gas or a solid. The source material may be provided into the arc chamber, and an arc voltage is discharged between a cathode and an electrode to produce a plasma containing ions of the source material. One or more extraction electrodes may be used to extract the ions from the plasma in the arc chamber and accelerate the ions to form an ion beam. The ion beam may be directed toward the substrate such that the ions are implanted below the surface of the substrate.

The wafer/die transport tool 116 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 116 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations).

In some implementations, one or more of the semiconductor processing tools 102-114 and/or the wafer/die transport tool 116 may perform one or more semiconductor processing operations described herein. For example, one or more of the semiconductor processing tools 102-114 and/or the wafer/die transport tool 116 may forming a plurality of shallow trench isolation (STI) regions in a substrate of a semiconductor device; may form, for a PNP ESD triggering device of the semiconductor device, an n-doped base in the substrate and between a first STI region and a second STI region of the plurality of STI regions, a p-doped collector in the substrate and between the second STI region and a third STI region of the plurality of STI regions, a first portion of the substrate is located between a first n-doped well of the n-doped base and a p-doped well of the p-doped collector, and a p-doped emitter in the substrate and between the third STI region and a fourth STI region of the plurality of STI regions, and a second portion of the substrate is located between the p-doped well of the p-doped collector and a second n-doped well of the p-doped emitter; may form a first field plate structure on the second STI region; and/or may form a second field plate structure on the third STI region, among other examples.

As another example, one or more of the semiconductor processing tools 102-114 and/or the wafer/die transport tool 116 may form, in a substrate of a semiconductor device, an n-doped base of a PNP ESD triggering device; a p-doped collector of the PNP ESD triggering device, where a first portion of the substrate is located between a first n-doped well of the n-doped base and a p-doped well of the p-doped collector; and a p-doped emitter of the PNP ESD triggering device, where a second portion of the substrate is located between the p-doped well of the p-doped collector and a second n-doped well of the p-doped emitter; and a plurality of n-doped barrier regions in the substrate that include a first n-doped barrier region under the first n-doped well of the n-doped base and a second n-doped barrier region under the second n-doped well of the p-doped collector, where a third portion of the substrate is located between the first n-doped barrier region and the second n-doped barrier region.

As another example, one or more of the semiconductor processing tools 102-114 and/or the wafer/die transport tool 116 may form, in the substrate of a semiconductor device, an n-doped base of a PNP ESD triggering device, the n-doped base including a first plurality of fin-shaped structures; a p-doped emitter of the PNP ESD triggering device, the p-doped emitter including a second plurality of fin-shaped structures, where a first portion of the substrate is located between a first n-doped well of the n-doped base and a p-doped well of the p-doped emitter; and a p-doped collector of the PNP ESD triggering device, the p-doped collector including a third plurality of fin-shaped structures, where a second portion of the substrate is located between the p-doped well of the p-doped emitter and a second n-doped well of the p-doped collector.

One or more of the semiconductor processing tools 102-114 and/or the wafer/die transport tool 116 may perform other semiconductor processing operations described herein, such as in connection with FIGS. 4A-4J, 7A-7C, and/or 13, among other examples.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of the example environment 100 may perform one or more functions described as being performed by another set of devices of the example environment 100.

Figure 2A:
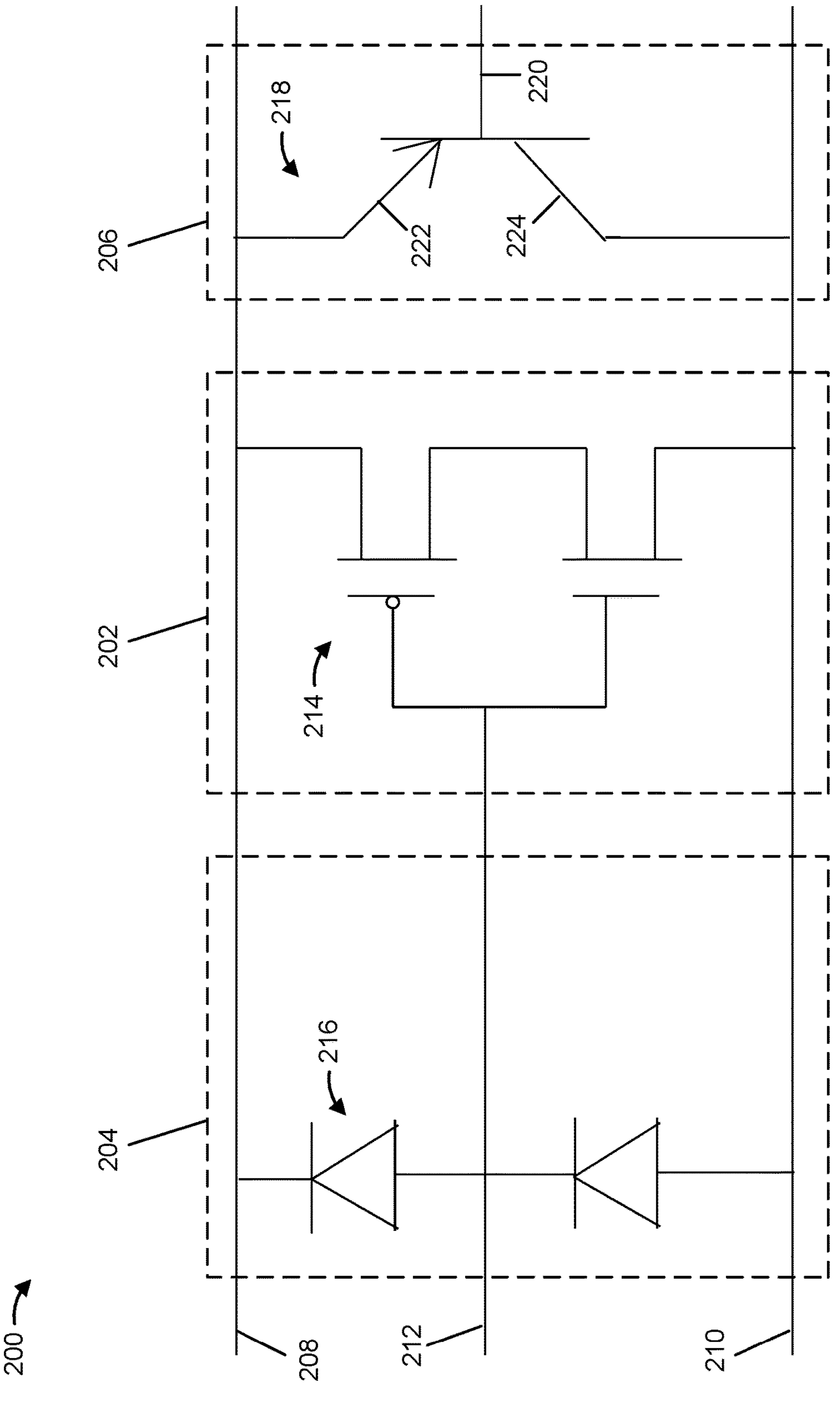
FIGS. 2A-2C are diagrams of example semiconductor devices described herein.
Figure 2B:
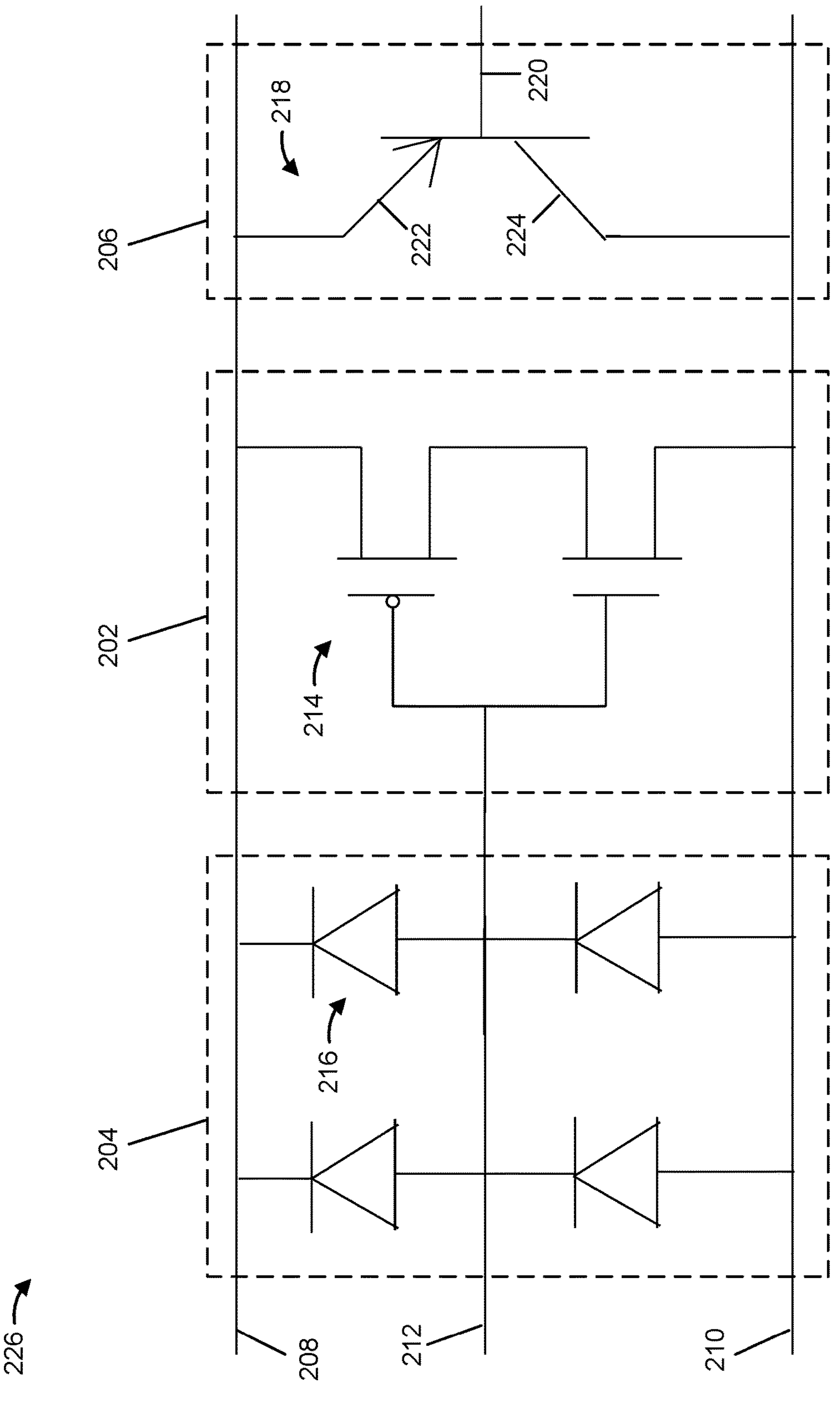
Figure 2C:
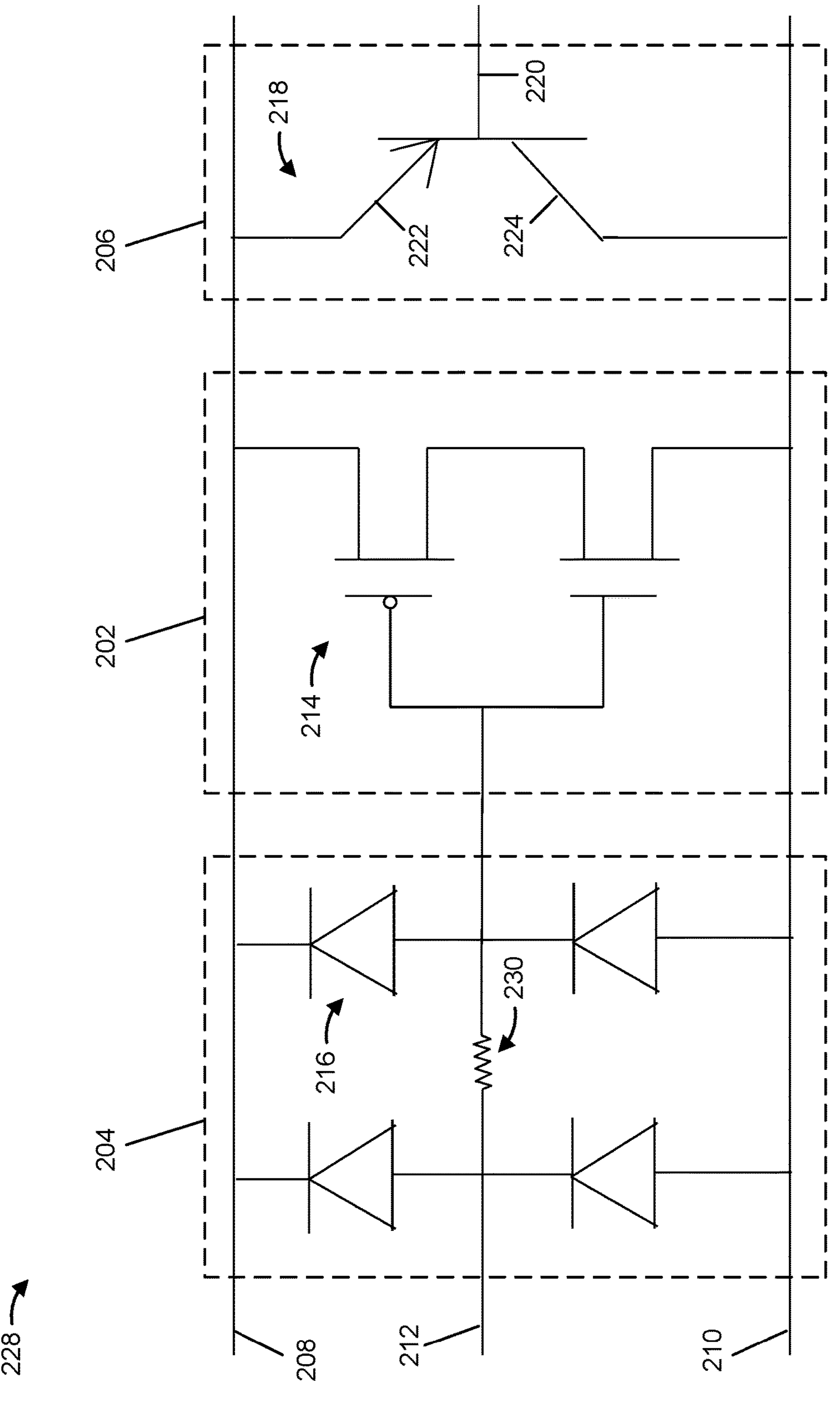

FIGS. 2A-2C are diagrams of example semiconductor devices described herein. The semiconductor device 200 may include a logic device (e.g., a processor, a central processing unit (CPU), a graphics processing unit (GPU)), a memory device (e.g., a dynamic random access memory (DRAM) device, a static random access memory (SRAM) device), a display panel device (e.g., a display panel driver including a driver integrated circuit (IC), a line driver IC, a level shifter IC), and/or another type of semiconductor device 200 that includes high voltage semiconductor devices.

As shown in FIG. 2A, an example semiconductor device 200 may include a device circuit 202, an ESD protection circuit 204, and an ESD triggering circuit 206, among other types of circuits. The device circuit 202, the ESD protection circuit 204, and/or the ESD triggering circuit 206 may be coupled with a drain input 208, a source input 210, and/or a control input 212, among other examples.

The device circuit 202 may include one or more transistors 214. The one or more transistors may be configured to perform logic operations, memory operations, power supply operations, analog-to-digital conversion operations, and/or other types of semiconductor device operations. In some implementations, the transistors 214 may be configured as complementary metal oxide semiconductor (CMOS) logic circuitry or another type of circuitry. In some implementations, the device circuit 202 includes a high voltage device circuit, and the transistors 214 include high voltage transistors. A high voltage transistor may include a high voltage planar transistor, a high voltage fin field effect transistor (finFET), a high voltage nanostructure (e.g., a gate all around (GAA) transistor, a nanowire transistor, a nanosheet transistor, a multi-bridge channel transistor, a nanoribbon transistor), and/or another type of high voltage transistor that is configured to operate at high voltages (e.g., greater than 40 volts, for example).

The ESD protection circuit 204 may include one or more ESD protection devices 216 that are configured to provide ESD protection for the device circuit 202 against high voltage spikes, high voltage surges, and/or other types of high voltage events. For example, the ESD protection circuit 204 may include one or more diodes and/or one or more of another type of ESD protection device that are configured to provide ESD protection for the device circuit 202 against high voltage spikes, high voltage surges, and/or other types of high voltage events. As shown in FIG. 2A, in the example semiconductor device 200, the ESD protection devices 216 may be connected in series with each other, and the ESD protection devices 216 may be connected to the drain input 208, the source input 210, and the control input 212.

The ESD triggering circuit 206 may include one or more PNP ESD triggering devices 218. A PNP ESD triggering device 218 may be configured to redirect electrical current away from the device circuit 202 and toward the ESD protection circuit 204 based on or in response to a high voltage event so that the ESD protection circuit 204 can discharge the electrical current, thereby protecting the device circuit 202. The PNP ESD triggering device 218 may include a bipolar junction transistor (BJT) that is configured to trigger activation of the ESD protection circuit 204 based on a voltage for the device circuit 202 satisfying a threshold voltage. The threshold voltage may be greater relative to the operating voltage of the device circuit 202. For example, if the device circuit 202 operates at approximately 40 volts, the threshold voltage may be included in a range of approximately 50 volts to approximately 65 volts. However, other values for the range are within the scope of the present disclosure. The PNP ESD triggering device 218 may include an n-doped base 220, a p-doped emitter 222, and a p-doped collector 224, thereby forming the PNP structure of the PNP ESD triggering device 218.

FIG. 2B illustrates another example semiconductor device 226. As shown in FIG. 2B, the semiconductor device 226 may include a similar configuration of circuits as the semiconductor device 200. For example, the semiconductor device 226 may include a device circuit 202, an ESD protection circuit 204, and an ESD triggering circuit 206. The device circuit 202 may include one or more transistors 214, the ESD protection circuit 204 may include a plurality of ESD protection devices 216, and the ESD triggering circuit 206 may include one or more PNP ESD triggering devices 218. As further shown in FIG. 2B, the ESD protection circuit 204 may include a plurality of pairs of ESD protection devices 216 that are connected in parallel in the ESD protection circuit 204. The ESD protection devices 216 may be connected in series with each other, and the ESD protection devices 216 may be connected to the drain input 208, the source input 210, and the control input 212.

FIG. 2C illustrates another example semiconductor device 228. As shown in FIG. 2C, the semiconductor device 228 may include a similar configuration of circuits as the semiconductor device 200 and the semiconductor device 226. For example, the semiconductor device 228 may include a device circuit 202, an ESD protection circuit 204, and an ESD triggering circuit 206. The device circuit 202 may include one or more transistors 214, the ESD protection circuit 204 may include a plurality of ESD protection devices 216, and the ESD triggering circuit 206 may include one or more PNP ESD triggering devices 218.

As further shown in FIG. 2C, the ESD protection circuit 204 may include a plurality of pairs of ESD protection devices 216 that are connected in parallel in the ESD protection circuit 204. The ESD protection devices 216 may be connected in series with each other, and the ESD protection devices 216 may be to the drain input 208, the source input 210, and the control input 212. As further shown in FIG. 2C, the ESD protection circuit 204 may include a resistor 230 that cross couples the pairs of ESD protection devices 216.

As indicated above, FIGS. 2A-2C are provided as examples. Other examples may differ from what is described with regard to FIGS. 2A-2C.

Figure 3A:
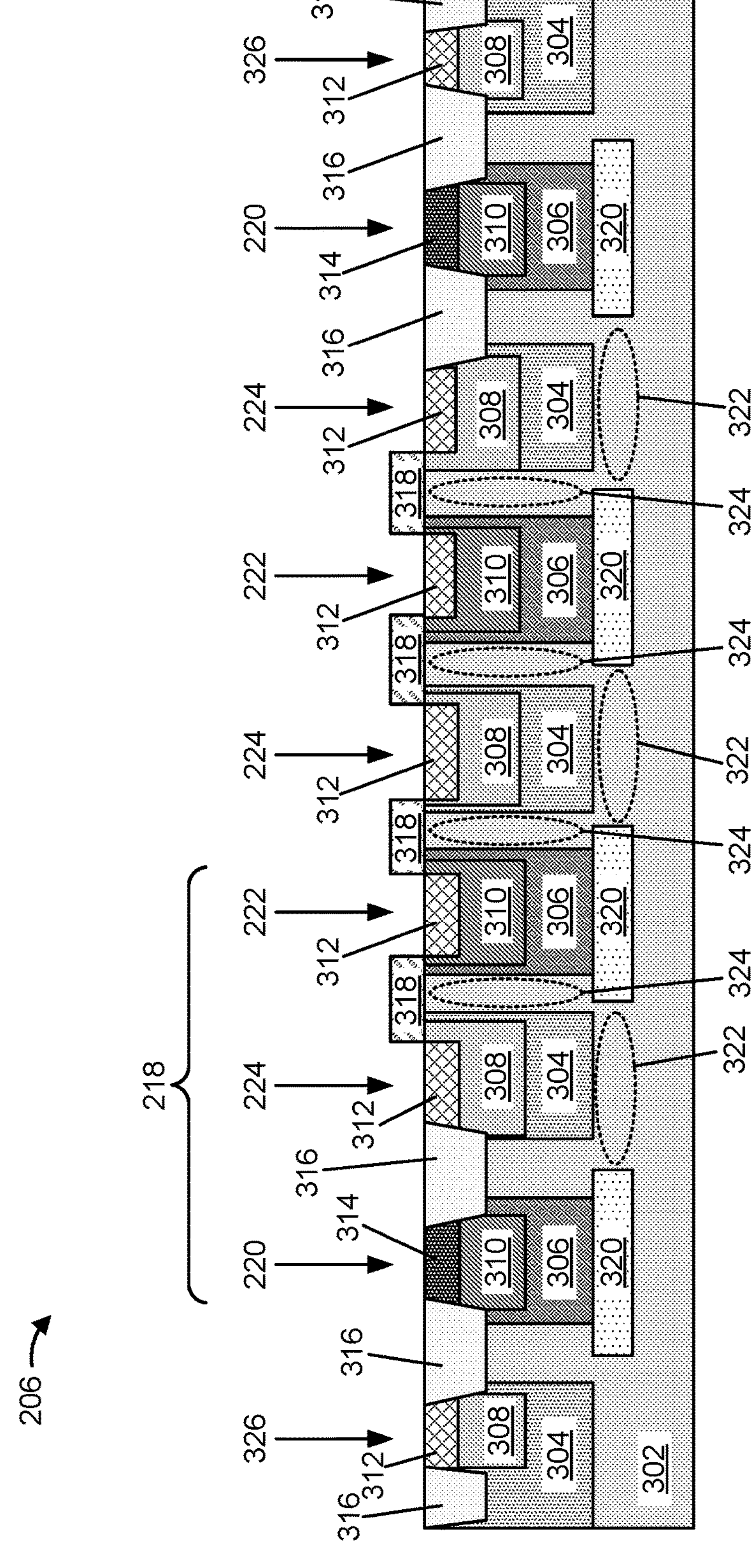
FIGS. 3A-3C are diagrams of example implementations of an electrostatic discharge (ESD) triggering circuit described herein.
Figure 3B:
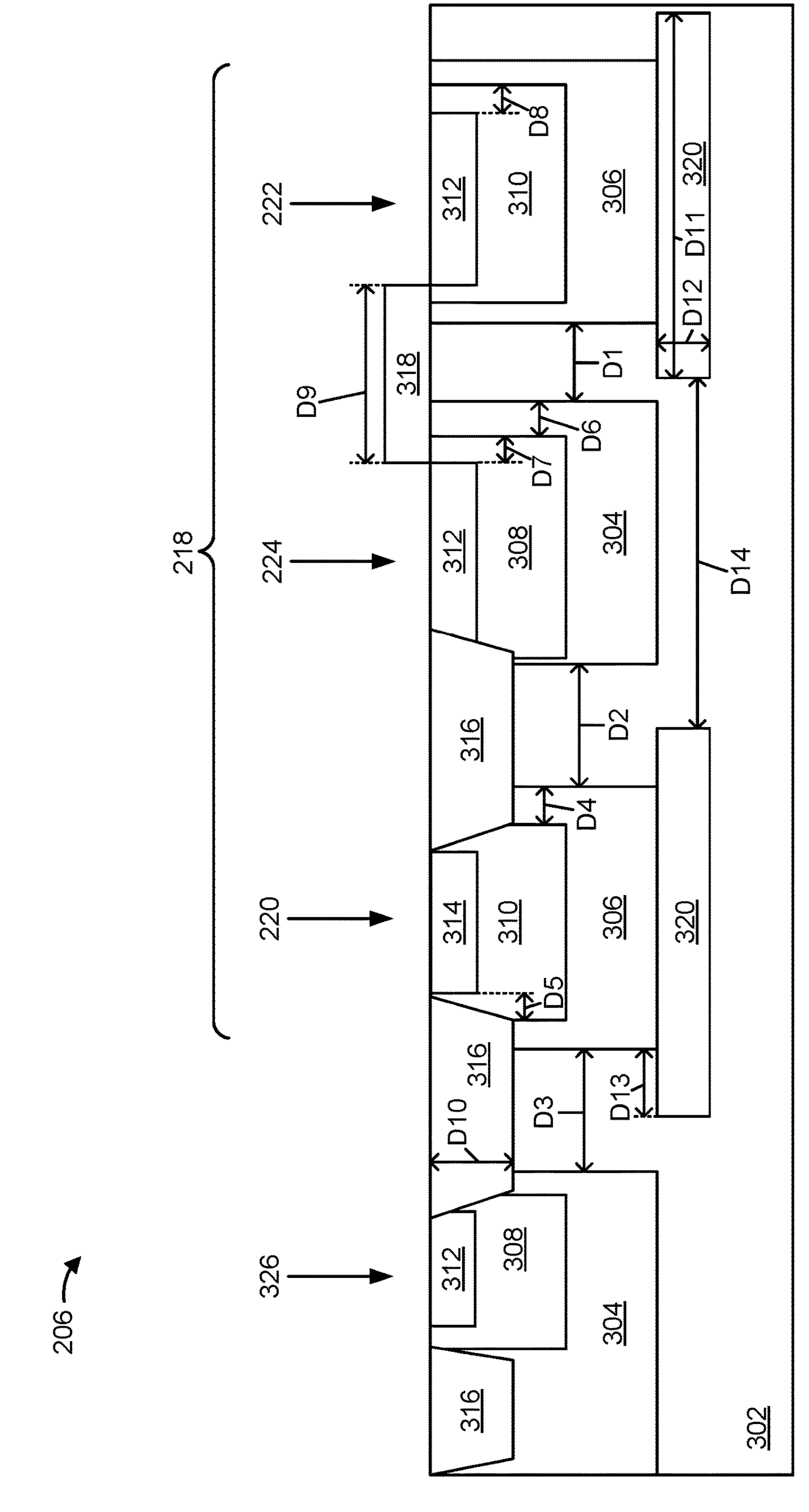
Figure 3C:
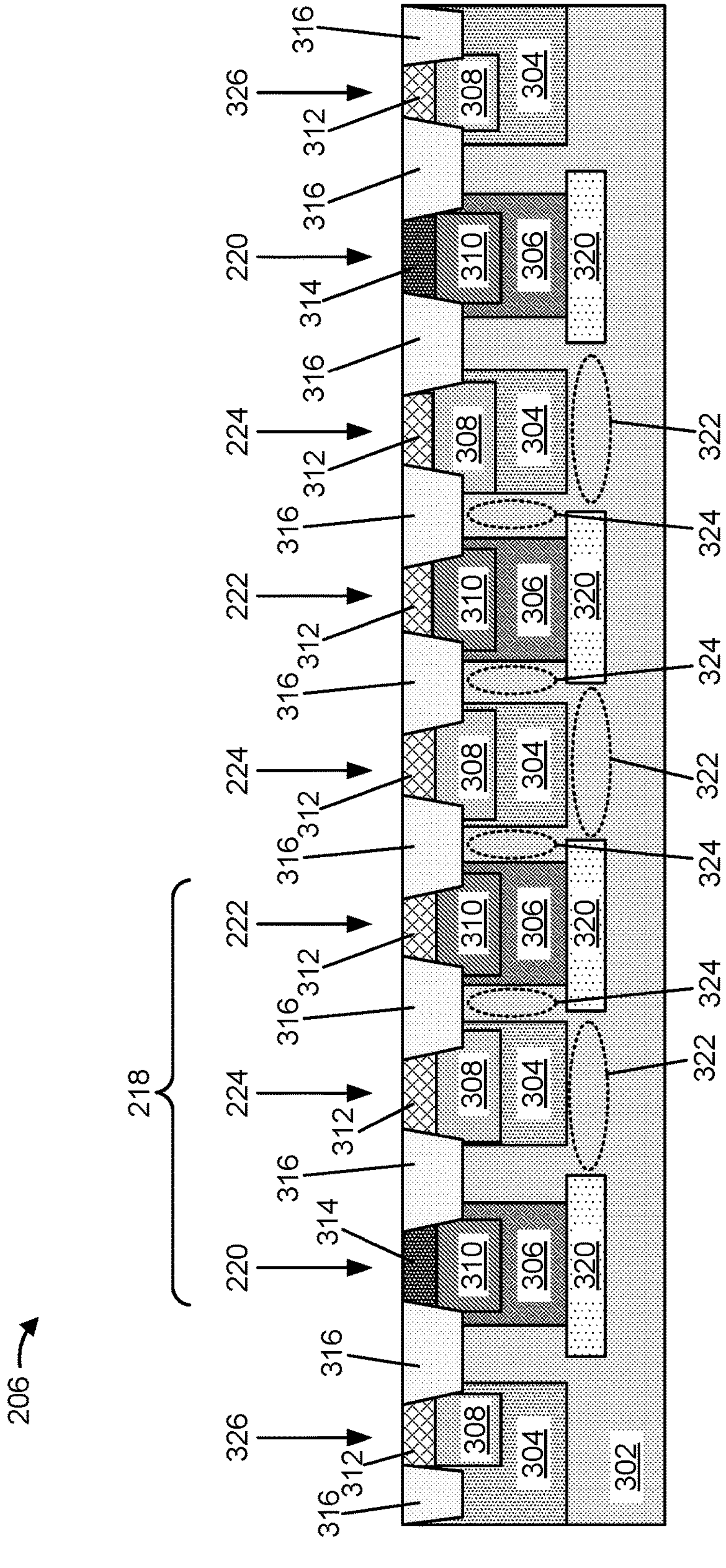

FIGS. 3A-3C are diagrams of example implementations of an ESD triggering circuit 206 described herein. The example implementations of the ESD triggering circuit 206 described in connection with FIGS. 3A-3C may be included in a semiconductor device, such as the semiconductor device 200, the semiconductor device 226, the semiconductor device 228, and/or another semiconductor device that includes high voltage devices.

FIGS. 3A and 3B illustrate an example implementation 300 of an ESD triggering circuit 206. As shown in FIG. 3A, the ESD triggering circuit 206 may be formed and/or included in a substrate 302 of the semiconductor device. The substrate 302 may include a silicon (Si) substrate, a substrate formed of a material including silicon, a III-V compound semiconductor material substrate such as gallium arsenide (GaAs), a silicon on insulator (SOI) substrate, a germanium (Ge) substrate, a silicon germanium (SiGe) substrate, a silicon carbide (SiC) substrate, or another type of semiconductor substrate. The substrate 302 may include various layers, including conductive or insulating layers formed on a semiconductor substrate. The substrate 302 may include a compound semiconductor and/or an alloy semiconductor. The substrate 302 may include various doping configurations to satisfy one or more design parameters. For example, different doping profiles (e.g., n-wells, p-wells) may be formed on the substrate 302 in regions designed for different device types (e.g., p-type metal-oxide semiconductor (PMOS) nanostructure transistors, n-type metal-oxide semiconductor (NMOS) nanostructure transistors). The suitable doping may include ion implantation of dopants and/or diffusion processes. Further, the substrate 302 may include an epitaxial layer (epi-layer), may be strained for performance enhancement, and/or may have other suitable enhancement features. The substrate 302 may include a portion of a semiconductor wafer on which other semiconductor devices are formed.

The ESD triggering circuit 206 may include a plurality of doped regions that are included in the substrate 302. For example, the ESD triggering circuit 206 may include a plurality of p-doped wells 304 that are included in the substrate 302. The p-doped wells 304 may be regions of the substrate 302 that are doped with one or more p-type dopants, such as boron (B), gallium (Ga), and/or indium (In), among other examples. As another example, the ESD triggering circuit 206 may include a plurality of n-doped wells 306 that are included in the substrate 302. The n-doped wells 306 may be regions of the substrate 302 that are doped with one or more n-type dopants, such as phosphorous (P), arsenic (As), bismuth (Bi), and/or stibium (Sb), among other examples. In some implementations, one or more of the p-doped wells 304 are omitted from the ESD triggering circuit 206 to reduce manufacturing cost and/or manufacturing complexity for forming the ESD triggering circuit 206. However, including the p-doped wells 304 may reduce on resistance ($R_{on}$) for the ESD triggering circuit 206. In some implementations, one or more of the n-doped wells 306 are omitted from the ESD triggering circuit 206 to reduce manufacturing cost and/or manufacturing complexity for forming the ESD triggering circuit 206. However, including the n-doped wells 306 may reduce on resistance ($R_{on}$) for the ESD triggering circuit 206.

As another example, the ESD triggering circuit 206 may include a plurality of p+ regions 308 included in the substrate 302. The p+ regions 308 may be regions of the substrate 302 that are doped with one or more p-type dopants, such as boron (B), gallium (Ga), and/or indium (In), among other examples. As another example, the ESD triggering circuit 206 may include a plurality of n+ regions 310 included in the substrate 302. The n+ regions 310 may be regions of the substrate 302 that are doped with one or more n-type dopants, such as phosphorous (P), arsenic (As), bismuth (Bi), and/or stibium (Sb), among other examples.

As another example, the ESD triggering circuit 206 may include a plurality of p+ regions 312 included in the substrate 302. The p+ regions 312 may be regions of the substrate 302 that are doped with one or more p-type dopants, such as boron (B), gallium (Ga), and/or indium (In), among other examples. As another example, the ESD triggering circuit 206 may include a plurality of n+ regions 314 included in the substrate 302. The n+ regions 314 may be regions of the substrate 302 that are doped with one or more n-type dopants, such as phosphorous (P), arsenic (As), bismuth (Bi), and/or stibium (Sb), among other examples.

The p-doped wells 304, the p+ regions 308, and the p+ regions 312 may have different dopant concentrations. For example, the dopant concentration in the p+ regions 312 may be greater relative to the dopant concentration in the p+ regions 308, and the dopant concentration in the p+ regions 308 may be greater relative to a dopant concentration in the p-doped wells 304.

The n-doped wells 306, the n+ regions 310, and the n+ regions 314 may have different dopant concentrations. For example, the dopant concentration in the n+ regions 314 may be greater relative to the dopant concentration in the n+ regions 310, and the dopant concentration in the n+ regions 310 may be greater relative to a dopant concentration in the n-doped wells 306.

As further shown in FIG. 3A, the ESD triggering circuit 206 may include one or more PNP ESD triggering devices 218. A PNP ESD triggering device 218 may include an n-doped base 220, a p-doped emitter 222, and a p-doped collector 224. In some implementations, the ESD triggering circuit 206 may include 2 to 50 "fingers" of PNP ESD triggering devices 218. For example, 2 fingers refers to 2 n-doped bases 220, 2 p-doped collectors 224, and 1 p-doped emitter 222. As another example, 4 fingers refers to 2 n-doped bases 220, 3 p-doped collectors 224, and 2 p-doped emitters 222.

An n-doped base 220 may include an n-doped well 306, an n+ region 310 in the n-doped well 306, and an n+ region 314 in the n+ region 310. A p-doped emitter 222 may include an n-doped well 306, an n+ region 310 in the n-doped well 306, and a p+ region 312 in the n+ region 310. A p-doped collector 224 may include a p-doped well 304, a p+ region 308 in the p-doped well 304, and a p+ region 312 in the p+ region 308.

As further shown in FIG. 3A, the ESD triggering circuit 206 may include a plurality of STI regions 316 in the substrate 302. For example, an STI region 316 may be included between the n-doped base 220 and the p-doped collector 224 of a PNP ESD triggering device 218. STI regions 316 may be included on opposing sides of the n-doped base 220. The STI regions 316 may include a dielectric material such as a silicon oxide (SiOx), a silicon nitride ($Si_xN_y$), a silicon oxynitride (SiON), fluoride-doped silicate glass (FSG), a low dielectric constant (low-k) dielectric material, and/or another suitable insulating material. The STI regions 316 may include a multi-layer structure, for example, having one or more liner layers.

As further shown in FIG. 3A, the ESD triggering circuit 206 may include one or more resist protective oxide (RPO) structures 318 over and/or on the substrate 302. For example, an RPO structure 318 may be included over and/or on the substrate 302 between a p-doped collector 224 and a p-doped emitter 222 of a PNP ESD triggering device 218. An RPO structure 318 may include oxide material such as a silicon oxide (SiOx such as $SiO_2$) and/or another dielectric oxide material. An RPO structure 318 may be included to control the flow of charge carriers in the PNP ESD triggering device 218. In some implementations, an RPO structure 318 may partially overlap a p-doped well 304 of a p-doped collector 224, a p+ region 308 of a p-doped collector 224, an n-doped well 306 of a p-doped emitter 222, and/or an n+ region 310 of a p-doped emitter 222.

As further shown in FIG. 3A, the ESD triggering circuit 206 may include one or more n-doped barrier regions 320 in the substrate 302. N-doped barrier regions 320 may be included under the n-doped base 220 of the PNP ESD triggering device 218 and under the p-doped emitter 222 of the PNP ESD triggering device 218. The n-doped barrier regions 320 may be included under the n-doped base 220 of the PNP ESD triggering device 218 and under the p-doped emitter 222 of the PNP ESD triggering device 218 to reduce or prevent charge carrier migration from the n-doped wells 306 into the substrate 302. The reduced or eliminated charge carrier migration into the substrate 302 may increase the operating efficiency of the ESD triggering circuit 206. The n-doped barrier regions 320 may be regions of the substrate 302 that are doped with one or more n-type dopants, such as phosphorous (P), arsenic (As), bismuth (Bi), and/or stibium (Sb), among other examples.

The n-doped barrier regions 320 may be omitted (not included) under the p-doped collector 224 of the PNP ESD triggering device 218. The omission of the n-doped barrier regions 320 under the p-doped collector 224 of the PNP ESD triggering device 218 results in gaps or portions 322 of the substrate 302 being located between the n-doped barrier regions 320. The PNP ESD triggering device 218 may trigger the operation of the ESD protection circuit 204 based on the voltage applied to the PNP ESD triggering device 218 satisfying a breakdown voltage of the PNP ESD triggering device 218. If the breakdown occurs between an n-doped barrier region 320 and the p-doped well 304 of the p-doped collector 224, the breakdown voltage of the PNP ESD triggering device 218 may be too low to accommodate the high operating voltages of the associated device circuit 202 in the semiconductor device, resulting in the device circuit 202 being unable to properly function.

The omission of the n-doped barrier regions 320 under the p-doped collector 224 of the PNP ESD triggering device 218 results in a lack of a P—N interface under the p-doped collector 224, which prevents the breakdown of the PNP ESD triggering device 218 occurring between an n-doped barrier region 320 and the p-doped well 304 of the p-doped collector 224. The breakdown of the PNP ESD triggering device 218 instead occurs between the p+ region 308 of the p-doped collector 224 and the n+ region 310 of the p-doped emitter 222.

The portions 322 of the substrate 302 may be undoped portions or p-doped, or portions of the substrate 302 that have a very low n-type dopant concentration relative to the n-doped barrier regions 320. The portions 322 may become doped with n-type dopants as a byproduct of semiconductor processing of the ESD triggering circuit 206 in that n-type dopants may migrate into the portions 322 from the n-doped barrier regions 320 (and/or other n-doped regions) during thermal operations or other types of operations that cause dopant migration. Even with the inadvertent n-type dopant migration into the portions 322 of the substrate 302, the omission of the n-doped barrier regions 320 under the p-doped collector 224 of the PNP ESD triggering device 218 results in an overall lower effective dopant concentration in the portions 322. For example, the n-type dopant concentration in the portions 322 of the substrate 302 may be included in a range of approximately $1\times10^{13}$ n-type ions per cubic centimeter to approximately $1\times10^{15}$ n-type ions per cubic centimeter, whereas the n-type dopant concentration in the n-doped barrier regions 320 may be included in a range of approximately $1\times10^{17}$ n-type ions per cubic centimeter to approximately $1\times10^{21}$ n-type ions per cubic centimeter. However, other values for these ranges are within the scope of the present disclosure.

As further shown in FIG. 3A, the ESD triggering circuit 206 may include portions 324 of the substrate 302 between the n-doped base 220 and the p-doped collector 224, and between the p-doped collector 224 and the p-doped emitter 222. The portions 324 of the substrate 302 may be located under the RPO structures 318 of the ESD triggering circuit 206. The portions 324 provide gaps or spacing between the n-doped well 306 of the n-doped base 220 and the p-doped well 304 of the p-doped collector 224, and between the p-doped well 304 of the p-doped collector 224 and the n-doped well 306 of the p-doped emitter 222. The portions 324 increase the distance or spacing between the p+ region 308 of the p-doped collector 224 and the n+ region 310 of the p-doped emitter 222 (e.g., relative to the p-doped well 304 and the n-doped well 306 being contiguous), and the increased distance or spacing increases the breakdown of the PNP ESD triggering device 218. Moreover, the size or width of the portions 324 may be tuned during manufacturing of the ESD triggering circuit 206 to achieve a threshold breakdown voltage for the ESD triggering circuit 206.

The portions 324 of the substrate 302 may be undoped portions or p-doped, or portions of the substrate 302 that have a very low n-type dopant concentration relative to the p-doped wells 304 and the n-doped wells 306. The portions 324 may become doped with n-type dopants and/or p-type dopants as a byproduct of semiconductor processing of the ESD triggering circuit 206 in that n-type dopants may migrate into the portions 324 from adjacent n-doped wells 306 (and/or other n-doped regions), and/or p-type dopants may migrate into the portions 324 from adjacent p-doped wells 304 (and/or other p-doped regions), during thermal operations or other types of operations that cause dopant migration. The n-type dopant concentration in the portions 324 of the substrate 302 may be included in a range of approximately $1\times10^{13}$ n-type ions per cubic centimeter to approximately $1\times10^{15}$ n-type ions per cubic centimeter, and/or the p-type dopant concentration in the portions 324 of the substrate 302 may be included in a range of approximately $1\times10^{13}$ p-type ions per cubic centimeter to approximately $1\times10^{15}$ p-type ions per cubic centimeter. However, other values for these ranges are within the scope of the present disclosure.

As further shown in FIG. 3A, the ESD triggering circuit 206 may further include terminals 326. The terminals 326 may enable a voltage to be applied to the substrate 302 to electrically bias the substrate 302. A terminal 326 may include a p-doped well 304, a p+ region 308 in the p-doped well 304, and a p+ region 312 in the p+ region 308. STI regions 316 may be included on opposing sides of a terminal 326. In some implementations, portions 324 of the substrate 302 may be included between a terminal 326 and an adjacent n-doped base 220 of a PNP ESD triggering device 218. In some implementations, the n-doped barrier regions 320 may be omitted from under the p-doped well 304 of a terminal 326.

FIG. 3B illustrates a plurality of example dimensions of the example implementation 300 of the ESD triggering circuit 206. In some implementations, one or more other example implementations of ESD protection circuits 206 described herein may include one or more of the dimensions illustrated and described in connection with FIG. 3B.

As shown in FIG. 3B, an example dimension D1 may include a spacing or distance between a p-doped well 304 of a p-doped collector 224 and an n-doped well 306 of a p-doped emitter 222 of a PNP ESD triggering device 218 of the ESD triggering circuit 206. The example dimension D1 may correspond to a width of a portion 324 of the substrate 302 between the p-doped well 304 and the n-doped well 306. In some implementations, the example dimension D1 may be included in a range of approximately 0.5 microns to approximately 5 microns. If the example dimension D1 is less than approximately 0.5 microns, the breakdown voltage of the PNP ESD triggering device 218 may be too low to enable high voltage operation of the associated device circuit 202 (e.g., less than the operating voltage of the associated device circuit 202). If the example dimension D1 is greater than approximately 5 microns, the breakdown voltage of the PNP ESD triggering device 218 may be too high to trigger activation of the associated ESD protection circuit 204, thereby resulting in an increased likelihood of damage to the device circuit 202. However, other values for the range are within the scope of the present disclosure.

Another example dimension D2 may include a spacing or distance between a p-doped well 304 of a p-doped collector 224 and an n-doped well 306 of an n-doped base 220 of a PNP ESD triggering device 218 of the ESD triggering circuit 206. The example dimension D2 may correspond to a width of a portion 324 of the substrate 302 between the p-doped well 304 and the n-doped well 306. In some implementations, the example dimension D2 may be included in a range of approximately 0.5 microns to approximately 5 microns. If the example dimension D2 is less than approximately 0.5 microns, the breakdown of the PNP ESD triggering device 218 occur between the n-doped base 220 and the p-doped collector 224 instead of between the p-doped collector 224 and a p-doped emitter 222 of the PNP ESD triggering device 218, thereby resulting in improper operation of the PNP ESD triggering device 218. If the example dimension D2 is greater than approximately 5 microns, the lateral size of the ESD triggering circuit 206 may increase, thereby reducing device density in the semiconductor device. However, other values for the range are within the scope of the present disclosure.

Another example dimension D3 may include a spacing or distance between a p-doped well 304 of a terminal 326 and an n-doped well 306 of an n-doped base 220 of a PNP ESD triggering device 218 of the ESD triggering circuit 206. The example dimension D3 may correspond to a width of a portion 324 of the substrate 302 between the p-doped well 304 and the n-doped well 306. In some implementations, the example dimension D3 may be included in a range of approximately 0.5 microns to approximately 5 microns. If the example dimension D3 is less than approximately 0.5 microns, the breakdown of the PNP ESD triggering device 218 occur between the terminal 326 and the n-doped base 220 instead of between a p-doped collector 224 and a p-doped emitter 222 of the PNP ESD triggering device 218, thereby resulting in improper operation of the PNP ESD triggering device 218. If the example dimension D3 is greater than approximately 5 microns, the lateral size of the ESD triggering circuit 206 may increase, thereby reducing device density in the semiconductor device. However, other values for the range are within the scope of the present disclosure.

Another example dimension D4 may include a spacing or distance between an outer edge of an n-doped well 306 and an outer edge of an n+ region 310 included in the n-doped well 306. The n-doped well 306 and the n+ region 310 may be included in an n-doped base 220 or in a p-doped emitter 222 of a PNP ESD triggering device 218 of the ESD triggering circuit 206. In some implementations, the example dimension D4 may be included in a range of approximately 0.2 microns to approximately 5 microns. If the example dimension D4 is less than approximately 0.2 microns, the breakdown voltage of the PNP ESD triggering device 218 may be too high to trigger activation of the associated ESD protection circuit 204, thereby resulting in an increased likelihood of damage to the device circuit 202. If the example dimension D4 is greater than approximately 5 microns, the lateral size of the ESD triggering circuit 206 may increase, thereby reducing device density in the semiconductor device. However, other values for the range are within the scope of the present disclosure.

Another example dimension D5 may include a spacing or distance between an outer edge of an n+ region 310 and an outer edge of an n+ region 314 included in the n+ region 310. The n+ region 310 and the n+ region 314 may be included in an n-doped base 220 of a PNP ESD triggering device 218 of the ESD triggering circuit 206. In some implementations, the example dimension D5 may be included in a range of approximately 0.2 microns to approximately 5 microns. If the example dimension D5 is less than approximately 0.2 microns, the breakdown voltage of the PNP ESD triggering device 218 may be too high to trigger activation of the associated ESD protection circuit 204, thereby resulting in an increased likelihood of damage to the device circuit 202. If the example dimension D5 is greater than approximately 5 microns, the lateral size of the ESD triggering circuit 206 may increase, thereby reducing device density in the semiconductor device. However, other values for the range are within the scope of the present disclosure.

Another example dimension D6 may include a spacing or distance between an outer edge of a p-doped well 304 and an outer edge of a p+ region 308 included in the p-doped well 304. The p-doped well 304 and the p+ region 308 may be included in a terminal 326 or in a p-doped collector 224 of a PNP ESD triggering device 218 of the ESD triggering circuit 206. In some implementations, the example dimension D6 may be included in a range of approximately 0.2 microns to approximately 5 microns. If the example dimension D6 is less than approximately 0.2 microns, the breakdown voltage of the PNP ESD triggering device 218 may be too high to trigger activation of the associated ESD protection circuit 204, thereby resulting in an increased likelihood of damage to the device circuit 202. If the example dimension D6 is greater than approximately 5 microns, the lateral size of the ESD triggering circuit 206 may increase, thereby reducing device density in the semiconductor device. However, other values for the range are within the scope of the present disclosure.

Another example dimension D7 may include a spacing or distance between an outer edge of a p+ region 308 and an outer edge of a p+ region 312 included in the p+ region 308. The p+ region 308 and the p+ region 312 may be included in a terminal 326 or in a p-doped collector 224 of a PNP ESD triggering device 218 of the ESD triggering circuit 206. In some implementations, the example dimension D7 may be included in a range of approximately 0.2 microns to approximately 5 microns. If the example dimension D7 is less than approximately 0.2 microns, the breakdown voltage of the PNP ESD triggering device 218 may be too high to trigger activation of the associated ESD protection circuit 204, thereby resulting in an increased likelihood of damage to the device circuit 202. If the example dimension D7 is greater than approximately 5 microns, the lateral size of the ESD triggering circuit 206 may increase, thereby reducing device density in the semiconductor device. However, other values for the range are within the scope of the present disclosure.

Another example dimension D8 may include a spacing or distance between an outer edge of a n+ region 310 and an outer edge of a p+ region 312 included in the n+ region 310. The n+ region 310 and the p+ region 312 may be included in a p-doped emitter 222 of a PNP ESD triggering device 218 of the ESD triggering circuit 206. In some implementations, the example dimension D8 may be included in a range of approximately 0.2 microns to approximately 5 microns. If the example dimension D8 is less than approximately 0.2 microns, the breakdown voltage of the PNP ESD triggering device 218 may be too high to trigger activation of the associated ESD protection circuit 204, thereby resulting in an increased likelihood of damage to the device circuit 202. If the example dimension D8 is greater than approximately 5 microns, the lateral size of the ESD triggering circuit 206 may increase, thereby reducing device density in the semiconductor device. However, other values for the range are within the scope of the present disclosure.

Another example dimension D9 may include a width of an RPO structure 318 included in a PNP ESD triggering device 218 of the ESD triggering circuit 206. In some implementations, the example dimension D9 may be included in a range of approximately 0.5 microns to approximately 3 microns. If the example dimension D8 is less than approximately 0.5 microns, the breakdown voltage of the ESD triggering circuit 206 may be too low to enable high voltage operation of the associated device circuit 202 (e.g., less than the operating voltage of the associated device circuit 202). If the example dimension D8 is greater than approximately 3 microns, the on resistance ($R_{on}$) of the ESD triggering circuit 206 may be relatively high and lead to reduced operating efficiency for the ESD triggering circuit 206. However, other values for the range are within the scope of the present disclosure.

Another example dimension D10, includes a thickness of an STI region 316 included in the ESD triggering circuit 206. In some implementations, the example dimension D10 may be included in a range of approximately 0.1 microns to approximately 50 microns. If the example dimension D10 is less than approximately 0.1 microns, the STI region 316 may not provide sufficient electric field suppression in the ESD triggering circuit 206, resulting in reduced electrical isolation in the ESD triggering circuit 206. If the example dimension D10 is greater than approximately 50 microns, the on resistance ($R_{on}$) of the ESD triggering circuit 206 may be relatively high and lead to reduced operating efficiency for the ESD triggering circuit 206. However, other values for the range are within the scope of the present disclosure.

Another example dimension D11, includes a width of an n-doped barrier region 320 in the ESD triggering circuit 206. In some implementations, the example dimension D11 may be included in a range of approximately 1 micron to approximately 10 microns. If the example dimension D11 is less than approximately 1 micron, the n-doped barrier region 320 may not provide sufficient blocking of charge carrier migration into the substrate 302, resulting in reduced electrical isolation and reduced operating efficiency in the ESD triggering circuit 206. If the example dimension D11 is greater than approximately 10 microns, the breakdown voltage of the ESD triggering circuit 206 may be too low to enable high voltage operation of the associated device circuit 202 (e.g., less than the operating voltage of the associated device circuit 202). However, other values for the range are within the scope of the present disclosure.

Another example dimension D12, includes a thickness of an n-doped barrier region 320 in the ESD triggering circuit 206. In some implementations, the example dimension D12 may be included in a range of approximately 1 micron to approximately 10 microns. If the example dimension D12 is less than approximately 1 micron, the n-doped barrier region 320 may not provide sufficient blocking of charge carrier migration into the substrate 302, resulting in reduced electrical isolation and reduced operating efficiency in the ESD triggering circuit 206. If the example dimension D12 is greater than approximately 10 microns, the breakdown voltage of the ESD triggering circuit 206 may be too low to enable high voltage operation of the associated device circuit 202 (e.g., less than the operating voltage of the associated device circuit 202). However, other values for the range are within the scope of the present disclosure.

Another example dimension D13, includes a lateral extension of an n-doped barrier region 320 from an outer edge of an n-doped well 306 over the n-doped barrier region 320. In some implementations, the example dimension D13 may be included in a range of approximately −5 microns (meaning that the n-doped barrier region 320 does not laterally extend outward from the outer edge of the n-doped well 306) to approximately 5 microns. If the example dimension D13 is less than approximately −5 microns, the n-doped barrier region 320 may not provide sufficient blocking of charge carrier migration into the substrate 302, resulting in reduced electrical isolation and reduced operating efficiency in the ESD triggering circuit 206. If the example dimension D13 is greater than approximately 5 microns, the breakdown voltage of the ESD triggering circuit 206 may be too low to enable high voltage operation of the associated device circuit 202 (e.g., less than the operating voltage of the associated device circuit 202). However, other values for the range are within the scope of the present disclosure.

Another example dimension D14, includes a spacing or distance between n-doped barrier regions 320 in the ESD triggering circuit 206. The example dimension D14 may correspond to a width of a portion 322 of the substrate 302 between the n-doped barrier regions 320. In some implementations, the example dimension D14 may be included in a range of approximately 1 micron to approximately 10 microns. If the example dimension D14 is less than approximately 1 micron, the breakdown voltage of the ESD triggering circuit 206 may be too low to enable high voltage operation of the associated device circuit 202 (e.g., less than the operating voltage of the associated device circuit 202) because breakdown of a PNP ESD triggering device 218 may occur between a p-doped well 304 of the PNP ESD triggering device 218 and an n-doped barrier region 320. If the example dimension D14 is greater than approximately 10 microns, the n-doped barrier regions 320 may not provide sufficient blocking of charge carrier migration into the substrate 302, resulting in reduced electrical isolation and reduced operating efficiency in the ESD triggering circuit 206. However, other values for the range are within the scope of the present disclosure.

FIG. 3C illustrates another example implementation 328 of an ESD triggering circuit 206 that may be included in a semiconductor device. As shown in FIG. 3C, the example implementation 328 of the ESD triggering circuit 206 may include a similar arrangement of layers and/or structures as the example implementation 300 of the ESD triggering circuit 206 illustrated and described in connection with FIGS. 3A and 3B. For example, the example implementation 328 of the ESD triggering circuit 206 may include components 302-324, except that the RPO structures 318 are omitted. Instead, STI regions 316 are included between the p-doped emitters 222 and the p-doped collectors 224 (e.g., over the portions 324 of the substrate 302 between the p-doped emitters 222 and the p-doped collectors 224). Including the STI regions 316 instead of the RPO structures 318 reduces the process cost and complexity of manufacturing the ESD triggering circuit 206 in that the STI regions 316 can be formed along with the other STI regions 316 in the ESD triggering circuit 206, and therefore do not require additional processing operations to form. However, the RPO structures 318 in the example implementation 300 of the ESD triggering circuit 206 may provide lower on resistance ($R_{on}$) for the ESD triggering circuit 206 and/or increased ESD protection triggering performance relative to the STI regions 316.

As indicated above, FIGS. 3A-3C are provided as examples. Other examples may differ from what is described with regard to FIGS. 3A-3C.

FIGS. 4A-4J are diagrams of an example implementation 400 of forming an ESD triggering circuit 206 in a semiconductor device described herein. While the example implementation 400 includes an example of forming the example implementation 300 of the ESD triggering circuit 206 illustrated and described in connection with FIGS. 3A and 3B, the semiconductor processing operations and/or techniques illustrated and described in connection with FIGS. 4A-4J (or a subset thereof) may be used to manufacture other example implementations of ESD protection circuits 206 illustrated and described herein. In some implementations, one or more of the semiconductor processing operations described in connection with FIGS. 4A-4J are performed by one or more of the semiconductor processing tools 102-114 and/or the wafer/die transport tool 116 described in connection with FIG. 1. In some implementations, one or more of the semiconductor processing operations described in connection with FIGS. 4A-4J are performed by one or more of the semiconductor processing tools not shown in FIG. 1.

Figure 4A:
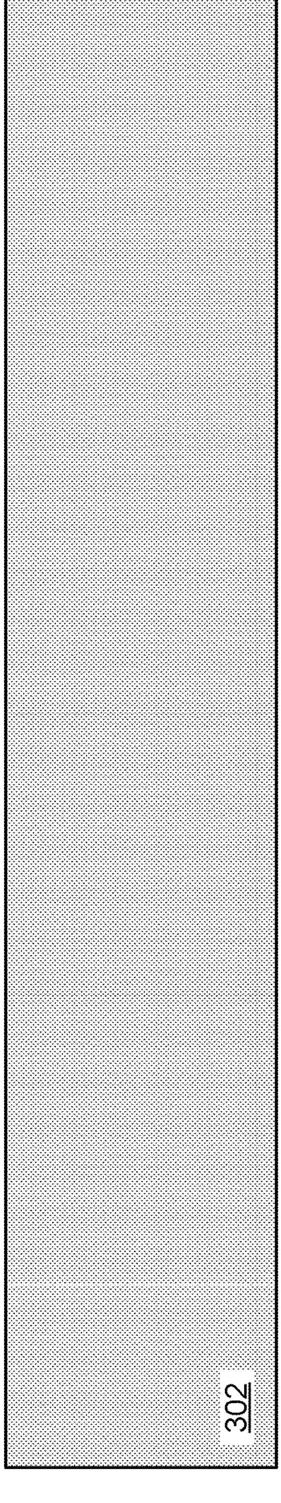
FIGS. 4A-4J are diagrams of an example implementation of forming an ESD triggering circuit in a semiconductor device described herein.
Figure 4A:

Turning to FIG. 4A, a substrate 302 may be provided. The substrate 302 may be provided as a semiconductor wafer, a semiconductor die, and/or another type of semiconductor substrate. In some implementations, the substrate 302 may be a doped substrate, such as a semiconductor substrate that is doped with one or more p-type dopants, a semiconductor substrate that is doped with one or more n-type dopants, and/or another type of doped substrate. In some implementations, the substrate 302 has a bulk resistivity (or volumetric resistivity) that is included in a range of approximately 1 ohm-centimeter to approximately 100 ohm-centimeters. However, other values for the range are within the scope of the present disclosure.

Figure 4B:
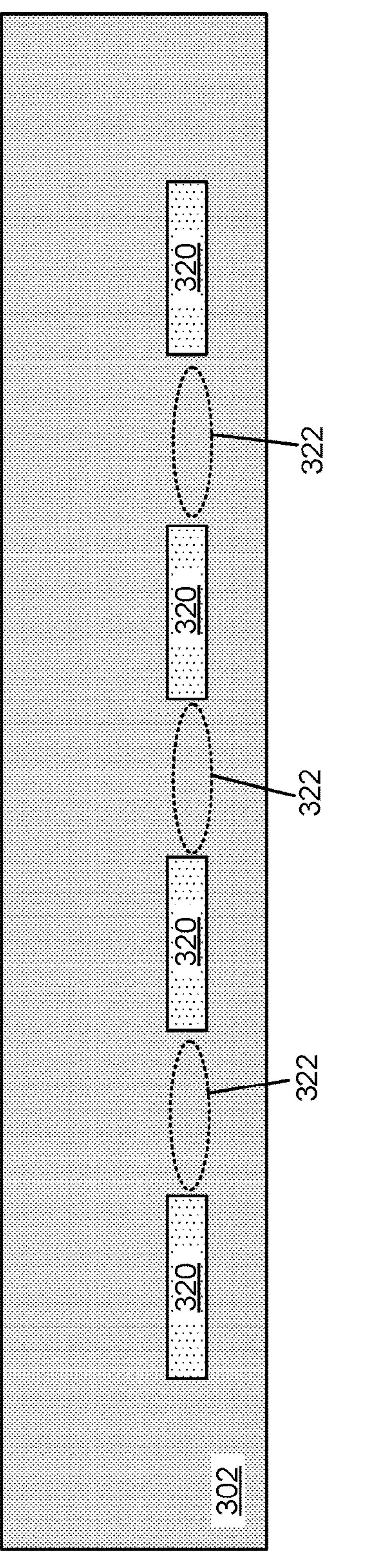

As shown in FIG. 4B, one or more barrier layer implantation operations may be performed to form n-doped barrier regions 320 in the substrate 302. The n-doped barrier regions 320 may be formed below the surface of the substrate 302. Moreover, the n-doped barrier regions 320 may be formed such that the n-doped barrier regions 320 are spaced apart from one another by portions 322 of the substrate 302.

In some implementations, the ion implantation tool 114 performs the one or more well implantation operations to form the n-doped barrier regions 320 in the substrate 302 by performing an ion implantation operation to implant ions (e.g., n-type ions) into the substrate 302 to form the n-doped barrier regions 320. The ion implantation tool 114 may direct an ion beam toward the substrate 302 such that the ions are implanted below the surface of the substrate 302 to dope the substrate 302. An implantation mask may be formed on the substrate 302, and a pattern formed in the implantation mask may be used to form the n-doped barrier regions 320 such that the n-doped barrier regions 320 are spaced apart from one another by portions 322 of the substrate 302. In some implementations, the n-doped barrier regions 320 may be formed such that the concentration of (e.g., n-type dopants) in the n-doped barrier regions 320 may be included in a range of approximately $1\times10^{17}$ n-type ions per cubic centimeter to approximately $1\times10^{21}$ n-type ions per cubic centimeter. However, other values for the range are within the scope of the present disclosure.

Figure 4C:
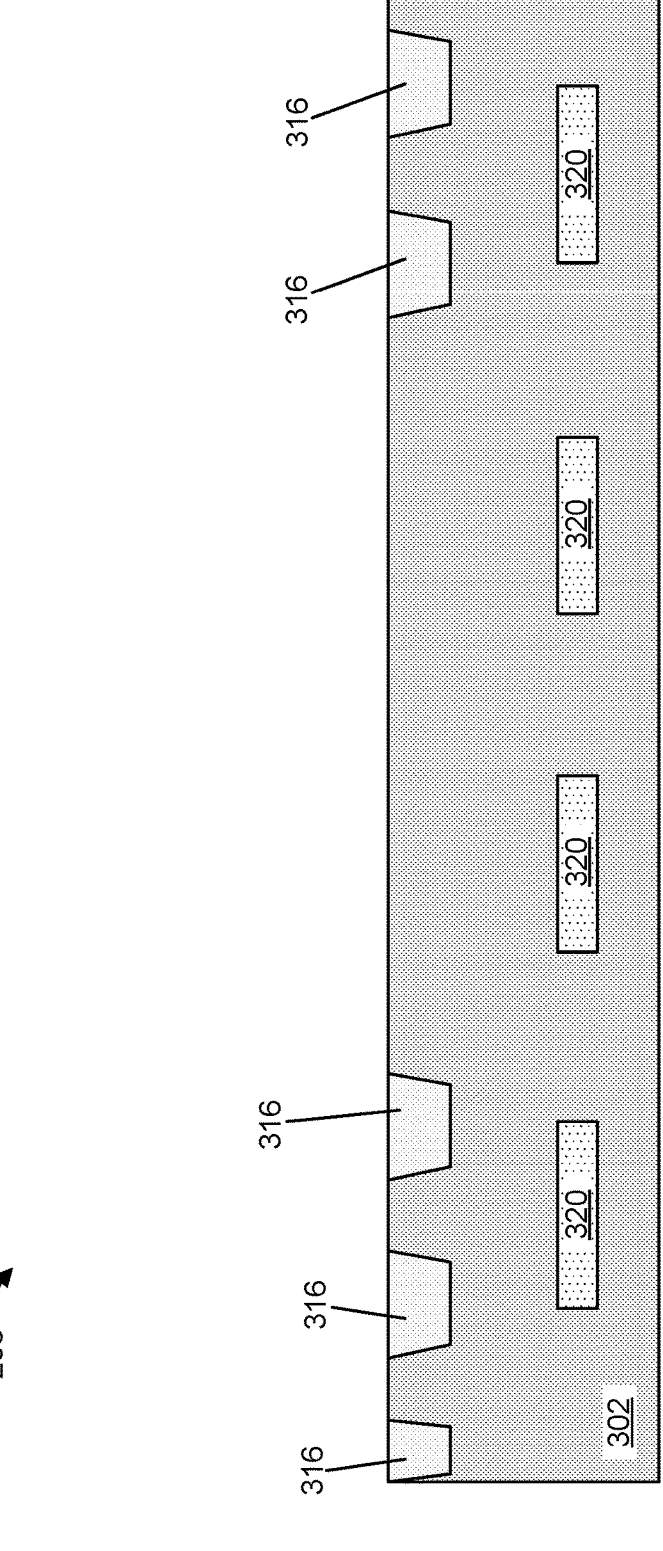

As shown in FIG. 4C, an STI formation operation is performed to form STI regions 316 in the substrate 302. The STI regions 316 may be formed above the n-doped barrier regions 320. In some implementations, one or more other semiconductor processing operations are performed after the one or more well implantation operations and prior to the STI formation operation, such as an epitaxial operation to form one or more source/drain regions of the transistors 314 in a device circuit 202 of the semiconductor device. To form the STI regions 316, recesses may be formed in the substrate 302, and the material of the STI regions 316 may be deposited in the recesses.

In some implementations, a pattern in a photoresist layer is used to etch the substrate 302 to form the recesses. In these implementations, the deposition tool 102 forms the photoresist layer on the substrate 302. The exposure tool 104 exposes the photoresist layer to a radiation source to pattern the photoresist layer. The developer tool 106 develops and removes portions of the photoresist layer to expose the pattern. The etch tool 108 etches the substrate 302 based on the pattern to form the recesses in the substrate 302. In some implementations, the etch operation includes a plasma etch operation, a wet chemical etch operation, and/or another type of etch operation. In some implementations, a photoresist removal tool removes the remaining portions of the photoresist layer (e.g., using a chemical stripper, plasma ashing, and/or another technique). In some implementations, a hard mask layer is used as an alternative technique for etching the substrate 302 based on a pattern.

The deposition tool 102 may deposit the material of the STI regions 316 in a PVD operation, an ALD operation, a CVD operation, an epitaxy operation, an oxidation operation, another type of deposition operation described in connection with FIG. 1, and/or another suitable deposition operation. In some implementations, the planarization tool 110 planarizes the STI regions 316 after the deposition tool 102 deposits the STI regions 316.

Figure 4D:
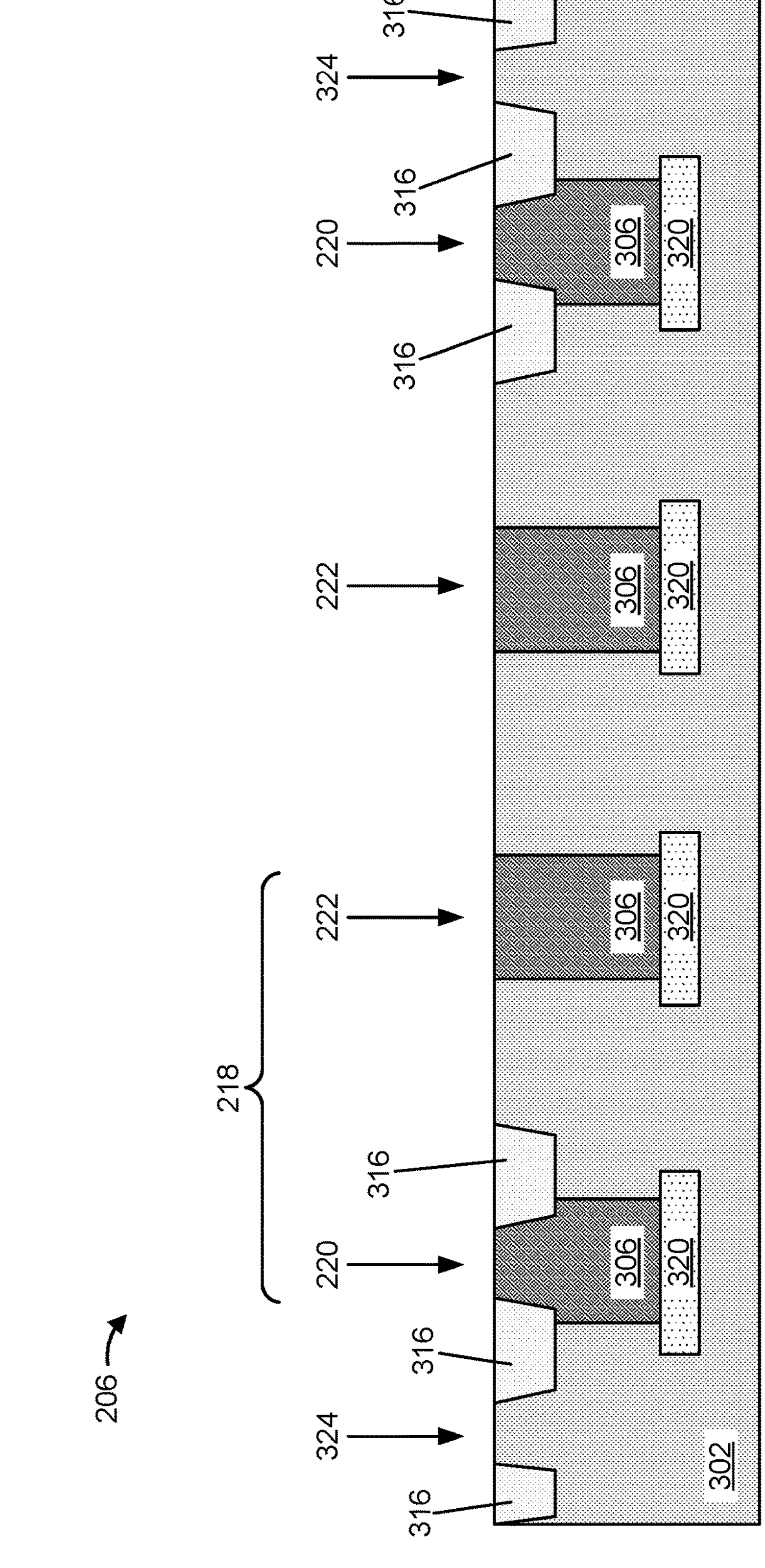

As shown in FIG. 4D, one or more well implantation operations may be performed to form n-doped wells 306 in the substrate 302. The n-doped wells 306 may be formed below the surface of the substrate 302. Moreover, the n-doped wells 306 may be formed above and/or over the n-doped barrier regions 320. Forming the n-doped wells 306 may be a part of a process of forming an n-doped base 220 of a PNP ESD triggering device 218 included in the ESD triggering circuit 206, and/or may be a part of a process of forming a p-doped emitter 222 of the PNP ESD triggering device 218.

In some implementations, the ion implantation tool 114 performs the one or more well implantation operations to form the n-doped wells 306 in the substrate 302 by performing an ion implantation operation to implant ions (e.g., n-type ions) into the substrate 302 to form the n-doped wells 306. The ion implantation tool 114 may direct an ion beam toward the substrate 302 such that the ions are implanted below the surface of the substrate 302 to dope the substrate 302. An implantation mask may be formed on the substrate 302, and a pattern formed in the implantation mask may be used to form the n-doped wells 306 above and/or over the n-doped barrier regions 320.

Figure 4E:
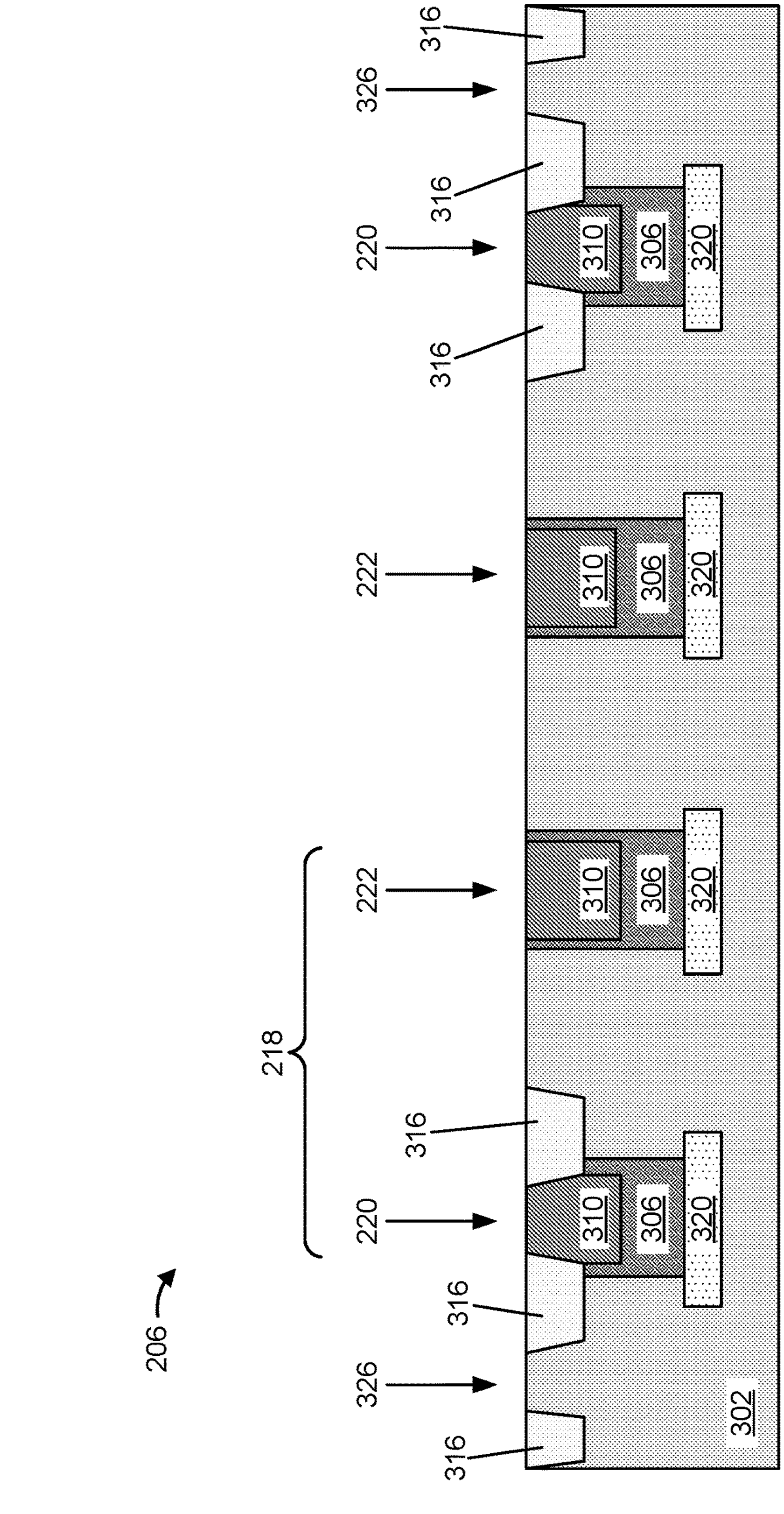

As shown in FIG. 4E, one or more n+ implantation operations may be performed to form n+ regions 310 in the substrate 302. The n+ regions 310 may be formed in the n-doped wells 306. In this way each n+ region 310 is included within an associated n-doped well 306. Forming the n+ regions 310 may be a part of the process of forming the n-doped base 220 of the PNP ESD triggering device 218 included in the ESD triggering circuit 206, and/or may be a part of the process of forming the p-doped emitter 222 of the PNP ESD triggering device 218.

In some implementations, the ion implantation tool 114 performs the one or more well implantation operations to form the n+ regions 310 in the substrate 302 by performing an ion implantation operation to implant ions (e.g., n-type ions) into the substrate 302 to form the n+ regions 310. The ion implantation tool 114 may direct an ion beam toward the substrate 302 such that the ions are implanted below the surface of the substrate 302 to dope the substrate 302. An implantation mask may be formed on the substrate 302, and a pattern formed in the implantation mask may be used to form the n+ regions 310 in the n-doped wells 306.

Figure 4F:
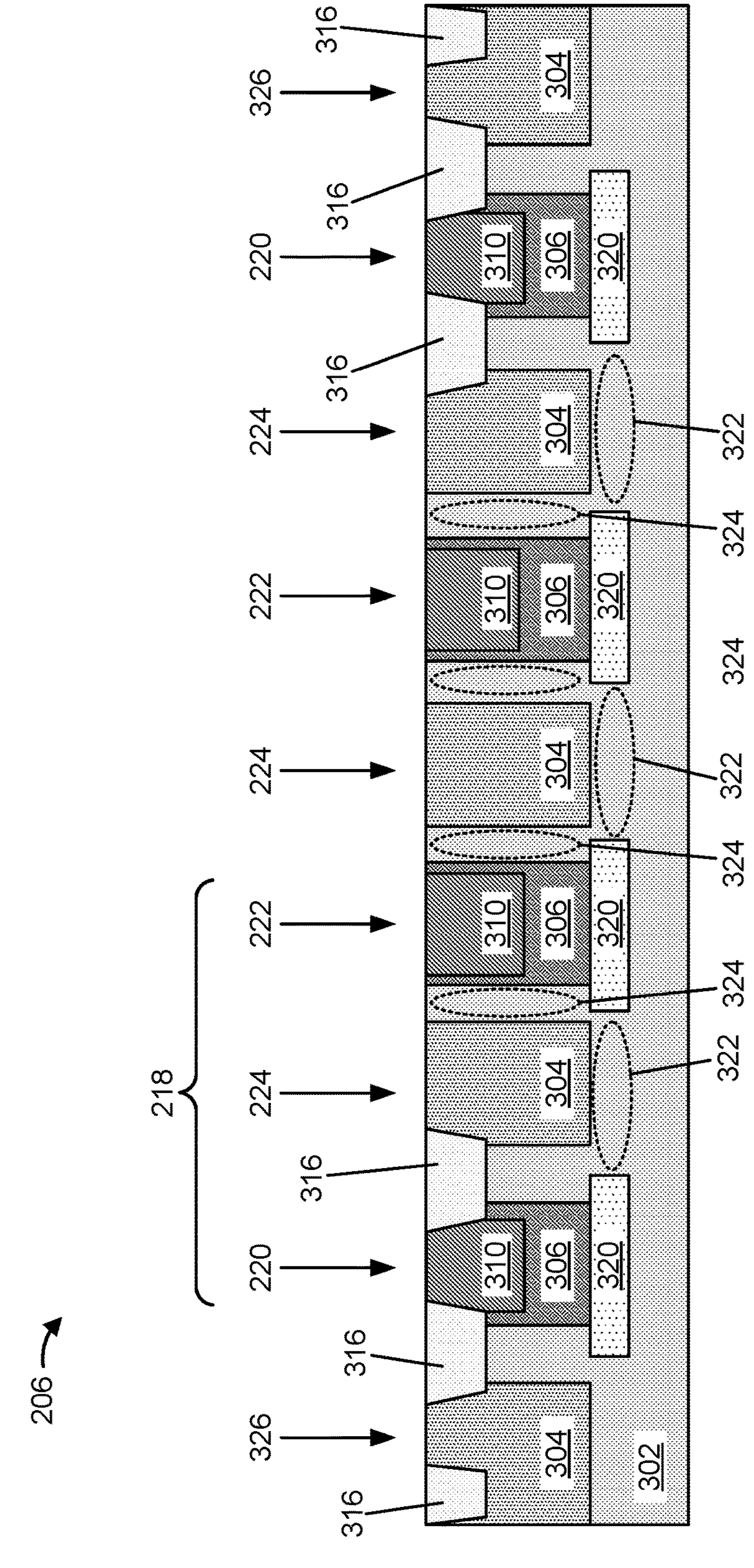

As shown in FIG. 4F, one or more well implantation operations may be performed to form p-doped wells 304 in the substrate 302. Forming the p-doped wells 304 may be a part of a process of forming one or more terminals 326 of the ESD protection circuit, and/or a part of a process forming an p-doped collector 224 of the PNP ESD triggering device 218 included in the ESD triggering circuit 206.

The p-doped wells 304 may be formed below the surface of the substrate 302 and adjacent to one or more n-doped wells 306. The p-doped wells 304 may be formed above and/or over the portions 322 of the substrate 302 between the n-doped barrier regions 320. Moreover, the p-doped wells 304 may be formed such that the p-doped wells 304 are separated or spaced apart from adjacent n-doped wells 306 by portions 324 of the substrate 302.

In some implementations, the ion implantation tool 114 performs the one or more well implantation operations to form the p-doped wells 304 in the substrate 302 by performing an ion implantation operation to implant ions (e.g., p-type ions) into the substrate 302 to form the p-doped wells 304. The ion implantation tool 114 may direct an ion beam toward the substrate 302 such that the ions are implanted below the surface of the substrate 302 to dope the substrate 302. An implantation mask may be formed on the substrate 302, and a pattern formed in the implantation mask may be used to form the p-doped wells 304 above and/or over the portions 322 in the substrate. Moreover, the pattern formed in the implantation mask may be used to form the p-doped wells 304 between adjacent n-doped wells 306 such that the portions 324 of the substrate 302 separate or isolate the p-doped wells 304 and the adjacent n-doped wells 306.

Figure 4G:
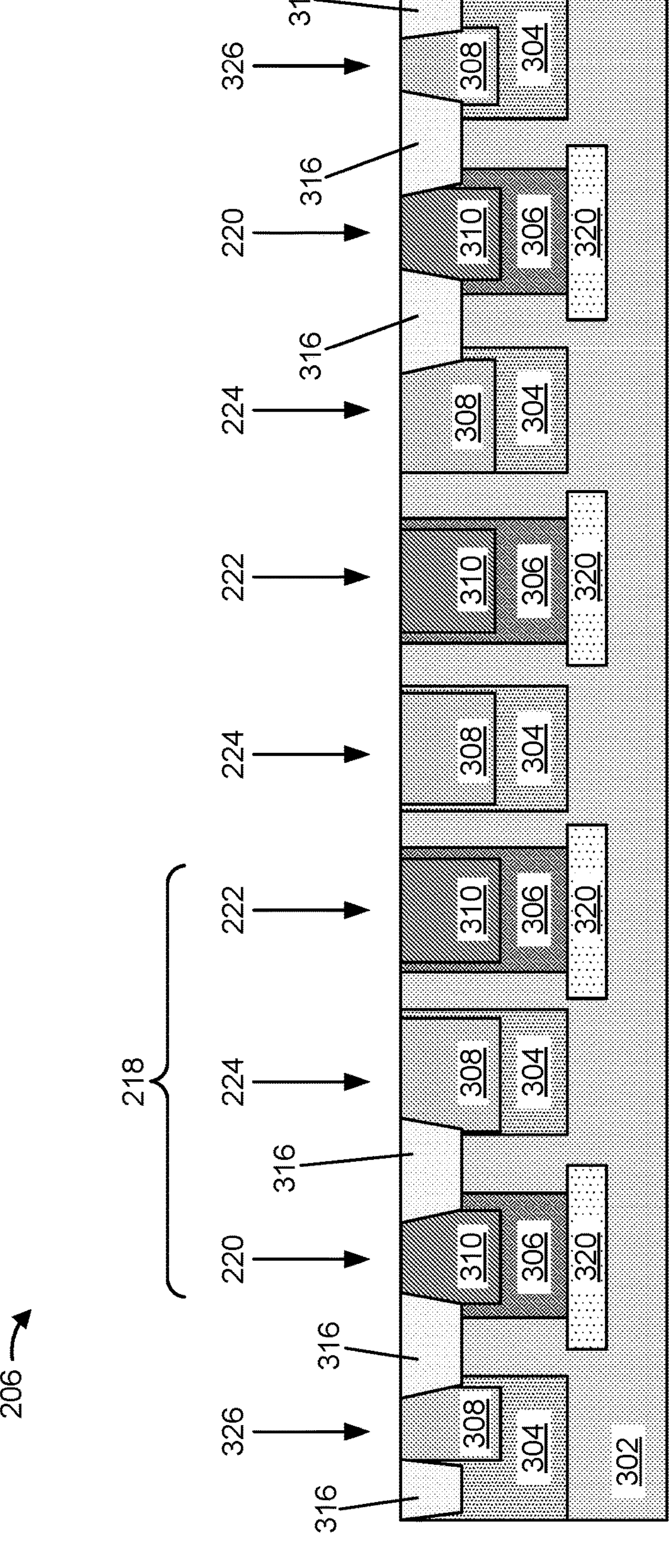

As shown in FIG. 4G, one or more p+ implantation operations may be performed to form p+ regions 308 in the substrate 302. The p+ regions 308 may be formed in the p-doped wells 304. In this way each p+ region 308 is included within an associated p-doped well 304.

In some implementations, the ion implantation tool 114 performs the one or more well implantation operations to form the p+ regions 308 in the substrate 302 by performing an ion implantation operation to implant ions (e.g., p-type ions) into the substrate 302 to form the p+ regions 308. The ion implantation tool 114 may direct an ion beam toward the substrate 302 such that the ions are implanted below the surface of the substrate 302 to dope the substrate 302. An implantation mask may be formed on the substrate 302, and a pattern formed in the implantation mask may be used to form the p+ regions 308 in the p-doped wells 304.

In some implementations, the operations illustrated and described in connection with FIGS. 4D-4G may be performed in another order. For example, the n-doped wells 306 may be formed, followed by the p-doped wells 304, followed by the n+ regions 312, followed by the p+ regions 308. As another example, the n-doped wells 306 may be formed, followed by the p-doped wells 304, followed by the p+ regions 308, followed by the n+ regions 310. As another example, the p-doped wells 304 may be formed, followed by the n-doped wells 306, followed by the p+ regions 308, followed by the n+ regions 310. As another example, the p-doped wells 304 may be formed, followed by the n-doped wells 306, followed by the n+ regions 310, followed by the p+ regions 308.

Figure 4H:
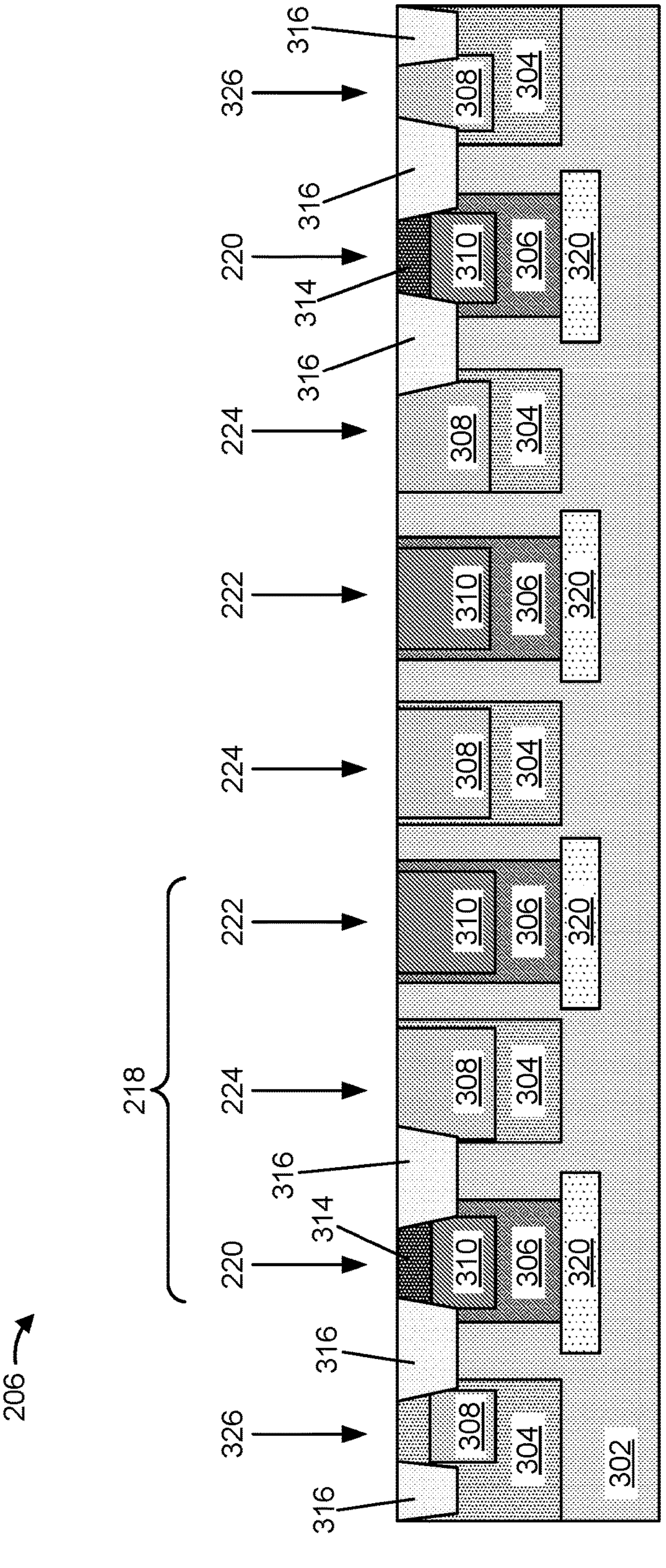

As shown in FIG. 4H, one or more n+ implantation operations may be performed to form n+ regions 314 in the substrate 302. An n+ region 314 may be formed in the n+ region 310 of the n-doped base 220 as a part of the process to form the PNP ESD triggering device 218 included in the ESD triggering circuit 206.

In some implementations, the ion implantation tool 114 performs the one or more well implantation operations to form the n+ regions 314 in the substrate 302 by performing an ion implantation operation to implant ions (e.g., n-type ions) into the substrate 302 to form the n+ regions 314. The ion implantation tool 114 may direct an ion beam toward the substrate 302 such that the ions are implanted below the surface of the substrate 302 to dope the substrate 302. An implantation mask may be formed on the substrate 302, and a pattern formed in the implantation mask may be used to form the n+ region 314 in the n+ region 310 of the n-doped base 220.

Figure 4I:
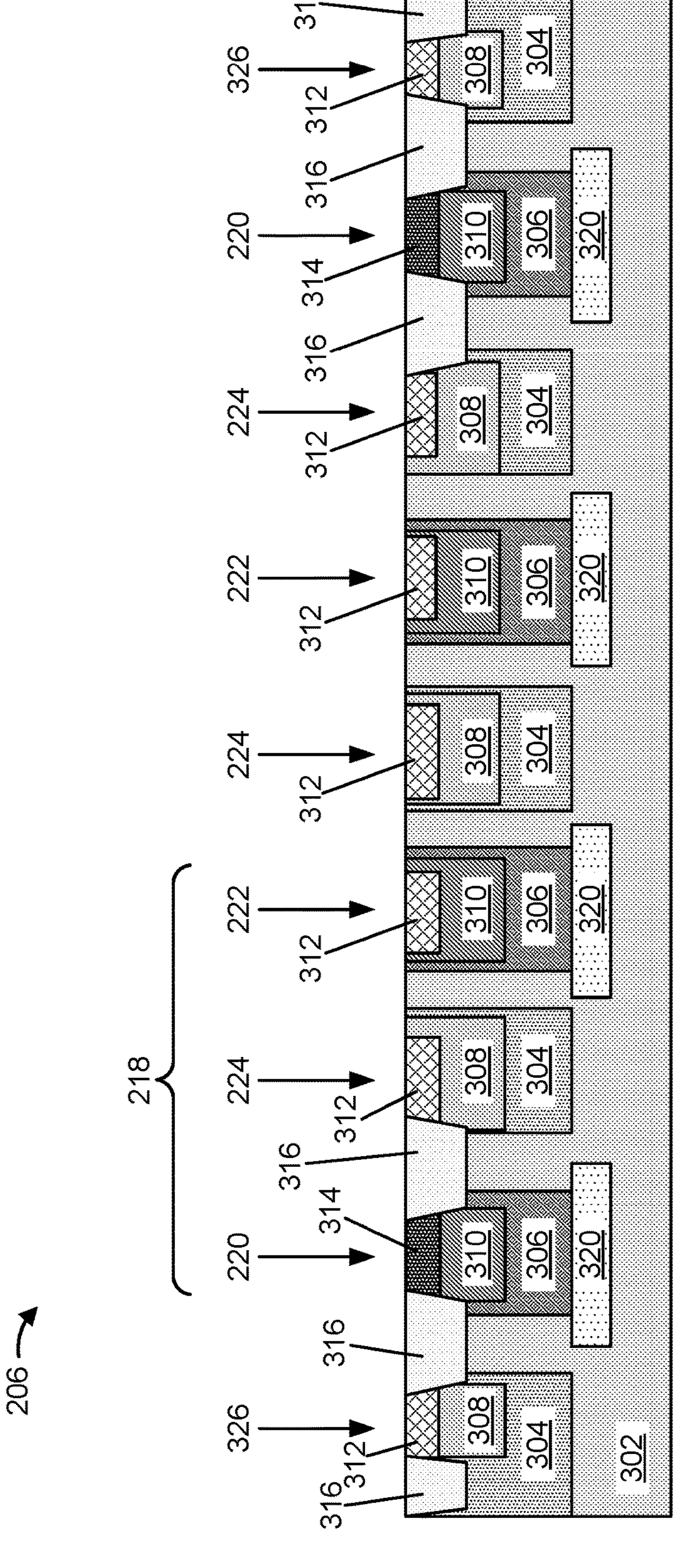

As shown in FIG. 4I, one or more p+ implantation operations may be performed to form p+ regions 312 in the substrate 302. A p+ region 312 may be formed in the n+ region 310 of the p-doped emitter 222 as a part of the process to form the PNP ESD triggering device 218 included in the ESD triggering circuit 206. Another p+ region 312 may be formed in the p+ region 308 of the p-doped collector 224 as a part of the process to form the PNP ESD triggering device 218 included in the ESD triggering circuit 206. Another p+ region 312 may be formed in the p+ region 308 of a terminal 326 of the ESD triggering circuit 206.

In some implementations, the ion implantation tool 114 performs the one or more well implantation operations to form the p+ regions 312 in the substrate 302 by performing an ion implantation operation to implant ions (e.g., p-type ions) into the substrate 302 to form the p+ regions 312. The ion implantation tool 114 may direct an ion beam toward the substrate 302 such that the ions are implanted below the surface of the substrate 302 to dope the substrate 302. An implantation mask may be formed on the substrate 302, and a pattern formed in the implantation mask may be used to form the p+ regions 312 in the n+ region 310 of the p-doped emitter 222, in the p+ region 308 of the p-doped collector 224, and/or in the p+ region 308 of the terminal 326.

In some implementations, the operations illustrated and described in connection with FIGS. 4H and 4I may be performed in another order. For example, the p+ regions 312 may be formed, and the n+ regions 314 may be formed after the p+ regions 312 are formed. Additionally and/or alternatively, one or more other semiconductor processing operations are performed after the operations illustrated and described in connection with FIGS. 4D-4G and prior to the operations illustrated and described in connection with FIGS. 4H and 4I, such as a gate poly operation to form one or more gate structures of the transistors 314 in a device circuit 202 of the semiconductor device.

Figure 4J:
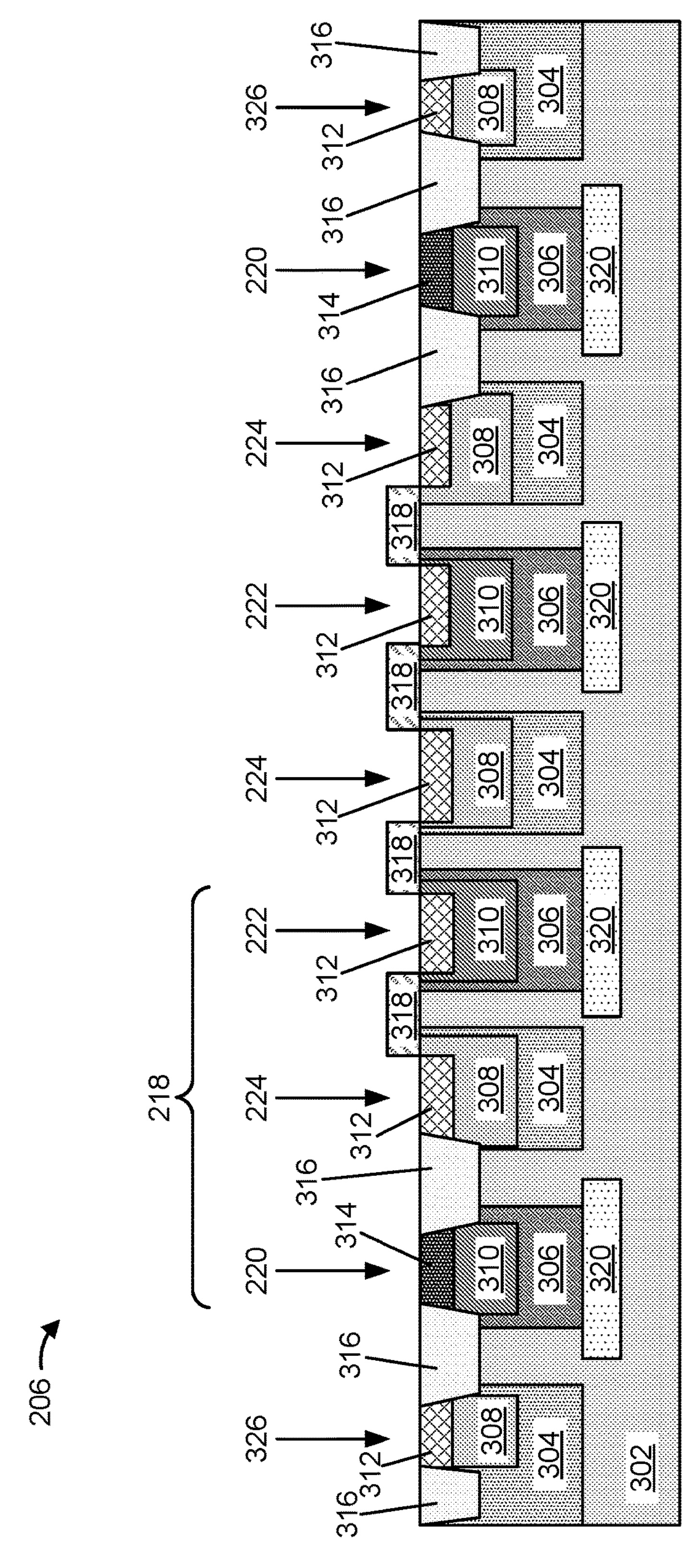

As shown in FIG. 4J, an RPO formation operation may performed to form RPO structures 318 over and/or on the surface of the substrate 302. The deposition tool 102 may deposit the material of the RPO structures 318 in a PVD operation, an ALD operation, a CVD operation, an epitaxy operation, an oxidation operation, another type of deposition operation described in connection with FIG. 1, and/or another suitable deposition operation. In some implementations, the planarization tool 110 planarizes the RPO structures 318 after the deposition tool 102 deposits the RPO structures 318. In some implementations, the material of the RPO structures 318 is deposited as a blanket layer, the etch tool 108 performs an etch back operation to remove portions of the blanket layer, where remaining portions of the blanket layer correspond to the RPO structures 318.

The RPO structures 318 may be formed such that an RPO structure 318 is included over and/or on a portion 324 of the substrate 302 between the p-doped well 304 of the p-doped collector 224 and the n-doped well 306 of the p-doped emitter 222. In some implementations, the RPO structure 318 may be formed such that the RPO structure 318 is included over and/or on a portion of the p-doped well 304, over and/or on a portion of the n-doped well 306, over and/or on a portion of the p+ region 308 of the p-doped collector 224, and/or over and/or on a portion of the n+ region 310 of the p-doped emitter 222, among other examples.

Alternative to performing the RPO formation operation to form the RPO structures 318, the RPO structures 318 may be omitted and additional STI regions 316 may be formed in the substrate as part of the STI formation operation illustrated and described in connection with FIG. 4C. These additional STI regions 316 may be formed such that the additional STI regions 316 are located over and/or on a portion 324 of the substrate 302 between the p-doped well 304 of the p-doped collector 224 and the n-doped well 306 of the p-doped emitter 222.

As indicated above, FIGS. 4A-4J are provided as an example. Other examples may differ from what is described with regard to FIGS. 4A-4J.

Figure 5A:
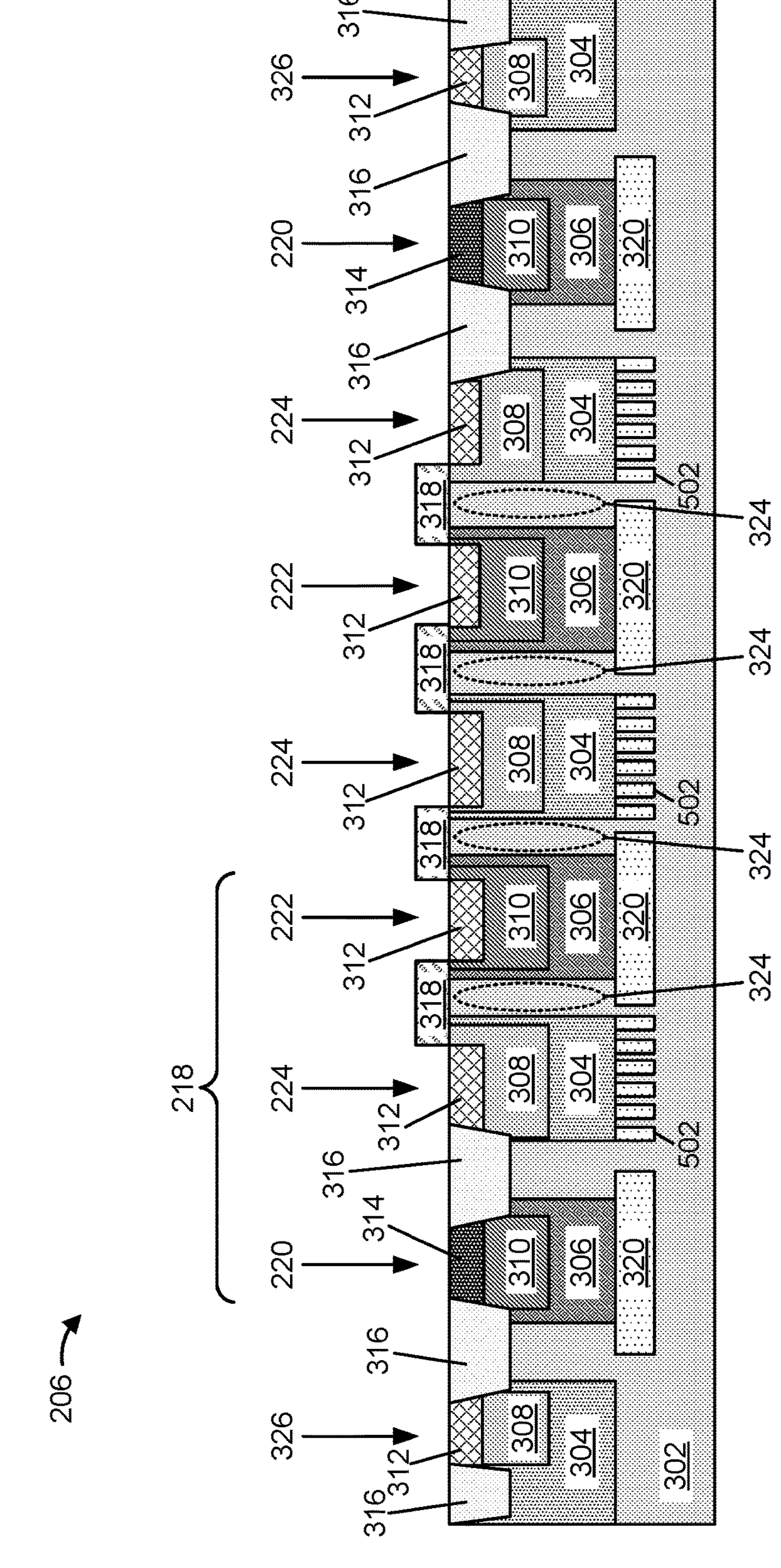
FIGS. 5A-5C are diagrams of example implementations of an ESD triggering circuit described herein.
Figure 5B:
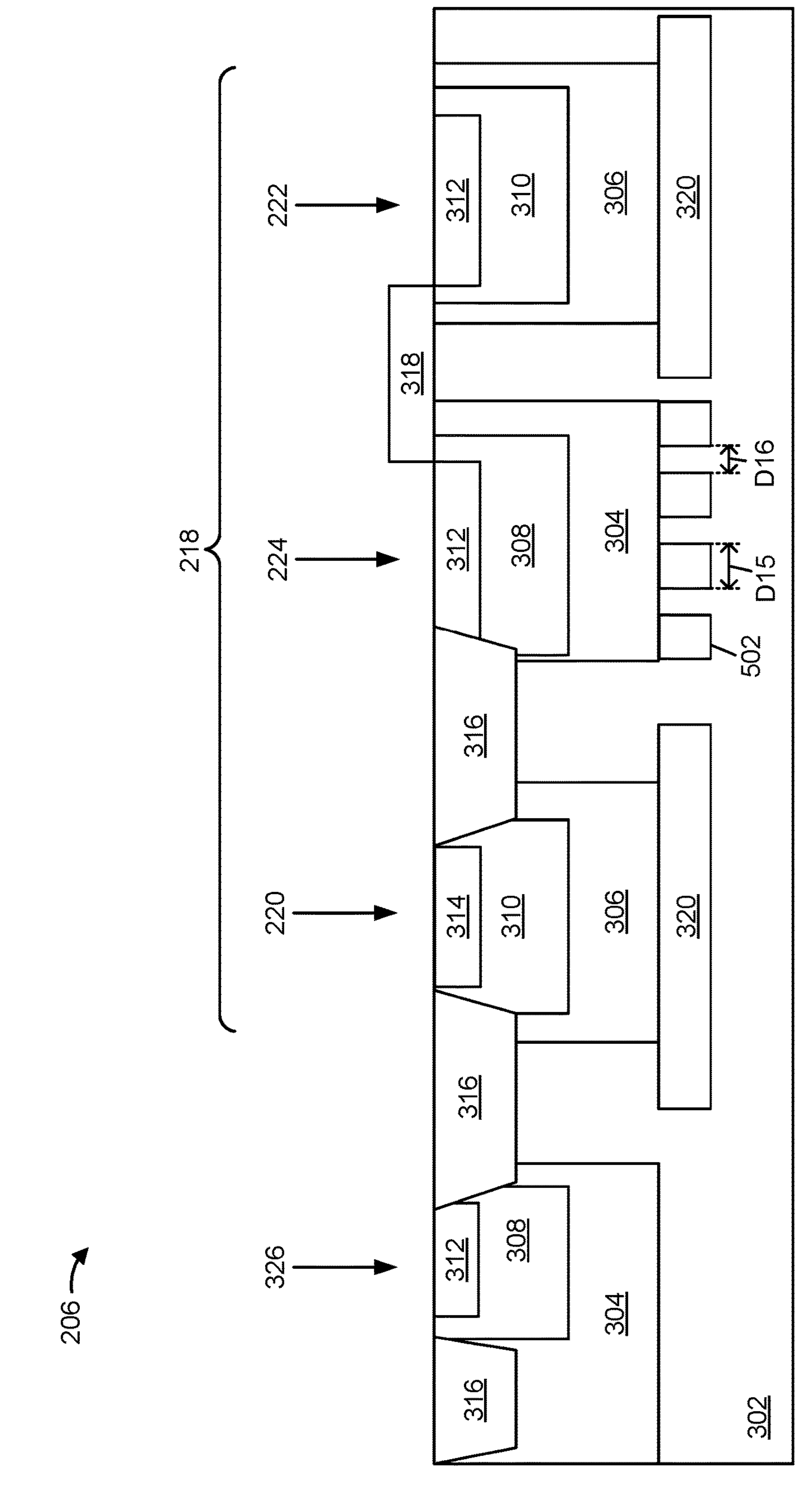
Figure 5C:
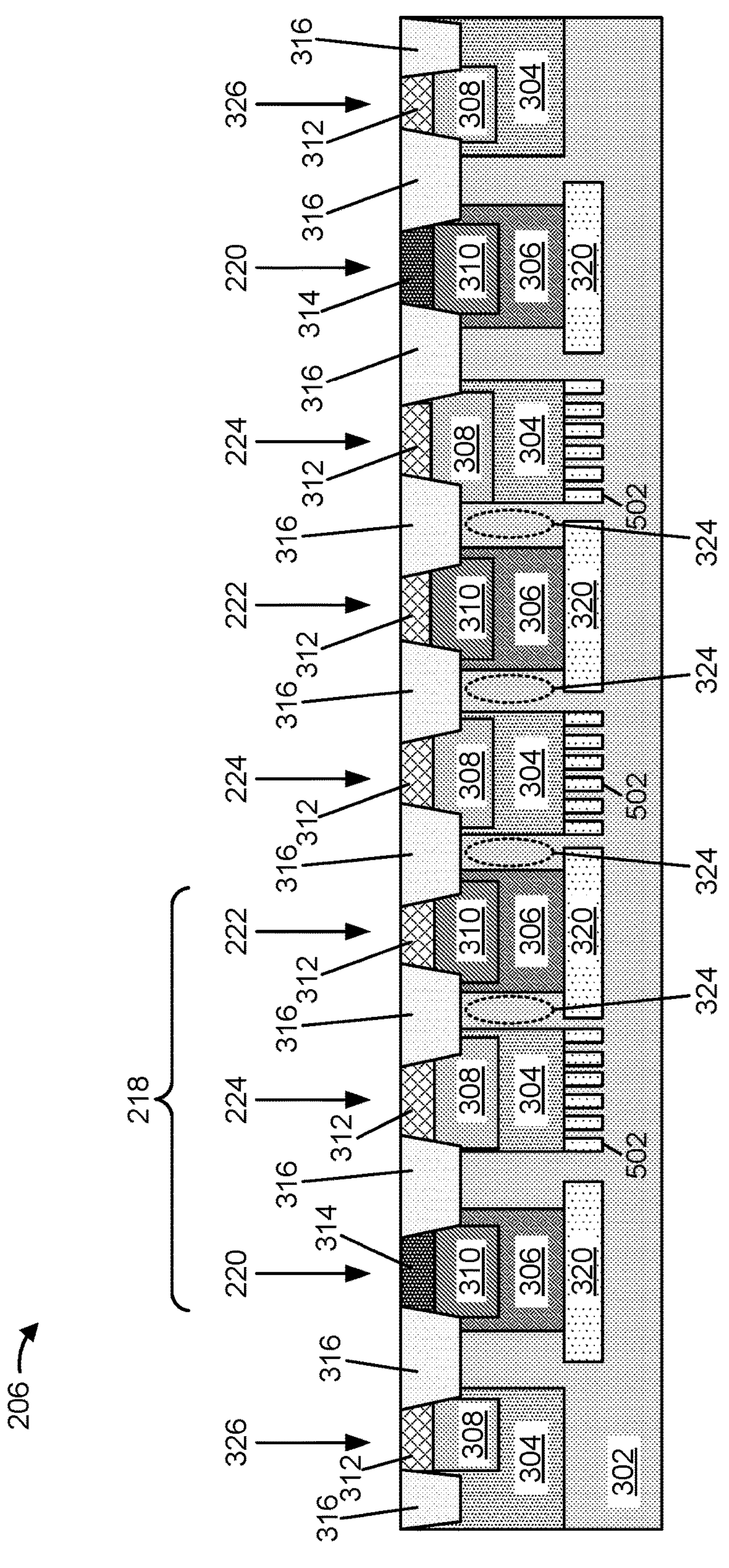

FIGS. 5A-5C are diagrams of example implementations of an ESD triggering circuit 206 described herein. The example implementations of the ESD triggering circuit 206 described in connection with FIGS. 5A-5C may be included in a semiconductor device, such as the semiconductor device 200, the semiconductor device 226, the semiconductor device 228, and/or another semiconductor device that includes high voltage devices.

FIGS. 5A and 5B illustrate an example implementation 500 of an ESD triggering circuit 206. As shown in FIG. 5A, the example implementation 500 of the ESD triggering circuit 206 may include a similar arrangement of layers and/or structures as the example implementation 300 of the ESD triggering circuit 206 illustrated and described in connection with FIGS. 3A and 3B. For example, the example implementation 500 of the ESD triggering circuit 206 may include components 302-324, except that n-doped barrier strips 502 are included in place of one or more of the portions 322 of the substrate 302 between adjacent n-doped barrier regions 320. The n-doped barrier strips 502 may be included under a p-doped well 304 of a p-doped collector 224 in a PNP ESD triggering device 218 of the ESD triggering circuit 206, and may provide additional charge carrier migration blocking (e.g., in combination with the n-doped barrier regions 320) with minimal decrease in breakdown voltage of the PNP ESD triggering device 218. In some implementations, the n-doped barrier strips 502 are omitted from under one or more terminals 326 of the ESD triggering circuit 206. In some implementations, the n-doped barrier strips 502 are include under the p-doped wells 304 of one or more terminals 326 of the ESD triggering circuit 206.

The n-doped barrier strips 502 include a similar dopant concentration and dopant type as the n-doped barrier regions 320. The example implementation 500 of the ESD triggering circuit 206 may be formed by a similar set of semiconductor processing operations illustrated and described in connection with FIGS. 4A-4J. The n-doped barrier strips 502 may be formed as a part of the one or more barrier layer implantation operations illustrated and described in connection with FIG. 4B.

FIG. 5B illustrates a plurality of example dimensions of the example implementation 500 of the ESD triggering circuit 206. In some implementations, one or more other example implementations of ESD protection circuits 206 described herein may include one or more of the dimensions illustrated and described in connection with FIG. 5B.

An example dimension D15, includes a width of an n-doped barrier strip 502 in the ESD triggering circuit 206. In some implementations, the example dimension D15 may be included in a range of approximately 0.2 microns to approximately 3 microns. If the example dimension D15 is less than approximately 0.2 microns, the n-doped barrier strips 502 may not provide sufficient blocking of charge carrier migration into the substrate 302, resulting in reduced electrical isolation and reduced operating efficiency in the ESD triggering circuit 206. If the example dimension D15 is greater than approximately 3 microns, the breakdown voltage of the ESD triggering circuit 206 may be too low to enable high voltage operation of the associated device circuit 202 (e.g., less than the operating voltage of the associated device circuit 202). However, other values for the range are within the scope of the present disclosure.

Another example dimension D16, includes a spacing between adjacent n-doped barrier strips 502 in the ESD triggering circuit 206. In some implementations, the example dimension D16 may be included in a range of approximately 0.2 microns to approximately 3 microns. If the example dimension D16 is less than approximately 0.2 microns, the breakdown voltage of the ESD triggering circuit 206 may be too low to enable high voltage operation of the associated device circuit 202 (e.g., less than the operating voltage of the associated device circuit 202). If the example dimension D16 is greater than approximately 3 microns, the n-doped barrier strips 502 may not provide sufficient blocking of charge carrier migration into the substrate 302, resulting in reduced electrical isolation and reduced operating efficiency in the ESD triggering circuit 206. However, other values for the range are within the scope of the present disclosure.

In some implementations, a quantity of the n-doped barrier strips 502, included under a particular p-doped well 304, may be included in a range of 2 to 10. If the quantity is less than 2, the n-doped barrier strips 502 may provide only minimal increase in electrical isolation. If the quantity is greater than 10, patterning the n-doped barrier strips 502 may increase the complexity of the implantation mask to form the n-doped barrier strips 502 which may result in an increased defect rate in the n-doped barrier strips 502.

FIG. 5C illustrates another example implementation 504 of an ESD triggering circuit 206 that may be included in a semiconductor device. As shown in FIG. 5C, the example implementation 504 of the ESD triggering circuit 206 may include a similar arrangement of layers and/or structures as the example implementation 328 of the ESD triggering circuit 206 illustrated and described in connection with FIG. 3C. For example, the example implementation 504 of the ESD triggering circuit 206 may include components 302-316 and 320-324, except that n-doped barrier strips 502 are included in place of the portions 322 of the substrate 302 between adjacent n-doped barrier regions 320. The n-doped barrier strips 502 may be included to provide additional charge carrier migration blocking (e.g., in combination with the n-doped barrier regions 320) with minimal decrease in breakdown voltage of the PNP ESD triggering device(s) 218 of the ESD triggering circuit 206. The n-doped barrier strips 502 include a similar dopant concentration and dopant type as the n-doped barrier regions 320.

The example implementation 504 of the ESD triggering circuit 206 may be formed by a similar set of semiconductor processing operations illustrated and described in connection with FIGS. 4A-4J. The n-doped barrier strips 502 may be formed as a part of the one or more barrier layer implantation operations illustrated and described in connection with FIG. 4B.

As indicated above, FIGS. 5A-5C are provided as examples. Other examples may differ from what is described with regard to FIGS. 5A-5C.

Figure 6A:
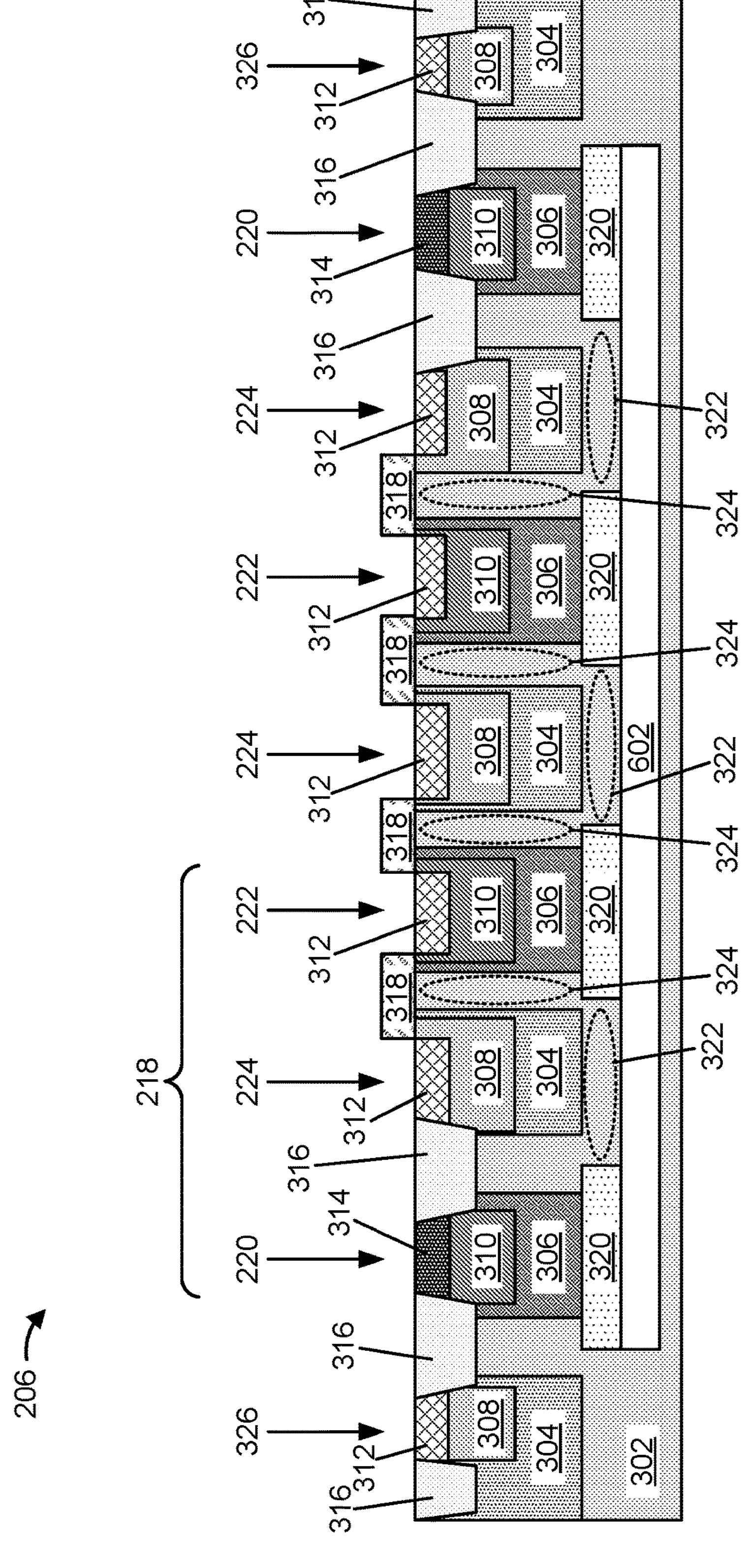
FIGS. 6A-6C are diagrams of example implementations of an ESD triggering circuit described herein.
Figure 6B:
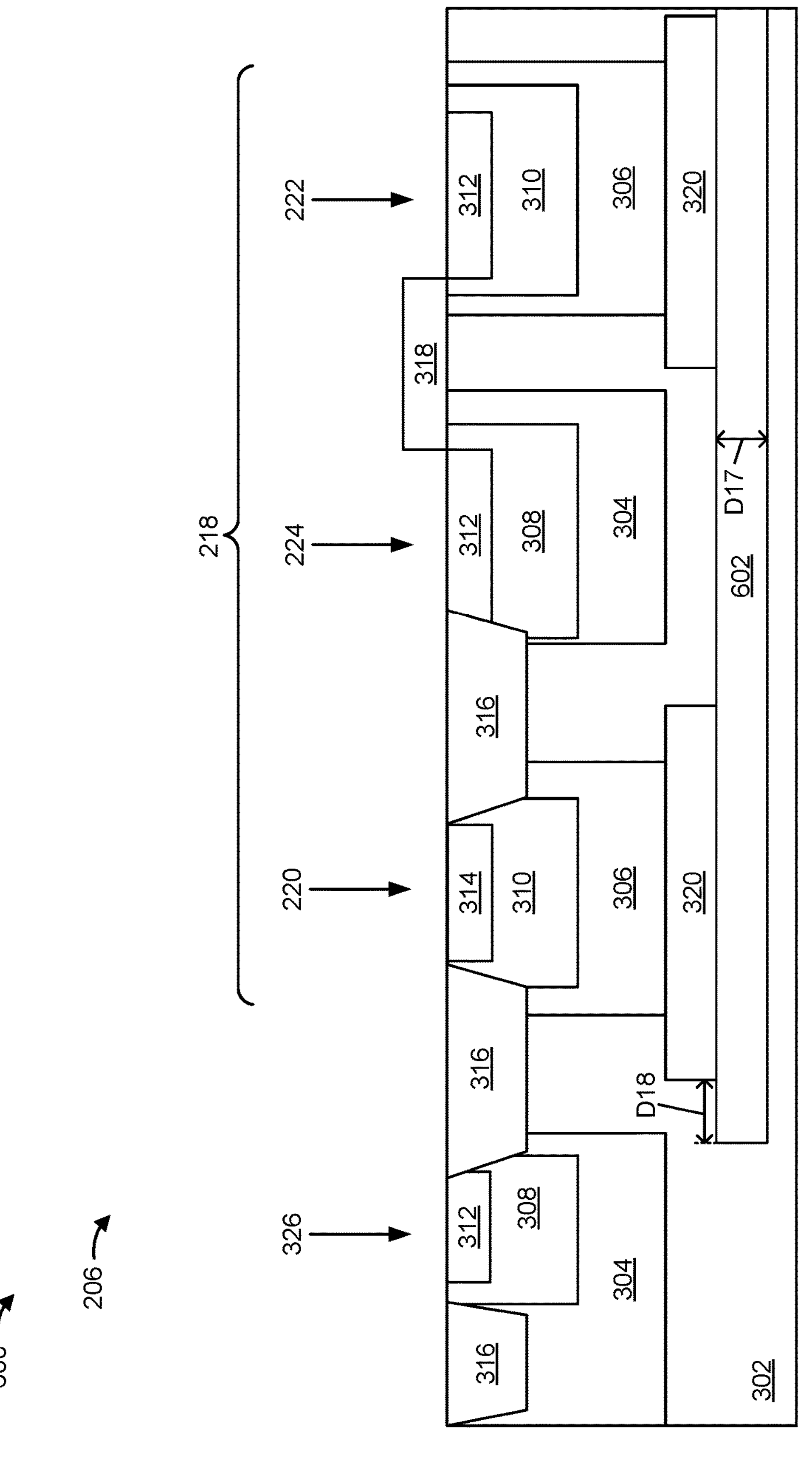
Figure 6C:
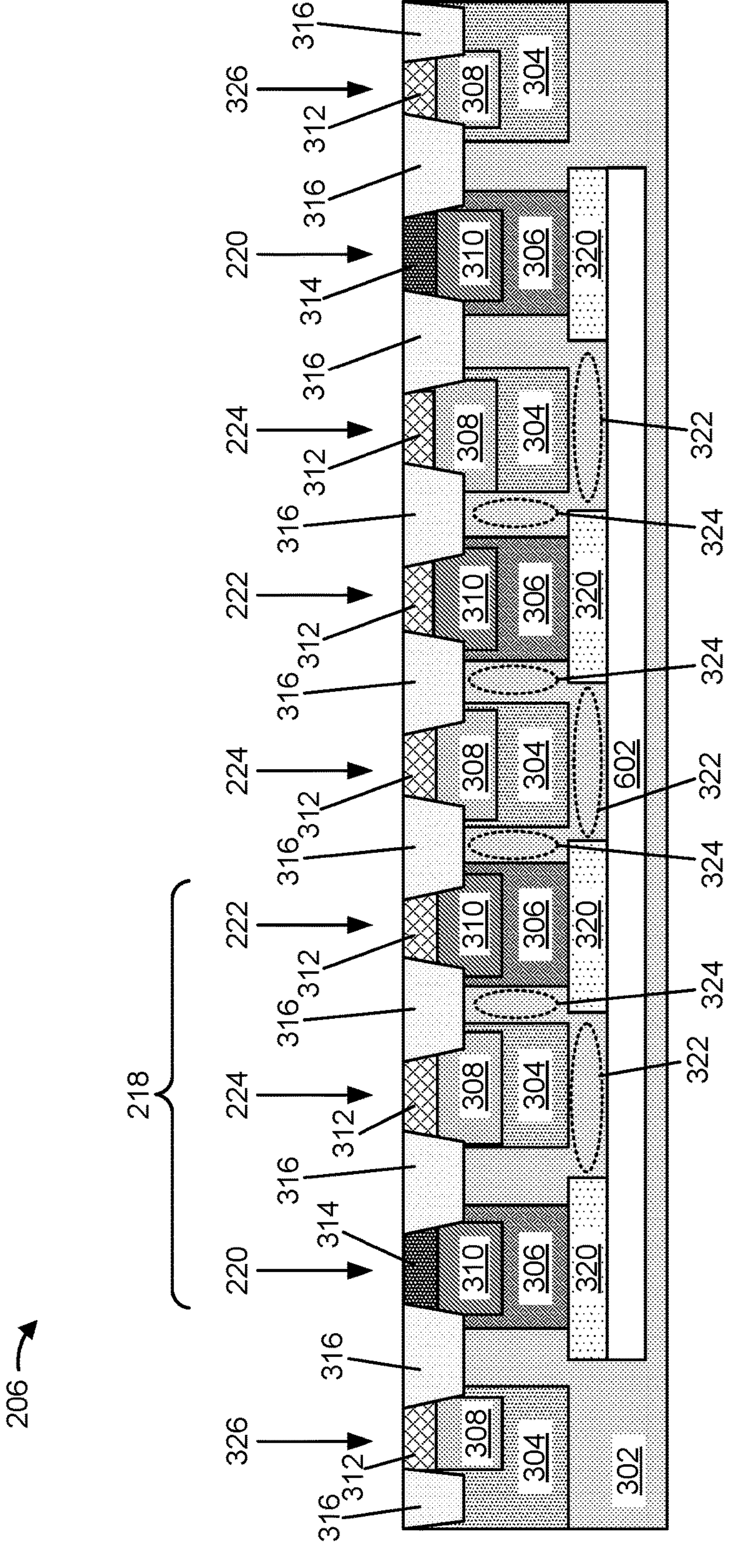

FIGS. 6A-6C are diagrams of example implementations of an ESD triggering circuit 206 described herein. The example implementations of the ESD triggering circuit 206 described in connection with FIGS. 6A-6C may be included in a semiconductor device, such as the semiconductor device 200, the semiconductor device 226, the semiconductor device 228, and/or another semiconductor device that includes high voltage devices.

FIGS. 6A and 6B illustrate an example implementation 600 of an ESD triggering circuit 206. As shown in FIG. 6A, the example implementation 600 of the ESD triggering circuit 206 may include a similar arrangement of layers and/or structures as the example implementation 300 of the ESD triggering circuit 206 illustrated and described in connection with FIGS. 3A and 3B. For example, the example implementation 600 of the ESD triggering circuit 206 may include components 302-324. The example implementation 600 of the ESD triggering circuit 206 may further include a deep n-doped barrier layer 602. The deep n-doped barrier layer 602 may be included below and/or under the n-doped barrier regions 320, and may provide additional charge carrier migration blocking (e.g., in combination with the n-doped barrier regions 320) with minimal decrease in breakdown voltage of the PNP ESD triggering device 218 because of the distance between the deep n-doped barrier layer 602 and the p-doped wells 304 in the ESD triggering circuit 206.

The deep n-doped barrier layer 602 may include a continuous layer that extends continuously between and under a plurality of n-doped barrier regions 320. The deep n-doped barrier layer 602 may include a similar dopant concentration and dopant type as the n-doped barrier regions 320. The example implementation 600 of the ESD triggering circuit 206 may be formed by a similar set of semiconductor processing operations illustrated and described in connection with FIGS. 4A-4J. The deep n-doped barrier layer 602 may be formed before or after the one or more barrier layer implantation operations, illustrated and described in connection with FIG. 4B, to form the n-doped barrier regions 320.

FIG. 6B illustrates a plurality of example dimensions of the example implementation 600 of the ESD triggering circuit 206. In some implementations, one or more other example implementations of ESD protection circuits 206 described herein may include one or more of the dimensions illustrated and described in connection with FIG. 6B.

Another example dimension D17, includes a thickness of the deep n-doped barrier layer 602 in the ESD triggering circuit 206. In some implementations, the example dimension D17 may be included in a range of approximately 1 micron to approximately 10 microns. If the example dimension D17 is less than approximately 1 micron, the deep n-doped barrier layer 602 may not provide sufficient blocking of charge carrier migration into the substrate 302, resulting in reduced electrical isolation and reduced operating efficiency in the ESD triggering circuit 206. If the example dimension D17 is greater than approximately 10 microns, the breakdown voltage of the ESD triggering circuit 206 may be too low to enable high voltage operation of the associated device circuit 202 (e.g., less than the operating voltage of the associated device circuit 202). However, other values for the range are within the scope of the present disclosure.

Another example dimension D18, includes a lateral extension of the deep n-doped barrier layer 602 from an outer edge of an n-doped barrier region 320 over the deep n-doped barrier layer 602. In some implementations, the example dimension D18 may be included in a range of approximately −5 microns (meaning that the deep n-doped barrier layer 602 does not laterally extend outward from the outer edge of the n-doped barrier region 320) to approximately 5 microns. If the example dimension D18 is less than approximately −5 microns, the deep n-doped barrier layer 602 may not provide sufficient blocking of charge carrier migration into the substrate 302, resulting in reduced electrical isolation and reduced operating efficiency in the ESD triggering circuit 206. If the example dimension D18 is greater than approximately 5 microns, the breakdown voltage of the ESD triggering circuit 206 may be too low to enable high voltage operation of the associated device circuit 202 (e.g., less than the operating voltage of the associated device circuit 202). However, other values for the range are within the scope of the present disclosure.

FIG. 6C illustrates another example implementation 604 of an ESD triggering circuit 206 that may be included in a semiconductor device. As shown in FIG. 6C, the example implementation 604 of the ESD triggering circuit 206 may include a similar arrangement of layers and/or structures as the example implementation 328 of the ESD triggering circuit 206 illustrated and described in connection with FIG. 3C. For example, the example implementation 604 of the ESD triggering circuit 206 may include components 302-316 and 320-324. The example implementation 604 of the ESD triggering circuit 206 may further include a deep n-doped barrier layer 602. The deep n-doped barrier layer 602 may be included below and/or under the n-doped barrier regions 320, and may provide additional charge carrier migration blocking (e.g., in combination with the n-doped barrier regions 320) with minimal decrease in breakdown voltage of the PNP ESD triggering device 218 because of the distance between the deep n-doped barrier layer 602 and the p-doped wells 304 in the ESD triggering circuit 206.

The deep n-doped barrier layer 602 may include a continuous layer that extends continuously between and under a plurality of n-doped barrier regions 320. The deep n-doped barrier layer 602 may include a similar dopant concentration and dopant type as the n-doped barrier regions 320. The example implementation 604 of the ESD triggering circuit 206 may be formed by a similar set of semiconductor processing operations illustrated and described in connection with FIGS. 4A-4J. The deep n-doped barrier layer 602 may be formed before or after the one or more barrier layer implantation operations, illustrated and described in connection with FIG. 4B, to form the n-doped barrier regions 320.

As indicated above, FIGS. 6A-6C are provided as examples. Other examples may differ from what is described with regard to FIGS. 6A-6C.

Figure 7A:
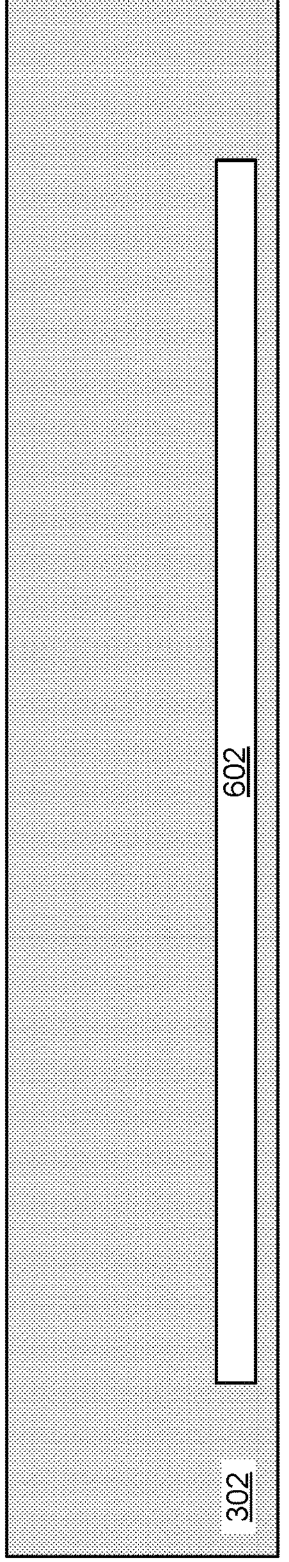
FIGS. 7A-7C are diagrams of an example implementation of forming an ESD triggering circuit in a semiconductor device described herein.
Figure 7B:
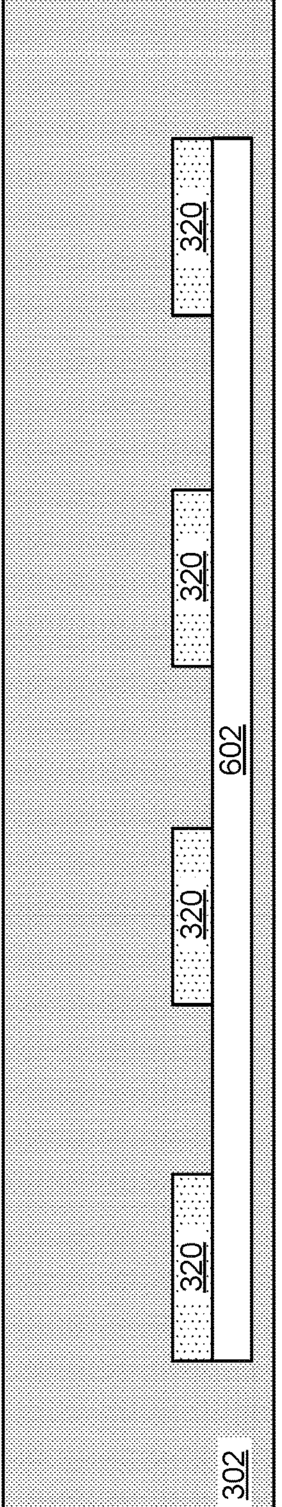
Figure 7C:
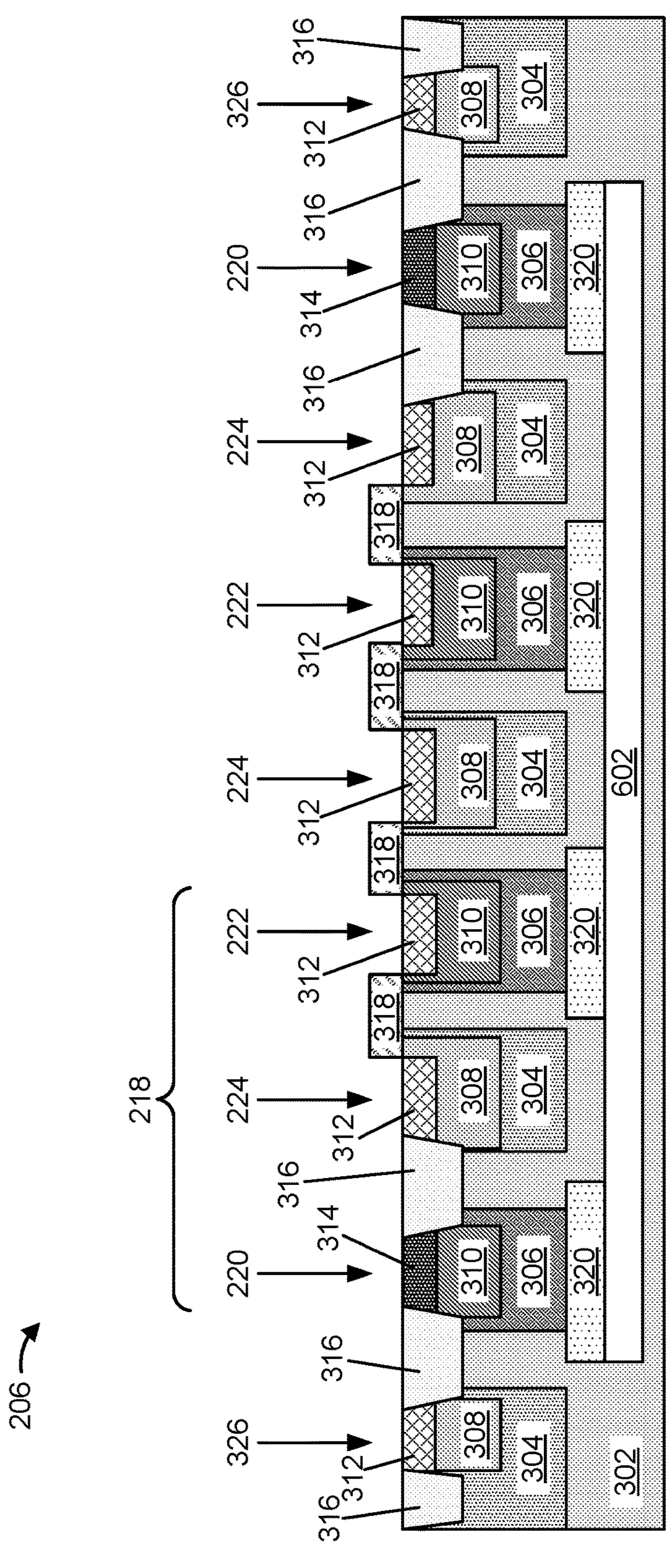

FIGS. 7A-7C are diagrams of an example implementation 700 of forming an ESD triggering circuit 206 in a semiconductor device described herein. While the example implementation 700 includes an example of forming the example implementation 600 of the ESD triggering circuit 206 illustrated and described in connection with FIGS. 6A and 6B, the semiconductor processing operations and/or techniques illustrated and described in connection with FIGS. 7A-7C (or a subset thereof) may be used to manufacture other example implementations of ESD protection circuits 206 illustrated and described herein. In some implementations, one or more of the semiconductor processing operations described in connection with FIGS. 7A-7C are performed by one or more of the semiconductor processing tools 102-114 and/or the wafer/die transport tool 116 described in connection with FIG. 1. In some implementations, one or more of the semiconductor processing operations described in connection with FIGS. 7A-7C are performed by one or more of the semiconductor processing tools not shown in FIG. 1.

Turning to FIG. 7A, a substrate 302 may be provided. The substrate 302 may be provided as a semiconductor wafer, a semiconductor die, and/or another type of semiconductor substrate. In some implementations, the substrate 302 may be a doped substrate, such as a semiconductor substrate that is doped with one or more p-type dopants, a semiconductor substrate that is doped with one or more n-type dopants, and/or another type of doped substrate. In some implementations, the substrate 302 has a bulk resistivity (or volumetric resistivity) that is included in a range of approximately 1 ohm-centimeter to approximately 100 ohm-centimeters. However, other values for the range are within the scope of the present disclosure.

As further shown in FIG. 7A, a barrier layer implantation operation may be performed to form a deep n-doped barrier layer 602 in the substrate 302. The deep n-doped barrier layer 602 may be formed below the surface of the substrate 302.

In some implementations, the ion implantation tool 114 performs the one or more well implantation operations to form the deep n-doped barrier layer 602 in the substrate 302 by performing an ion implantation operation to implant ions (e.g., n-type ions) into the substrate 302 to form the deep n-doped barrier layer 602. The ion implantation tool 114 may direct an ion beam toward the substrate 302 such that the ions are implanted below the surface of the substrate 302 to dope the substrate 302. In some implementations, the deep n-doped barrier layer 602 may be formed such that the concentration of (e.g., n-type dopants) in the deep n-doped barrier layer 602 may be included in a range of approximately $1\times10^{17}$n-type ions per cubic centimeter to approximately $1\times10^{21}$ n-type ions per cubic centimeter. However, other values for the range are within the scope of the present disclosure.

As shown in FIG. 7B, one or more barrier layer implantation operations may be performed to form n-doped barrier regions 320 in the substrate 302. The n-doped barrier regions 320 may be formed below the surface of the substrate 302. The n-doped barrier regions 320 may be formed such that the n-doped barrier regions 320 are spaced apart from one another by portions 322 of the substrate 302. Moreover, the n-doped barrier regions 320 may be formed over and/or on the deep n-doped barrier layer 602.

In some implementations, the ion implantation tool 114 performs the one or more well implantation operations to form the n-doped barrier regions 320 in the substrate 302 by performing an ion implantation operation to implant ions (e.g., n-type ions) into the substrate 302 to form the n-doped barrier regions 320. The ion implantation tool 114 may direct an ion beam toward the substrate 302 such that the ions are implanted below the surface of the substrate 302 to dope the substrate 302. An implantation mask may be formed on the substrate 302, and a pattern formed in the implantation mask may be used to form the n-doped barrier regions 320 such that the n-doped barrier regions 320 are spaced apart from one another by portions 322 of the substrate 302. In some implementations, the n-doped barrier regions 320 may be formed such that the concentration of (e.g., n-type dopants) in the n-doped barrier regions 320 may be included in a range of approximately $1\times10^{17}$n-type ions per cubic centimeter to approximately $1\times10^{21}$ n-type ions per cubic centimeter. However, other values for the range are within the scope of the present disclosure.

In some implementations, the ion implantation tool 114 forms the n-doped barrier regions 320 prior to formation of the deep n-doped barrier layer 602. For example, the ion implantation tool 114 may form the n-doped barrier regions 320, and may for the deep n-doped barrier layer 602 below and/or under the n-doped barrier regions 320 after forming the n-doped barrier regions 320.

As shown in FIG. 7C, additional semiconductor processing operations illustrated and described in connection with FIGS. 4C-4J may be performed to form the example implementation 600 of the ESD triggering circuit 206 (and/or the example implementation 604 of the ESD triggering circuit 206, and/or another example implementation of an ESD triggering circuit 206 described herein).

As indicated above, FIGS. 7A-7C are provided as an example. Other examples may differ from what is described with regard to FIGS. 7A-7C.

Figure 8A:
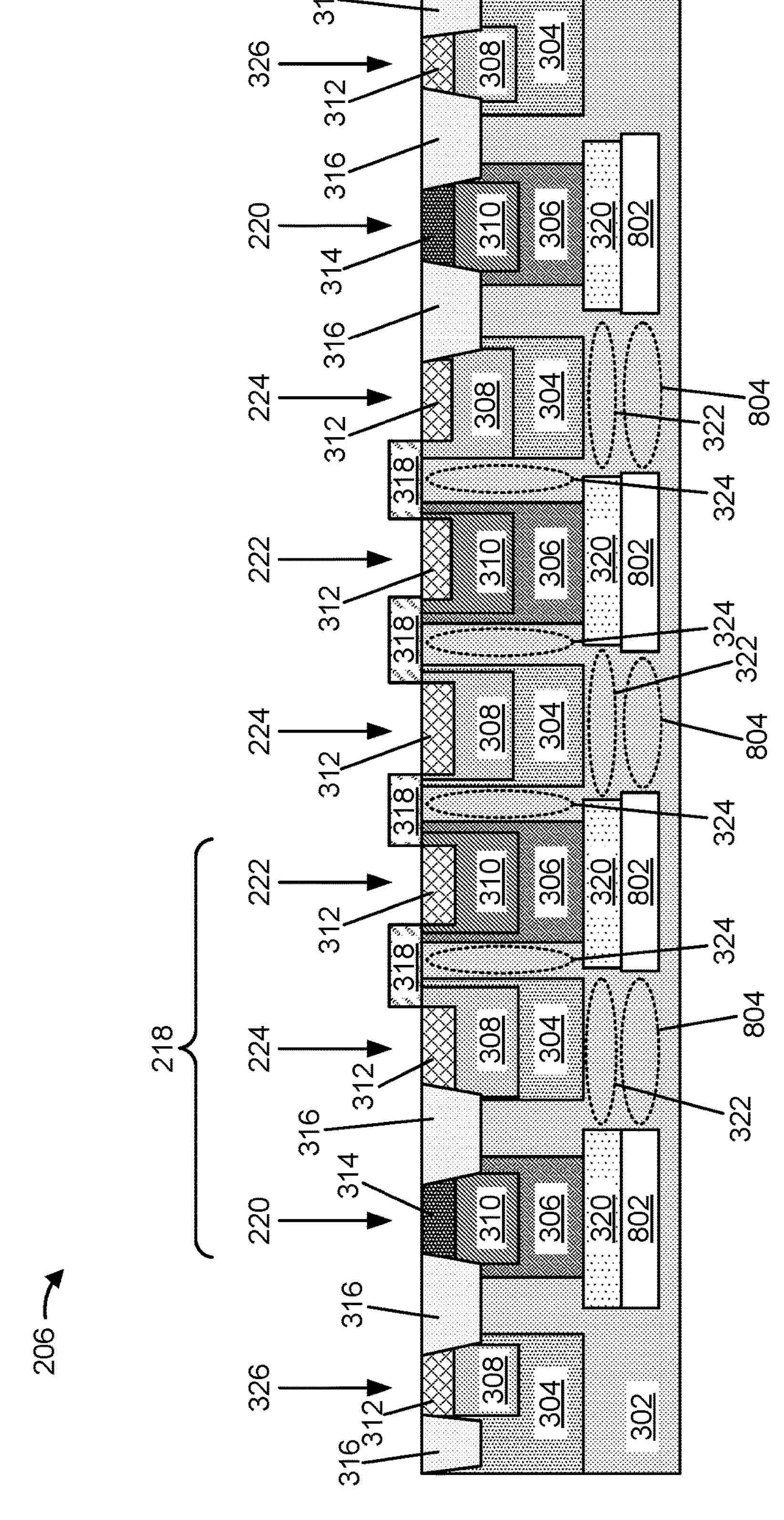
FIGS. 8A-8C are diagrams of example implementations of an ESD triggering circuit described herein.
Figure 8B:
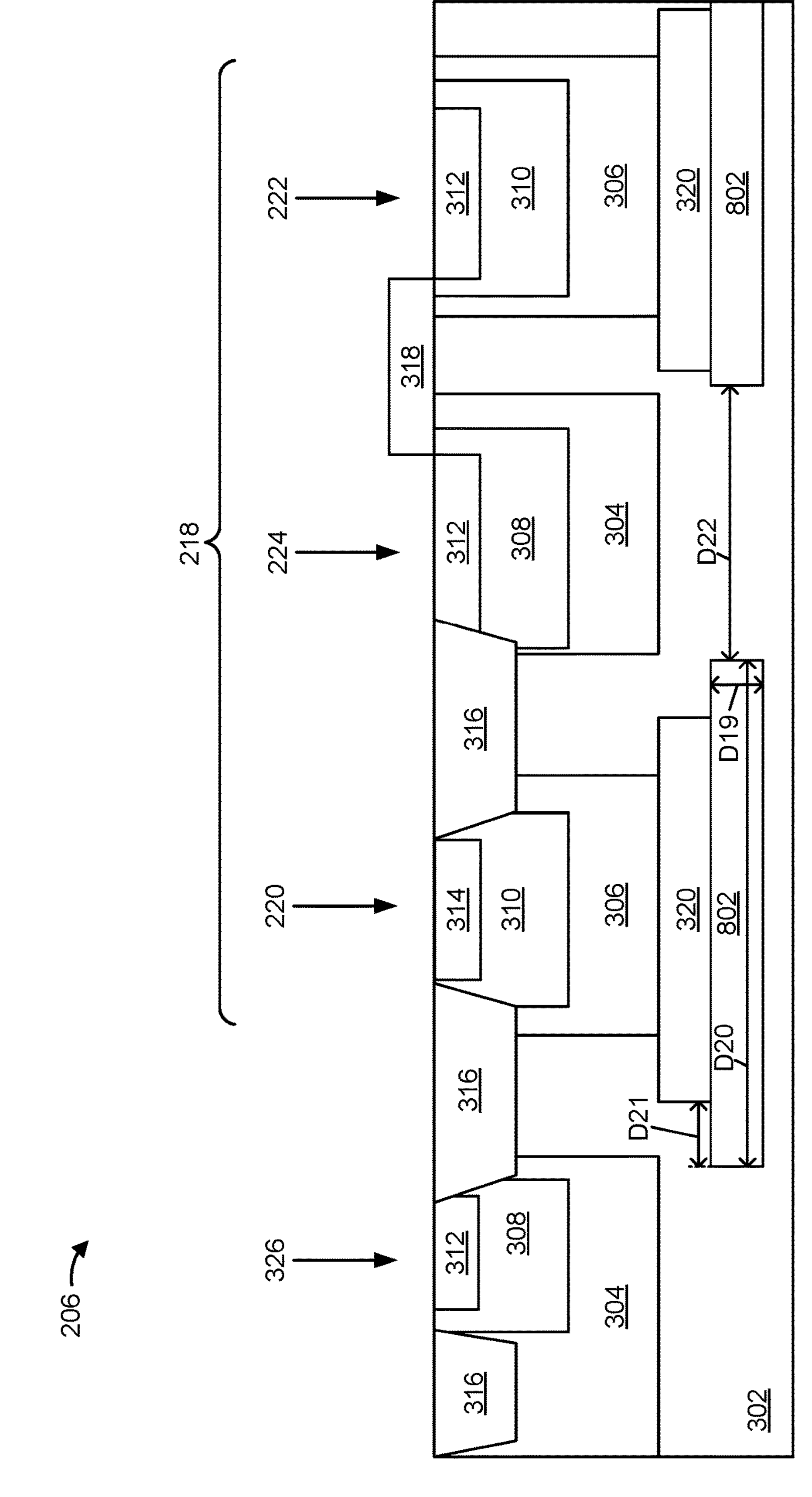
Figure 8C:
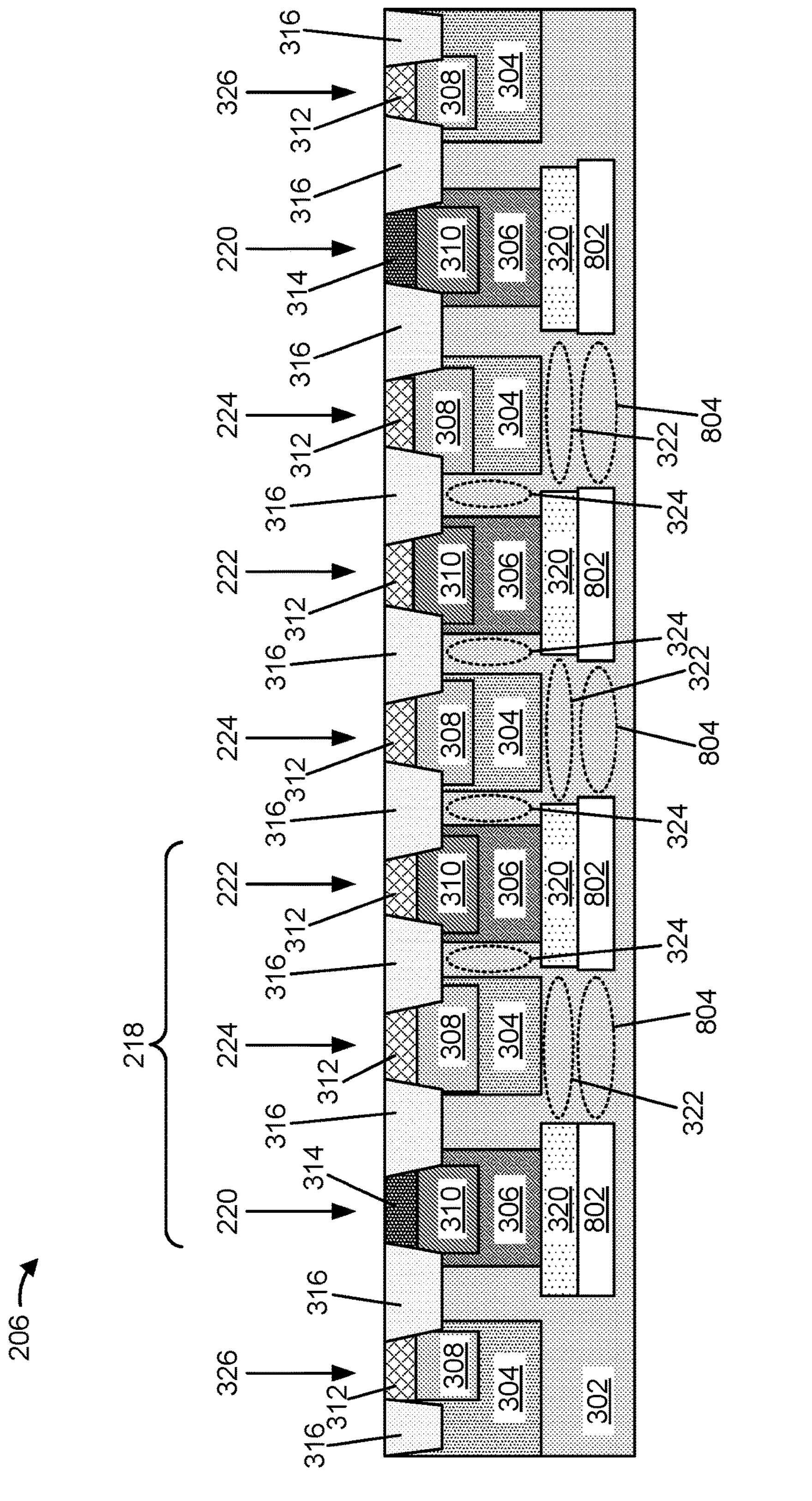

FIGS. 8A-8C are diagrams of example implementations of an ESD triggering circuit 206 described herein. The example implementations of the ESD triggering circuit 206 described in connection with FIGS. 8A-8C may be included in a semiconductor device, such as the semiconductor device 200, the semiconductor device 226, the semiconductor device 228, and/or another semiconductor device that includes high voltage devices.

FIGS. 8A and 8B illustrate an example implementation 800 of an ESD triggering circuit 206. As shown in FIG. 8A, the example implementation 800 of the ESD triggering circuit 206 may include a similar arrangement of layers and/or structures as the example implementation 300 of the ESD triggering circuit 206 illustrated and described in connection with FIGS. 3A and 3B. For example, the example implementation 800 of the ESD triggering circuit 206 may include components 302-324. The example implementation 800 of the ESD triggering circuit 206 may further include a plurality of deep n-doped barrier regions 802. A deep n-doped barrier region 802 may be included below and/or under an n-doped barrier region 320, and may provide additional charge carrier migration blocking (e.g., in combination with the n-doped barrier region 320). Adjacent deep n-doped barrier regions 802 may be spaced apart or separated by portions 804 of the substrate 302 below and/or under the p-doped wells 304 of the p-doped collectors 224 of the ESD triggering circuit 206, thereby providing minimal decrease in breakdown voltage of the PNP ESD triggering devices 218 of the ESD triggering circuit 206. The portions 804 of the substrate 302 may be located below and/or under the portions 322 of the substrate 302 between adjacent n-doped barrier regions 320.

The deep n-doped barrier regions 802 may include a similar dopant concentration and dopant type as the n-doped barrier regions 320. The example implementation 800 of the ESD triggering circuit 206 may be formed by a similar set of semiconductor processing operations illustrated and described in connection with FIGS. 4A-4J and/or 7A-7C. The deep n-doped barrier regions 802 may be formed in the barrier layer formation operation, illustrated and described in connection with FIG. 7A, in place of the deep n-doped barrier layer 602. The deep-n-doped barrier regions 802 may be formed before or after the one or more barrier layer implantation operations, illustrated and described in connection with FIG. 4B and/or FIG. 7B, to form the n-doped barrier regions 320.

FIG. 8B illustrates a plurality of example dimensions of the example implementation 800 of the ESD triggering circuit 206. In some implementations, one or more other example implementations of ESD protection circuits 206 described herein may include one or more of the dimensions illustrated and described in connection with FIG. 8B.

Another example dimension D19, includes a thickness of a deep n-doped barrier region 802 in the ESD triggering circuit 206. In some implementations, the example dimension D19 may be included in a range of approximately 1 micron to approximately 10 microns. If the example dimension D19 is less than approximately 1 micron, the deep n-doped barrier region 802 may not provide sufficient blocking of charge carrier migration into the substrate 302, resulting in reduced electrical isolation and reduced operating efficiency in the ESD triggering circuit 206. If the example dimension D19 is greater than approximately 10 microns, the breakdown voltage of the ESD triggering circuit 206 may be too low to enable high voltage operation of the associated device circuit 202 (e.g., less than the operating voltage of the associated device circuit 202). However, other values for the range are within the scope of the present disclosure.

Another example dimension D20, includes a width of a deep n-doped barrier region 802 in the ESD triggering circuit 206. In some implementations, the example dimension D20 may be included in a range of approximately 1 micron to approximately 5 microns. If the example dimension D20 is less than approximately 1 micron, the deep n-doped barrier region 802 may not provide sufficient blocking of charge carrier migration into the substrate 302, resulting in reduced electrical isolation and reduced operating efficiency in the ESD triggering circuit 206. If the example dimension D20 is greater than approximately 5 microns, the breakdown voltage of the ESD triggering circuit 206 may be too low to enable high voltage operation of the associated device circuit 202 (e.g., less than the operating voltage of the associated device circuit 202). However, other values for the range are within the scope of the present disclosure.

Another example dimension D21, includes a lateral extension of a deep n-doped barrier region 802 from an outer edge of an n-doped barrier region 320 over the deep n-doped barrier region 802. In some implementations, the example dimension D21 may be included in a range of approximately −5 microns (meaning that the deep n-doped barrier region 802 does not laterally extend outward from the outer edge of the n-doped barrier region 320) to approximately 5 microns. If the example dimension D21 is less than approximately −5 microns, the deep n-doped barrier region 802 may not provide sufficient blocking of charge carrier migration into the substrate 302, resulting in reduced electrical isolation and reduced operating efficiency in the ESD triggering circuit 206. If the example dimension D21 is greater than approximately 5 microns, the breakdown voltage of the ESD triggering circuit 206 may be too low to enable high voltage operation of the associated device circuit 202 (e.g., less than the operating voltage of the associated device circuit 202). However, other values for the range are within the scope of the present disclosure.

Another example dimension D22, includes a spacing or distance between adjacent deep n-doped barrier regions 802 in the ESD triggering circuit 206. The example dimension D22 may correspond to a width of a portion 804 of the substrate 302 between the adjacent deep n-doped barrier regions 802. In some implementations, the example dimension D22 may be included in a range of approximately 0.5 microns to approximately 5 microns. If the example dimension D22 is less than approximately 0.5 microns, the breakdown voltage of the ESD triggering circuit 206 may be too low to enable high voltage operation of the associated device circuit 202 (e.g., less than the operating voltage of the associated device circuit 202) because breakdown of a PNP ESD triggering device 218 may occur between a p-doped well 304 of the PNP ESD triggering device 218 and a deep n-doped barrier region 802. If the example dimension D22 is greater than approximately 5 microns, the deep n-doped barrier regions 802 may not provide sufficient blocking of charge carrier migration into the substrate 302, resulting in reduced electrical isolation and reduced operating efficiency in the ESD triggering circuit 206. However, other values for the range are within the scope of the present disclosure.

FIG. 8C illustrates another example implementation 806 of an ESD triggering circuit 206 that may be included in a semiconductor device. As shown in FIG. 8C, the example implementation 504 of the ESD triggering circuit 206 may include a similar arrangement of layers and/or structures as the example implementation 328 of the ESD triggering circuit 206 illustrated and described in connection with FIG. 3C. For example, the example implementation 806 of the ESD triggering circuit 206 may include components 302-316 and 320-324. The example implementation 806 of the ESD triggering circuit 206 may further include a plurality of deep n-doped barrier regions 802. A deep n-doped barrier region 802 may be included below and/or under an n-doped barrier region 320, and may provide additional charge carrier migration blocking (e.g., in combination with the n-doped barrier region 320). Adjacent deep n-doped barrier regions 802 may be spaced apart or separated by portions 804 of the substrate 302 below and/or under the p-doped wells 304 of the p-doped collectors 224 of the ESD triggering circuit 206, thereby providing minimal decrease in breakdown voltage of the PNP ESD triggering devices 218 of the ESD triggering circuit 206. The portions 804 of the substrate 302 may be located below and/or under the portions 322 of the substrate 302 between adjacent n-doped barrier regions 320.

The deep n-doped barrier regions 802 may include a similar dopant concentration and dopant type as the n-doped barrier regions 320. The example implementation 806 of the ESD triggering circuit 206 may be formed by a similar set of semiconductor processing operations illustrated and described in connection with FIGS. 4A-4J and/or 7A-7C. The deep n-doped barrier regions 802 may be formed in the barrier layer formation operation, illustrated and described in connection with FIG. 7A, in place of the deep n-doped barrier layer 602. The deep-n-doped barrier regions 802 may be formed before or after the one or more barrier layer implantation operations, illustrated and described in connection with FIG. 4B and/or FIG. 7B, to form the n-doped barrier regions 320.

As indicated above, FIGS. 8A-8C are provided as examples. Other examples may differ from what is described with regard to FIGS. 8A-8C.

Figure 9A:
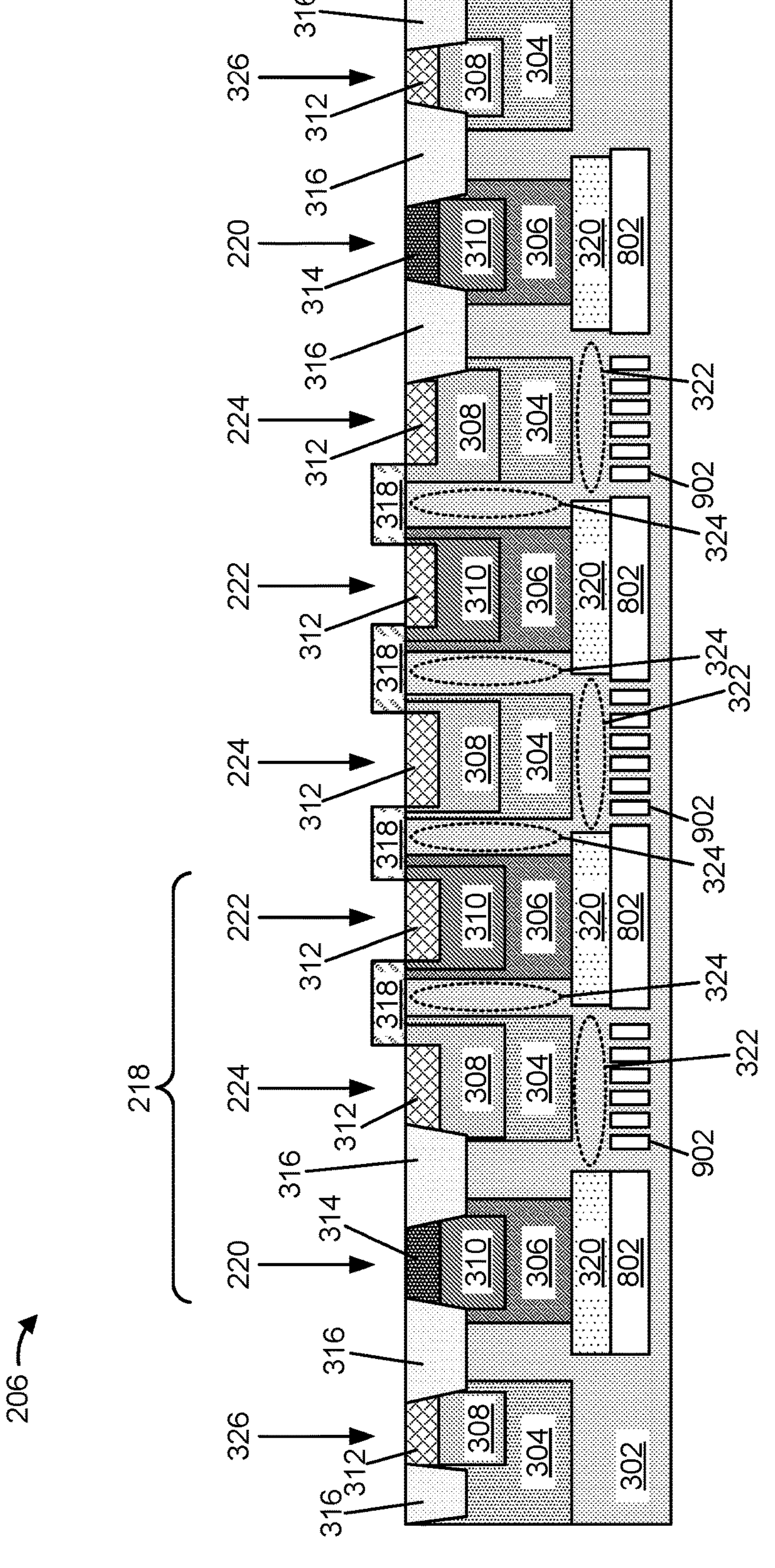
FIGS. 9A-9C are diagrams of example implementations of an ESD triggering circuit described herein.
Figure 9B:
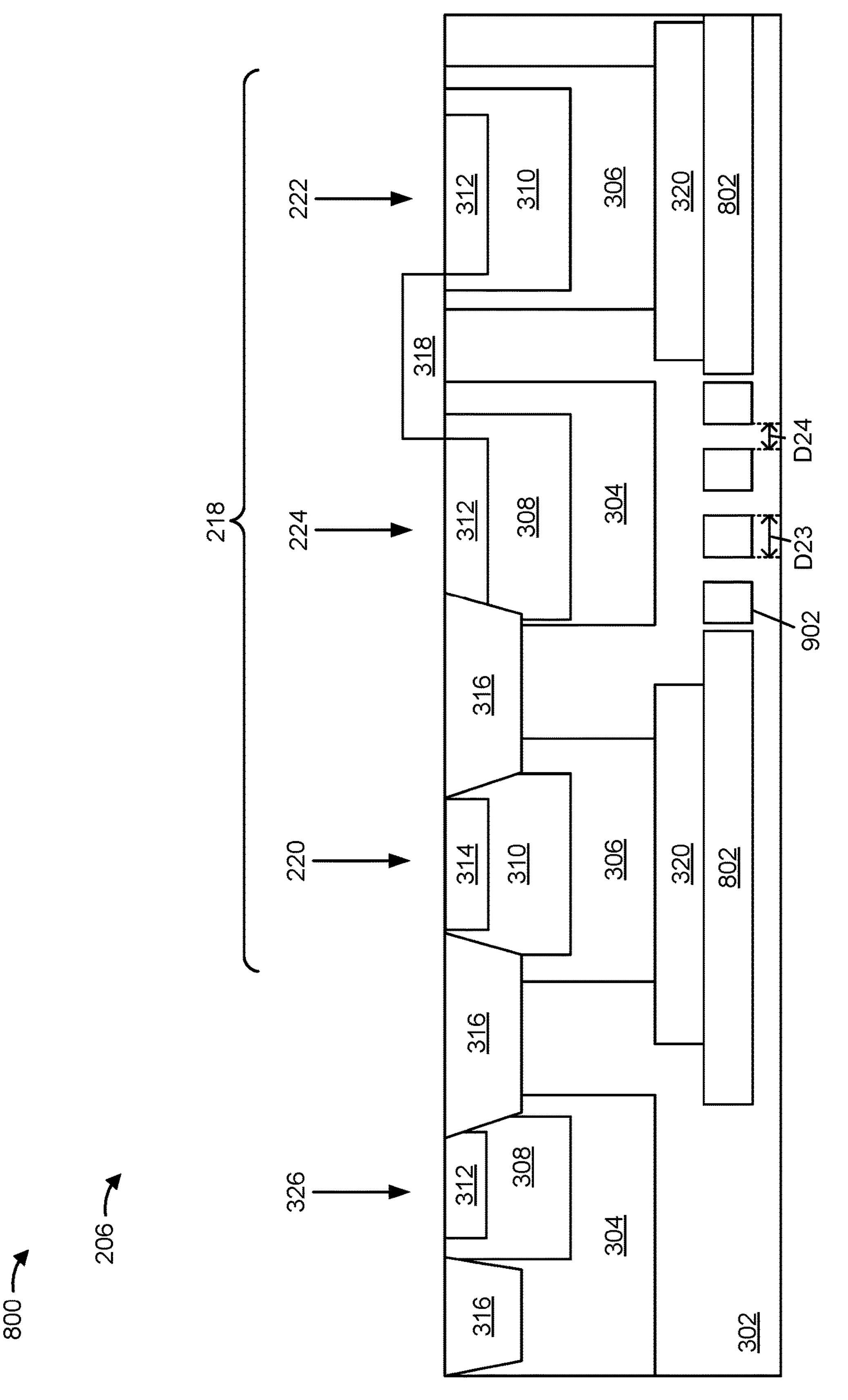
Figure 9C:
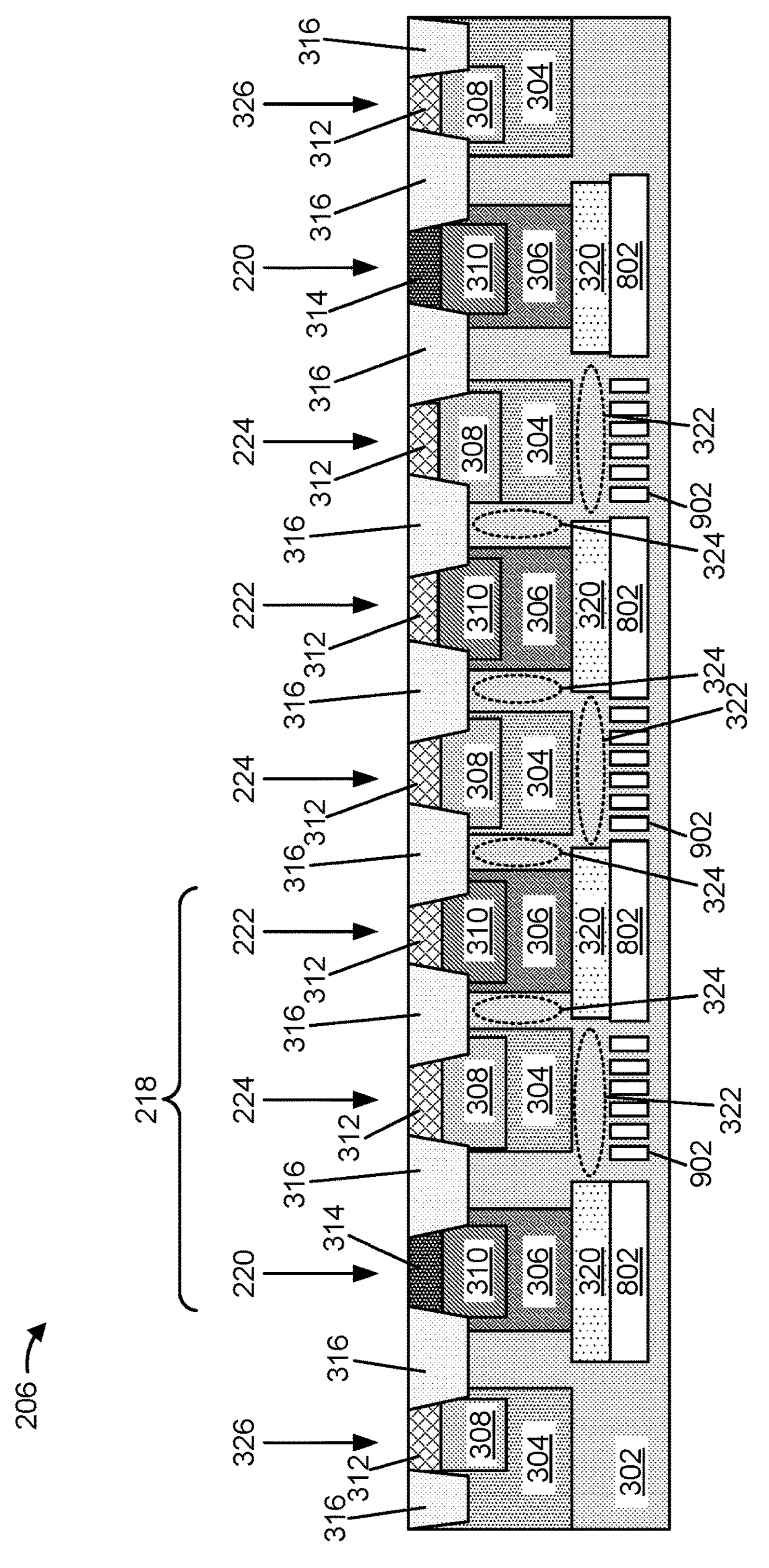

FIGS. 9A-9C are diagrams of example implementations of an ESD triggering circuit 206 described herein. The example implementations of the ESD triggering circuit 206 described in connection with FIGS. 9A-9C may be included in a semiconductor device, such as the semiconductor device 200, the semiconductor device 226, the semiconductor device 228, and/or another semiconductor device that includes high voltage devices.

FIGS. 9A and 9B illustrate an example implementation 900 of an ESD triggering circuit 206. As shown in FIG. 9A, the example implementation 900 of the ESD triggering circuit 206 may include a similar arrangement of layers and/or structures as the example implementation 800 of the ESD triggering circuit 206 illustrated and described in connection with FIGS. 8A and 8B. For example, the example implementation 900 of the ESD triggering circuit 206 may include components 302-324 and 802, except that deep n-doped barrier strips 902 are included in place of one or more of the portions 804 of the substrate 302 between adjacent deep n-doped barrier regions 802. The deep n-doped barrier strips 902 may be included under a p-doped well 304 of a p-doped collector 224 in a PNP ESD triggering device 218 of the ESD triggering circuit 206, and may provide additional charge carrier migration blocking (e.g., in combination with the n-doped barrier regions 320 and the deep n-doped barrier regions 802) with minimal decrease in breakdown voltage of the PNP ESD triggering device 218. In some implementations, the deep n-doped barrier strips 902 are omitted from under one or more terminals 326 of the ESD triggering circuit 206. In some implementations, the deep n-doped barrier strips 902 are include under the p-doped wells 304 of one or more terminals 326 of the ESD triggering circuit 206.

The deep n-doped barrier strips 902 include a similar dopant concentration and dopant type as the n-doped barrier regions 320 and/or the deep n-doped barrier regions 802. The example implementation 900 of the ESD triggering circuit 206 may be formed by a similar set of semiconductor processing operations illustrated and described in connection with FIGS. 4A-4J and/or 7A-7C. The deep n-doped barrier strips 902 may be formed as a part of the barrier layer implantation operation illustrated and described in connection with FIG. 7A.

FIG. 9B illustrates a plurality of example dimensions of the example implementation 900 of the ESD triggering circuit 206. In some implementations, one or more other example implementations of ESD protection circuits 206 described herein may include one or more of the dimensions illustrated and described in connection with FIG. 9B.

An example dimension D23, includes a width of a deep n-doped barrier strip 902 in the ESD triggering circuit 206. In some implementations, the example dimension D23 may be included in a range of approximately 0.2 microns to approximately 3 microns. If the example dimension D23 is less than approximately 0.2 microns, the deep n-doped barrier strips 902 may not provide sufficient blocking of charge carrier migration into the substrate 302, resulting in reduced electrical isolation and reduced operating efficiency in the ESD triggering circuit 206. If the example dimension D23 is greater than approximately 3 microns, the breakdown voltage of the ESD triggering circuit 206 may be too low to enable high voltage operation of the associated device circuit 202 (e.g., less than the operating voltage of the associated device circuit 202). However, other values for the range are within the scope of the present disclosure.

Another example dimension D24, includes a spacing between adjacent deep n-doped barrier strips 902 in the ESD triggering circuit 206. In some implementations, the example dimension D24 may be included in a range of approximately 0.2 microns to approximately 3 microns. If the example dimension D24 is less than approximately 0.2 microns, the breakdown voltage of the ESD triggering circuit 206 may be too low to enable high voltage operation of the associated device circuit 202 (e.g., less than the operating voltage of the associated device circuit 202). If the example dimension D24 is greater than approximately 3 microns, the deep n-doped barrier strips 902 may not provide sufficient blocking of charge carrier migration into the substrate 302, resulting in reduced electrical isolation and reduced operating efficiency in the ESD triggering circuit 206. However, other values for the range are within the scope of the present disclosure.

In some implementations, a quantity of the deep n-doped barrier strips 902, included under a particular p-doped well 304, may be included in a range of 2 to 10. If the quantity is less than 2, the deep n-doped barrier strips 902 may provide only minimal increase in electrical isolation. If the quantity is greater than 10, patterning the deep n-doped barrier strips 902 may increase the complexity of the implantation mask to form the deep n-doped barrier strips 902, which may result in an increased defect rate in the deep n-doped barrier strips 902.

FIG. 9C illustrates another example implementation 904 of an ESD triggering circuit 206 that may be included in a semiconductor device. As shown in FIG. 9C, the example implementation 904 of the ESD triggering circuit 206 may include a similar arrangement of layers and/or structures as the example implementation 806 of the ESD triggering circuit 206 illustrated and described in connection with FIG. 8C. For example, the example implementation 904 of the ESD triggering circuit 206 may include components 302-316, 320-324, and 802. The example implementation 904 of the ESD triggering circuit 206 may further include deep n-doped barrier strips 902 in place of the portions 804 of the substrate 302 between adjacent deep n-doped barrier regions 802. The deep n-doped barrier strips 902 may be included to provide additional charge carrier migration blocking (e.g., in combination with the n-doped barrier regions 320 and/or the deep n-doped barrier regions 802) with minimal decrease in breakdown voltage of the PNP ESD triggering device(s) 218 of the ESD triggering circuit 206.

The deep n-doped barrier strips 902 may include a similar dopant concentration and dopant type as the n-doped barrier regions 320 and/or the deep n-doped barrier regions 802. The example implementation 904 of the ESD triggering circuit 206 may be formed by a similar set of semiconductor processing operations illustrated and described in connection with FIGS. 4A-4J and/or 7A-7C. The deep n-doped barrier strips 902 may be formed as a part of the barrier layer implantation operation illustrated and described in connection with FIG. 7A.

As indicated above, FIGS. 9A-9C are provided as examples. Other examples may differ from what is described with regard to FIGS. 9A-9C.

FIGS. 10A-10F are diagrams of example implementations of an ESD triggering circuit 206 described herein. The example implementations of the ESD triggering circuit 206 described in connection with FIGS. 10A-10F may be included in a semiconductor device, such as the semiconductor device 200, the semiconductor device 226, the semiconductor device 228, and/or another semiconductor device that includes high voltage devices.

Figure 10A:
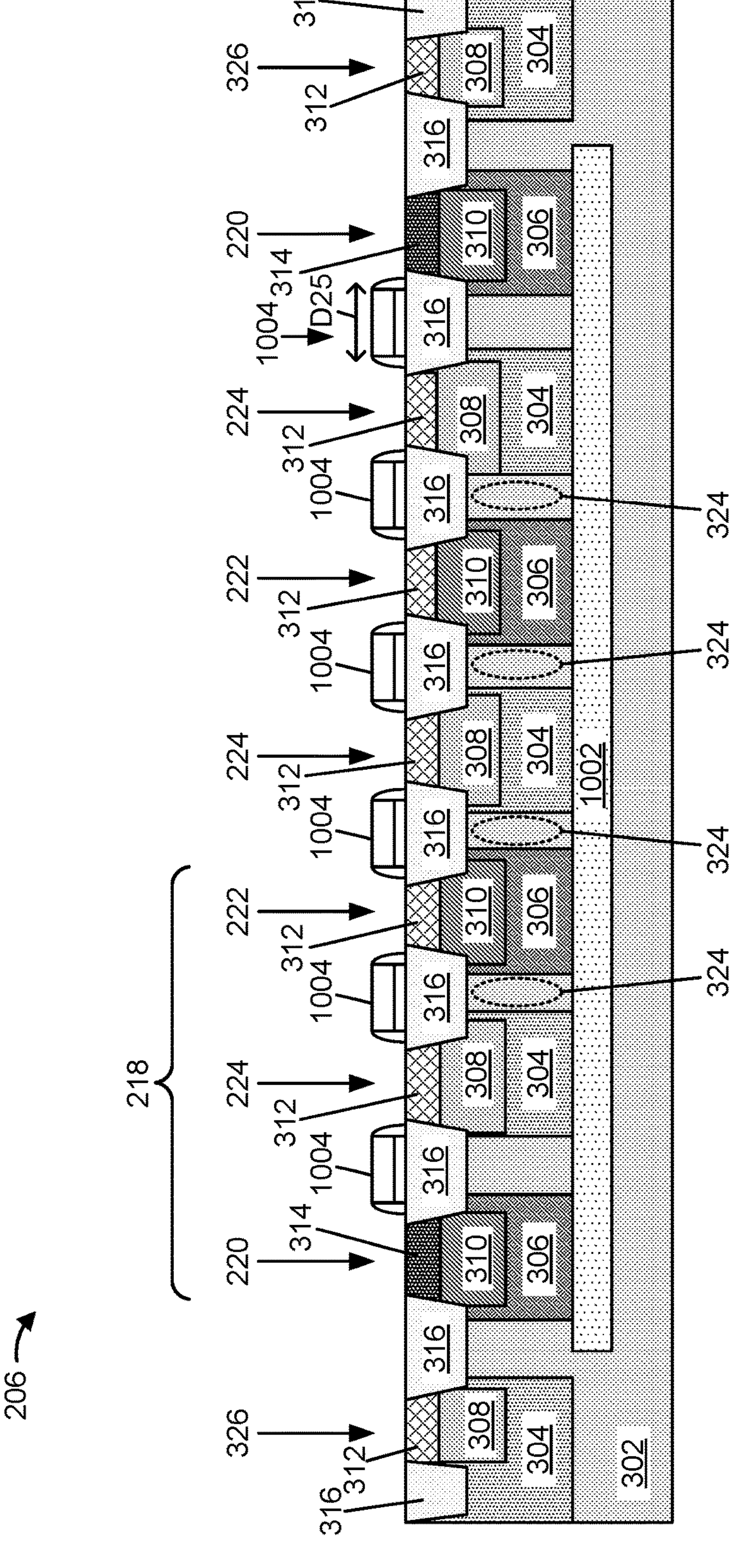
FIGS. 10A-10F are diagrams of example implementations of an ESD triggering circuit described herein.

FIG. 10A illustrates an example implementation 1000 of an ESD triggering circuit 206 that may be included in a semiconductor device. As shown in FIG. 10A, the example implementation 1000 of the ESD triggering circuit 206 may include a similar arrangement of layers and/or structures as the example implementation 328 of the ESD triggering circuit 206 illustrated and described in connection with FIG. 3C. For example, the example implementation 1000 of the ESD triggering circuit 206 may include components 302-316 and 324. However, in the example implementation 1000 of the ESD triggering circuit 206, the n-doped barrier regions 320 and the associated portions 322 of the substrate between the n-doped barrier regions 320 are omitted, and a n-doped barrier layer 1002 is instead included in the substrate 302 under the p-doped wells 304 and the n-doped wells 306.

The example implementation 1000 of the ESD triggering circuit 206 may further include field plate structures 1004 on one or more of the STI regions 316 included in the substrate. For example, a field plate structure 1004 may be include on an STI region 316 between an n-doped base 220 and a p-doped collector 224 of a PNP ESD triggering device 218 included in the ESD triggering circuit 206. As another example, a field plate structure 1004 may be included on an STI region 316 between the p-doped collector 224 and a p-doped emitter 222 of the PNP ESD triggering device 218.

The field plate structure(s) 1004 may be included to enable electric fields in the PNP ESD triggering device 218 to be controlled. The control over the electric fields in the PNP ESD triggering device 218 enables increased charge depletion to be achieved in the portions 324 of the substrate 302 (e.g., between the p-doped collector 224 and the p-doped emitter 222), which may enable a reduced surface electric field (RESURF) effect to be achieved in the portions 324 of the substrate 302. The RESURF effect may provide enhanced charge carrier mobility in the portions 324 of the substrate 302, which may further facilitate breakdown of the PNP ESD triggering device 218 between the p-doped collector 224 and the p-doped emitter 222, even with the use of the n-doped barrier layer 1002. A bias voltage may be applied to a field plate structure 1004 (e.g., through the n-doped base 220, through the p-doped emitter 222, through the p-doped collector 224, and/or through a terminal 326), which reduces the peek electric field strength in the substrate 302, thereby achieving the RESURF effect.

The n-doped barrier layer 1002 may include a similar dopant concentration and dopant type as the n-doped barrier regions 320. A field plate structure 1004 may include a polysilicon (PO) structure or another type of semiconductor structure. Additionally and/or alternatively, a field plate structure 1004 may include a metal field plate that includes one or more metals, such as copper (Cu), gold (Au), silver (Ag), nickel (Ni), tin (Sn), ruthenium (Ru), cobalt (Co), tungsten (W), titanium (Ti), one or more metals, one or more conductive ceramics, one or more metal alloys, and/or another type of electrically conductive material. A field plate structure 1004 may further include a dielectric layer, one or more sidewall spacers, and/or another type of electrically insulating layer or structure.

The example implementation 1000 of the ESD triggering circuit 206 may be formed by a similar set of semiconductor processing operations illustrated and described in connection with FIGS. 4A-4J and/or 7A-7C. The n-doped barrier layer 1002 may be formed in place of the n-doped barrier regions 320 as a part of the one or more barrier layer implantation operation illustrated and described in connection with FIGS. 4B and/or 7B.

In some implementations, the field plate structure(s) 1004 may be formed after the operations illustrated and described in connection with FIGS. 4D-4G and prior to the operations illustrated and described in connection with FIGS. 4H and 4I. In some implementations, the field plate structure(s) 1004 may be formed after the operations illustrated and described in connection with FIGS. 4I and/or 7C. In some implementations, the field plate structure(s) 1004 may be formed as part of a gate formation process of forming gate structures for the transistors 214 of the device circuit 202 of the semiconductor device. Forming the field plate structure (s) 1004 may include the deposition tool 102 and/or the plating tool 112 depositing one or more layers of material (e.g., polysilicon material, dielectric material, metal material). The deposition tool 102, the exposure tool 104, and/or the developer tool 106 may form one or more patterned layers or masking layers, and the etch tool 108 may use the more patterned layers or masking layers to etch the deposited layers to form the field plate structure(s) 1004.

As further shown in FIG. 10A an example dimension D25, includes a length of a field plate structure 1004. In some implementations, the example dimension D25 may be included in a range of approximately 0.1 microns to approximately 5 microns. If the example dimension D25 is less than approximately 0.1 microns, patterning the field plate structures 1004 may increase the complexity of the patterning masks used to form the field plate structures 1004, which may result in an increased defect rate in the field plate structures 1004. If the example dimension D25 is greater than approximately 3 microns, the breakdown voltage of the ESD triggering circuit 206 may be too low to enable high voltage operation of the associated device circuit 202 (e.g., less than the operating voltage of the associated device circuit 202). However, other values for the range are within the scope of the present disclosure.

Figure 10B:
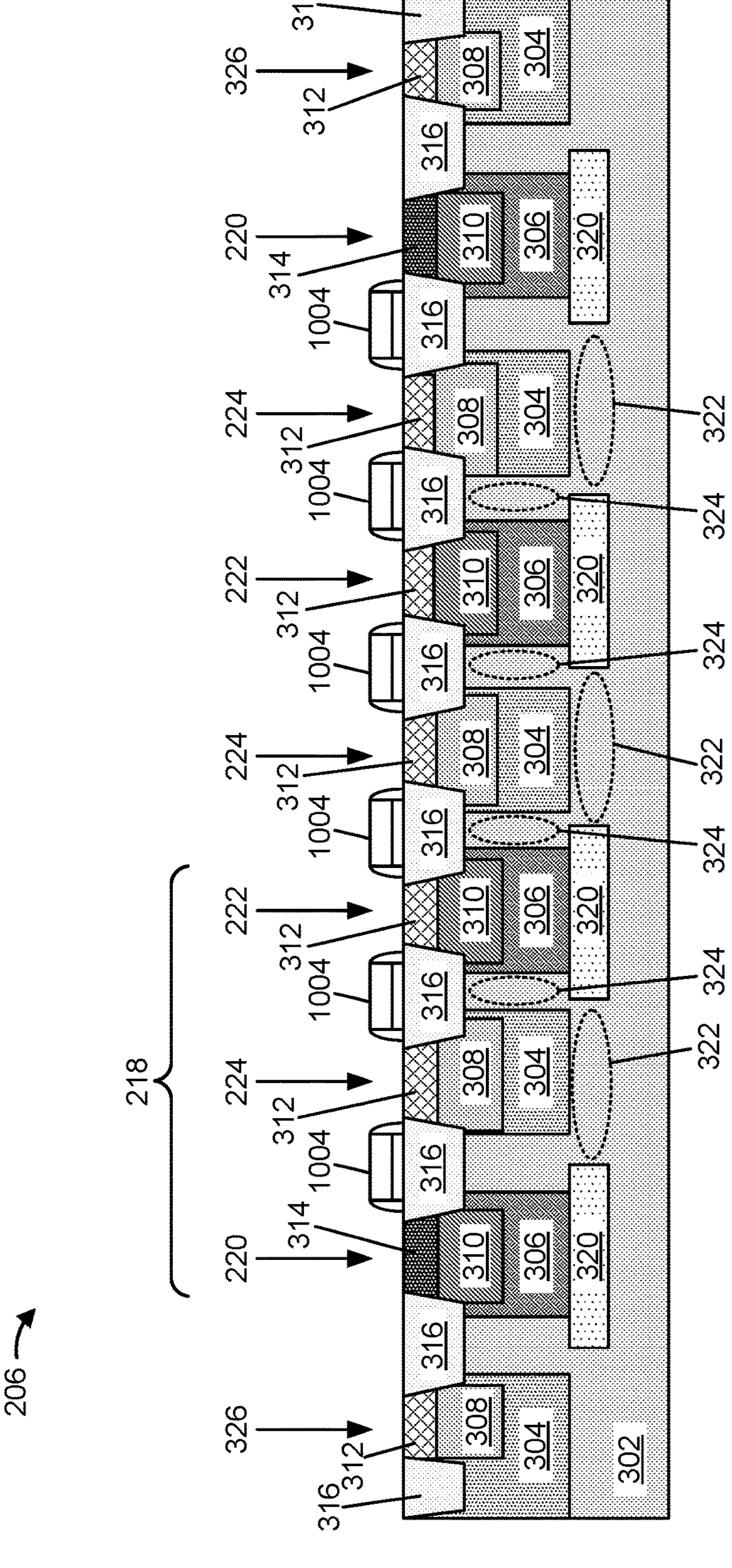

FIG. 10B illustrates an example implementation 1006 of an ESD triggering circuit 206 that may be included in a semiconductor device. As shown in FIG. 10B, the example implementation 1006 of the ESD triggering circuit 206 may include a similar arrangement of layers and/or structures as the example implementation 1000 of the ESD triggering circuit 206 illustrated and described in connection with FIG. 10A. For example, the example implementation 1006 of the ESD triggering circuit 206 may include components 302-316, 324, and 1004. However, in the example implementation 1006 of the ESD triggering circuit 206, the n-doped barrier regions 320 and the associated portions 322 of the substrate 302 between the n-doped barrier regions 320 are included instead of the n-doped barrier layer 1002 to further facilitate breakdown of the PNP ESD triggering device 218 between the p-doped collector 224 and the p-doped emitter 222. The n-doped barrier regions 320 may be included under one or more of the n-doped wells 306 in the ESD triggering circuit 206.

Figure 10C:
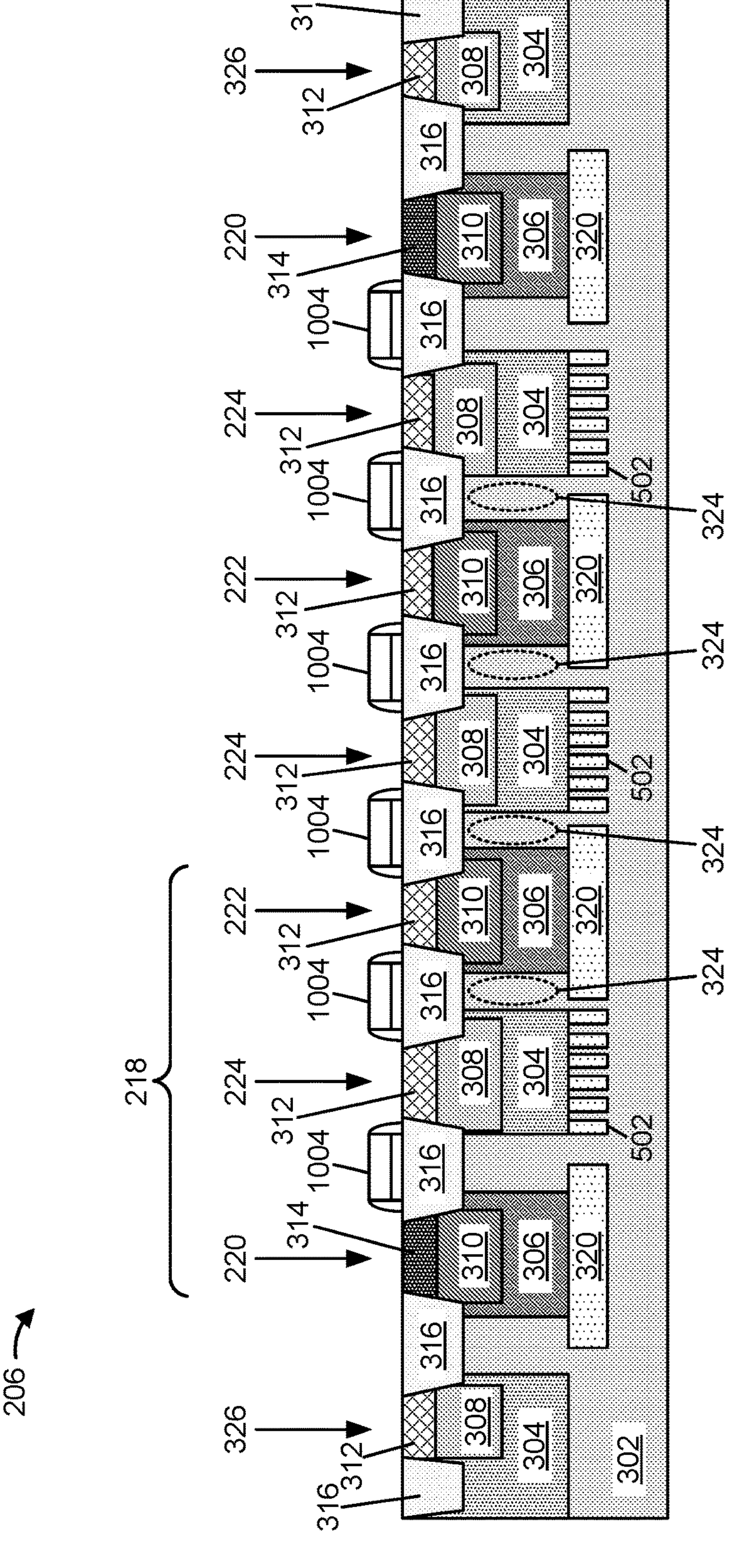

FIG. 10C illustrates an example implementation 1008 of an ESD triggering circuit 206 that may be included in a semiconductor device. As shown in FIG. 10C, the example implementation 1008 of the ESD triggering circuit 206 may include a similar arrangement of layers and/or structures as the example implementation 1006 of the ESD triggering circuit 206 illustrated and described in connection with FIG. 10B. For example, the example implementation 1008 of the ESD triggering circuit 206 may include components 302-316, 324, and 1004. However, in the example implementation 1008 of the ESD triggering circuit 206, n-doped barrier strips 502 are included in the portions 322 of the substrate 302 between adjacent n-doped barrier regions 320. The n-doped barrier strips 502 may be included to provide additional charge carrier migration blocking (e.g., in combination with the n-doped barrier regions 320) with minimal decrease in breakdown voltage of the PNP ESD triggering device(s) 218 of the ESD triggering circuit 206.

Figure 10D:
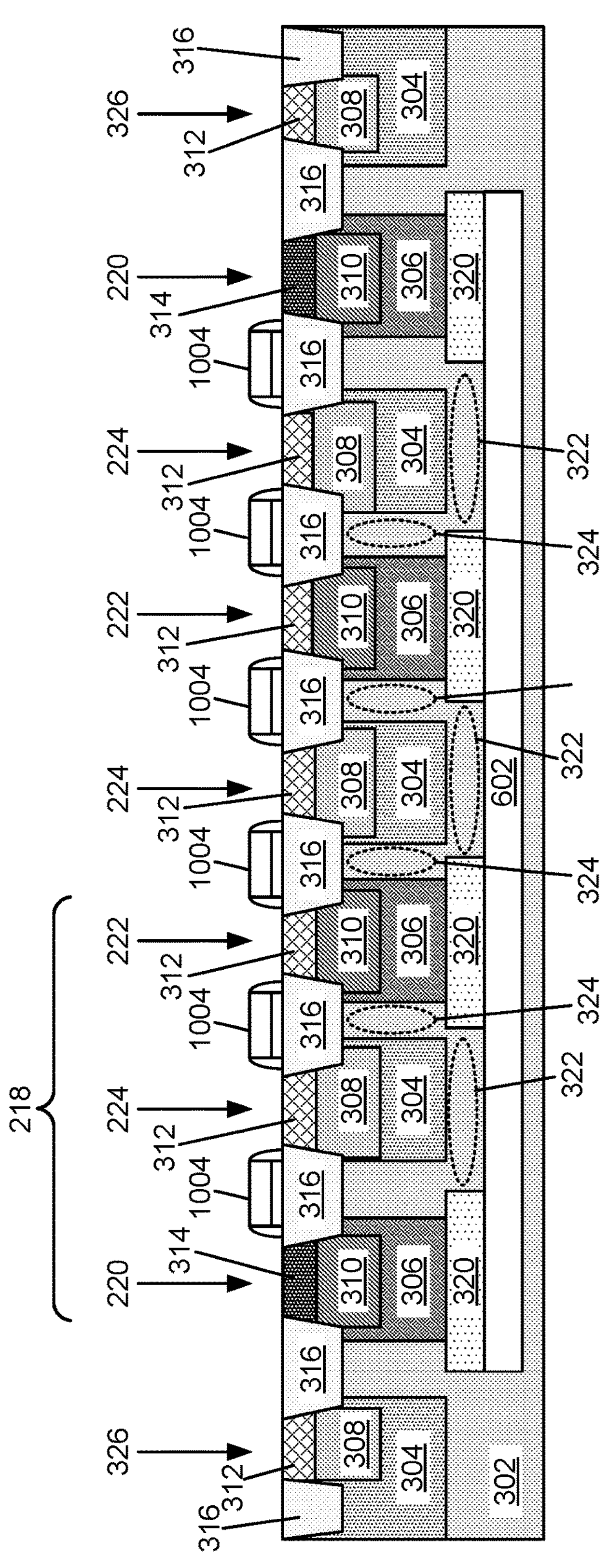

FIG. 10D illustrates an example implementation 1010 of an ESD triggering circuit 206 that may be included in a semiconductor device. As shown in FIG. 10D, the example implementation 1010 of the ESD triggering circuit 206 may include a similar arrangement of layers and/or structures as the example implementation 1006 of the ESD triggering circuit 206 illustrated and described in connection with FIG. 10B. For example, the example implementation 1010 of the ESD triggering circuit 206 may include components 302-316, 320-324, and 1004. However, in the example implementation 1010 of the ESD triggering circuit 206, a deep n-doped barrier layer 602 is included under the n-doped barrier regions 320. The deep n-doped barrier layer 602 may be included to provide additional charge carrier migration blocking (e.g., in combination with the n-doped barrier regions 320) with minimal decrease in breakdown voltage of the PNP ESD triggering device(s) 218 of the ESD triggering circuit 206.

Figure 10E:
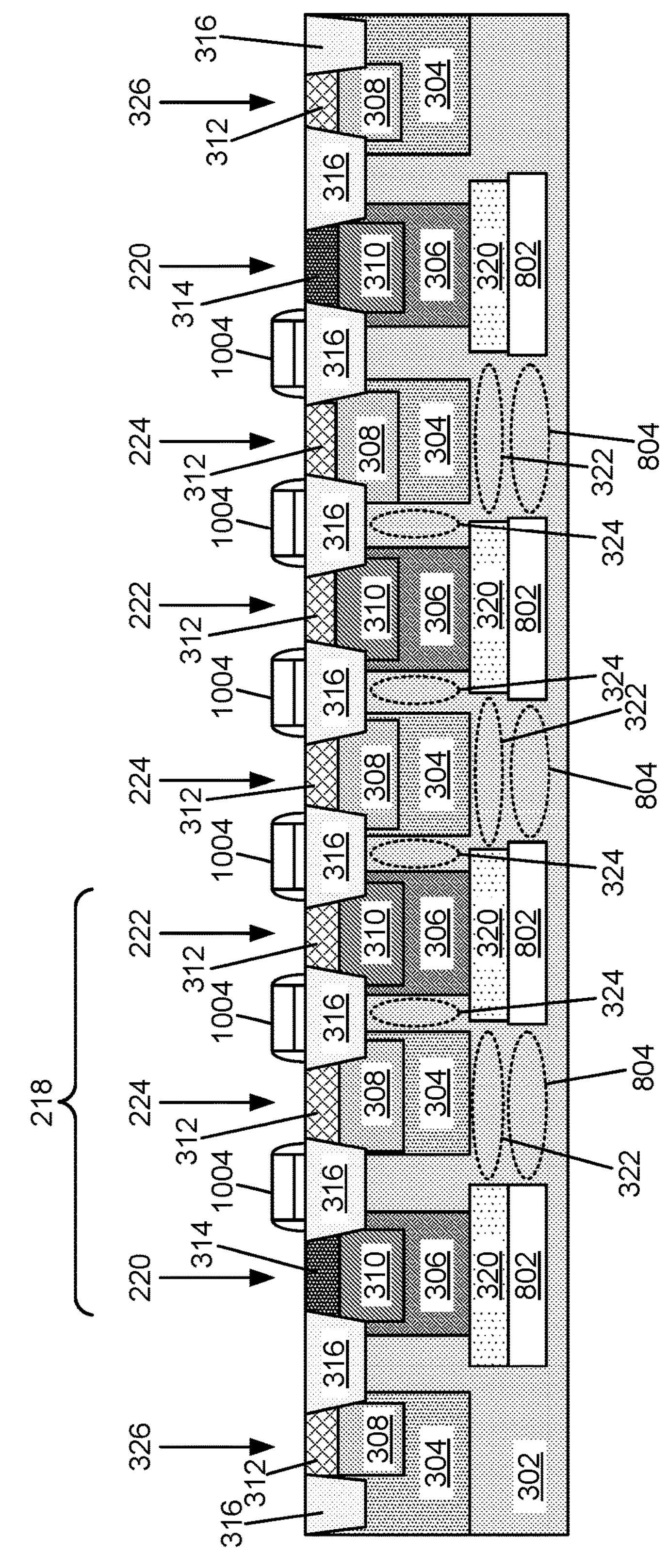

FIG. 10E illustrates an example implementation 1012 of an ESD triggering circuit 206 that may be included in a semiconductor device. As shown in FIG. 10E, the example implementation 1012 of the ESD triggering circuit 206 may include a similar arrangement of layers and/or structures as the example implementation 1006 of the ESD triggering circuit 206 illustrated and described in connection with FIG. 10B. For example, the example implementation 1010 of the ESD triggering circuit 206 may include components 302-316, 320-324, and 1004. However, in the example implementation 1012 of the ESD triggering circuit 206, deep n-doped barrier regions 802 are included under the n-doped barrier regions 320. The deep n-doped barrier regions 802 may be included to provide additional charge carrier migration blocking (e.g., in combination with the n-doped barrier regions 320). Adjacent deep n-doped barrier regions 802 may be spaced apart or separated by portions 804 of the substrate 302 below and/or under the p-doped wells 304 of the p-doped collectors 224 of the ESD triggering circuit 206, thereby providing minimal decrease in breakdown voltage of the PNP ESD triggering devices 218 of the ESD triggering circuit 206. The portions 804 of the substrate 302 may be located below and/or under the portions 322 of the substrate 302 between adjacent n-doped barrier regions 320.

Figure 10F:
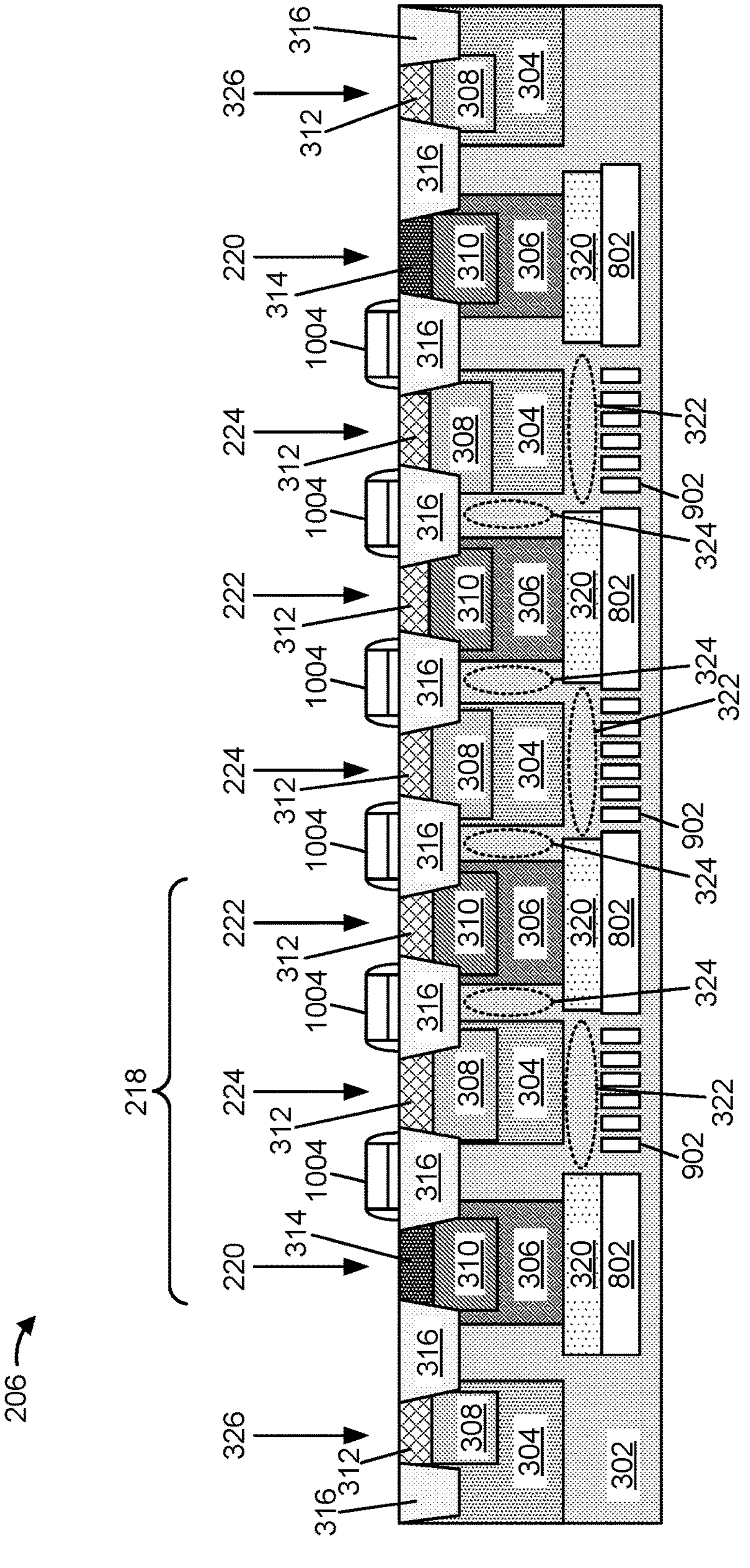

FIG. 10F illustrates an example implementation 1014 of an ESD triggering circuit 206 that may be included in a semiconductor device. As shown in FIG. 10F, the example implementation 1014 of the ESD triggering circuit 206 may include a similar arrangement of layers and/or structures as the example implementation 1012 of the ESD triggering circuit 206 illustrated and described in connection with FIG. 10E. For example, the example implementation 1014 of the ESD triggering circuit 206 may include components 302-316, 320-324, 802 and 1004. However, in the example implementation 1014 of the ESD triggering circuit 206, deep n-doped barrier strips 902 are included in place of the portions 804 of the substrate 302 between adjacent deep n-doped barrier regions 802. The deep n-doped barrier strips 902 may be included to provide additional charge carrier migration blocking (e.g., in combination with the n-doped barrier regions 320) with minimal decrease in breakdown voltage of the PNP ESD triggering devices 218 of the ESD triggering circuit 206.

As indicated above, FIGS. 10A-10F are provided as examples. Other examples may differ from what is described with regard to FIGS. 10A-10F.

FIGS. 11A-11K are diagrams of example implementations of an ESD triggering circuit 206 described herein. The example implementations of the ESD triggering circuit 206 described in connection with FIGS. 11A-11K may be included in a semiconductor device, such as the semiconductor device 200, the semiconductor device 226, the semiconductor device 228, and/or another semiconductor device that includes high voltage devices.

Figure 11A:
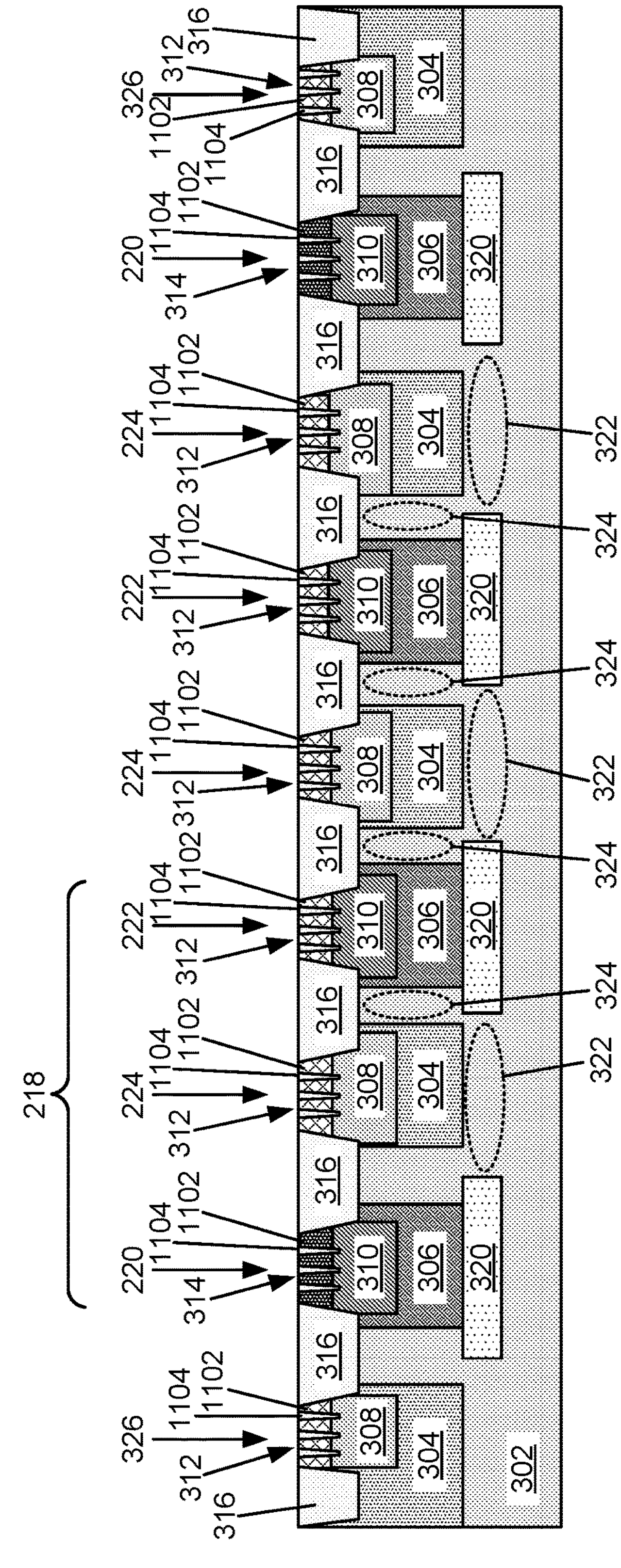
FIGS. 11A-11K are diagrams of example implementations of an ESD triggering circuit described herein.

FIG. 11A illustrates an example implementation 1100 of an ESD triggering circuit 206 that may be included in a semiconductor device. As shown in FIG. 11A, the example implementation 1100 of the ESD triggering circuit 206 may include a similar arrangement of layers and/or structures as the example implementation 328 of the ESD triggering circuit 206 illustrated and described in connection with FIG. 3C. For example, the example implementation 1100 of the ESD triggering circuit 206 may include components 302-316 and 320-324. However, in the example implementation 1100 of the ESD triggering circuit 206, fin-shaped structures 1102 are included in an n-doped base 220, in a p-doped emitter 222, and/or in a p-doped collector 224 of a PNP ESD triggering device 218 in the ESD triggering circuit 206. STI strips 1104 may be included between adjacent fin-shaped structures 1102. The fin-shaped structures 1102 and associated STI strips 1104 may enable even lower on resistance ($R_{on}$) to be achieved for the PNP ESD triggering device(s) 218 included in the ESD triggering circuit 206. Moreover, if the transistors 214 in the device circuit 202 of the semiconductor device are implemented as high voltage finFETs, the operations for forming the fin-shaped structures 1102 may be integrated into the fin formation process for forming the fin structures of the high voltage finFETs, thereby minimizing the process complexity for forming the fin-shaped structures 1102 and the associated STI strips 1104.

In some implementations, a plurality of fin-shaped structures 1104 may be included in an n-doped base 220 of a PNP ESD triggering device 218. The plurality of fin-shaped structures 1104 and the associated STI strips 1104 may extend from a top surface of the substrate 302 through the n+ region 314 of the n-doped base 220, and into a portion of an n+ region 310 of the n-doped base 220. In some implementations, a plurality of fin-shaped structures 1104 may be included in a p-doped emitter 222 of a PNP ESD triggering device 218. The plurality of fin-shaped structures 1104 and the associated STI strips 1104 may extend from a top surface of the substrate 302 through the p+ region 312 of the p-doped emitter 222, and into a portion of an n+ region 310 of the p-doped emitter 222. In some implementations, a plurality of fin-shaped structures 1104 may be included in a p-doped collector 224 of a PNP ESD triggering device 218. The plurality of fin-shaped structures 1104 and the associated STI strips 1104 may extend from a top surface of the substrate 302 through the p+ region 312 of the p-doped collector 224, and into a portion of a p+ region 308 of the p-doped collector 224.

The example implementation 1100 of the ESD triggering circuit 206 may be formed by a similar set of semiconductor processing operations illustrated and described in connection with FIGS. 4A-4J and/or 7A-7C. In some implementations, the fin-shaped structures 1104 may be formed during an operation domain (OD) definition process for forming the fin structures of the transistors 214 of the device circuit 202. The STI strips 1104 may be formed as part of the STI formation process for forming the STI regions 316, during which the STI regions of the transistors 214 may also be formed. Accordingly, the fin-shaped structures 1104 may be formed after the operations illustrated and described in connection with FIGS. 4A, 4B, and/or 7A. The STI strips 1104 may be formed as part of the STI formation operation described in connection with FIG. 4C.

Forming the fin-shaped structures 1102 may include the deposition tool 102, the exposure tool 104, and/or the developer tool 106 may form one or more patterned layers or masking layers on the substrate 302, and the etch tool 108 may use the more patterned layers or masking layers to etch the substrate 302 to form the fin-shaped structures 1102. The deposition tool 102 may then deposit the dielectric material of the STI strips 1104 in the recesses formed during the fin-shaped structure formation operation.

Figure 11B:
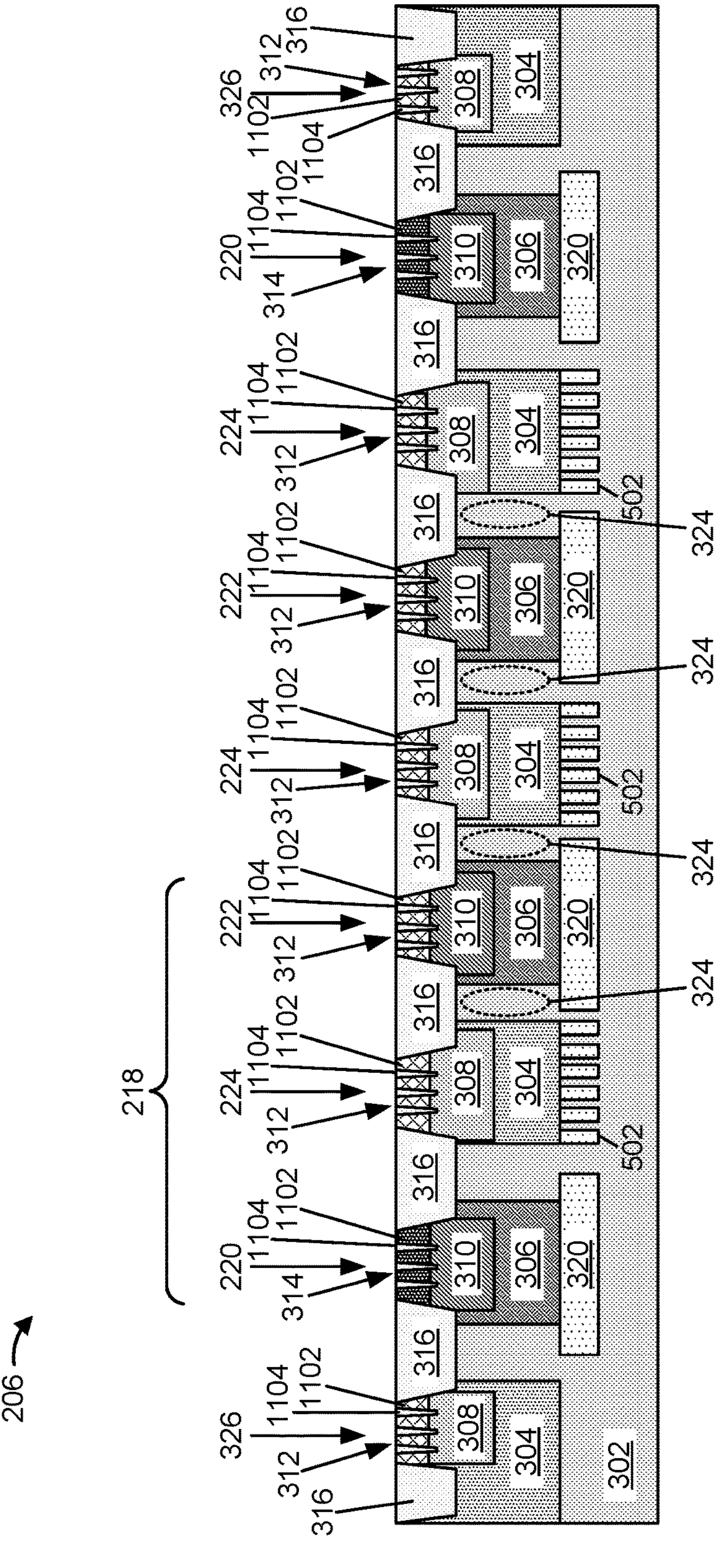

FIG. 11B illustrates an example implementation 1106 of an ESD triggering circuit 206 that may be included in a semiconductor device. As shown in FIG. 11B, the example implementation 1008 of the ESD triggering circuit 206 may include a similar arrangement of layers and/or structures as the example implementation 1100 of the ESD triggering circuit 206 illustrated and described in connection with FIG. 11A. For example, the example implementation 1106 of the ESD triggering circuit 206 may include components 302-316, 320, 324, 1102, and 1104. However, in the example implementation 1106 of the ESD triggering circuit 206, n-doped barrier strips 502 are included in the portions 322 of the substrate 302 between adjacent n-doped barrier regions 320. The n-doped barrier strips 502 may be included to provide additional charge carrier migration blocking (e.g., in combination with the n-doped barrier regions 320) with minimal decrease in breakdown voltage of the PNP ESD triggering device(s) 218 of the ESD triggering circuit 206.

Figure 11C:
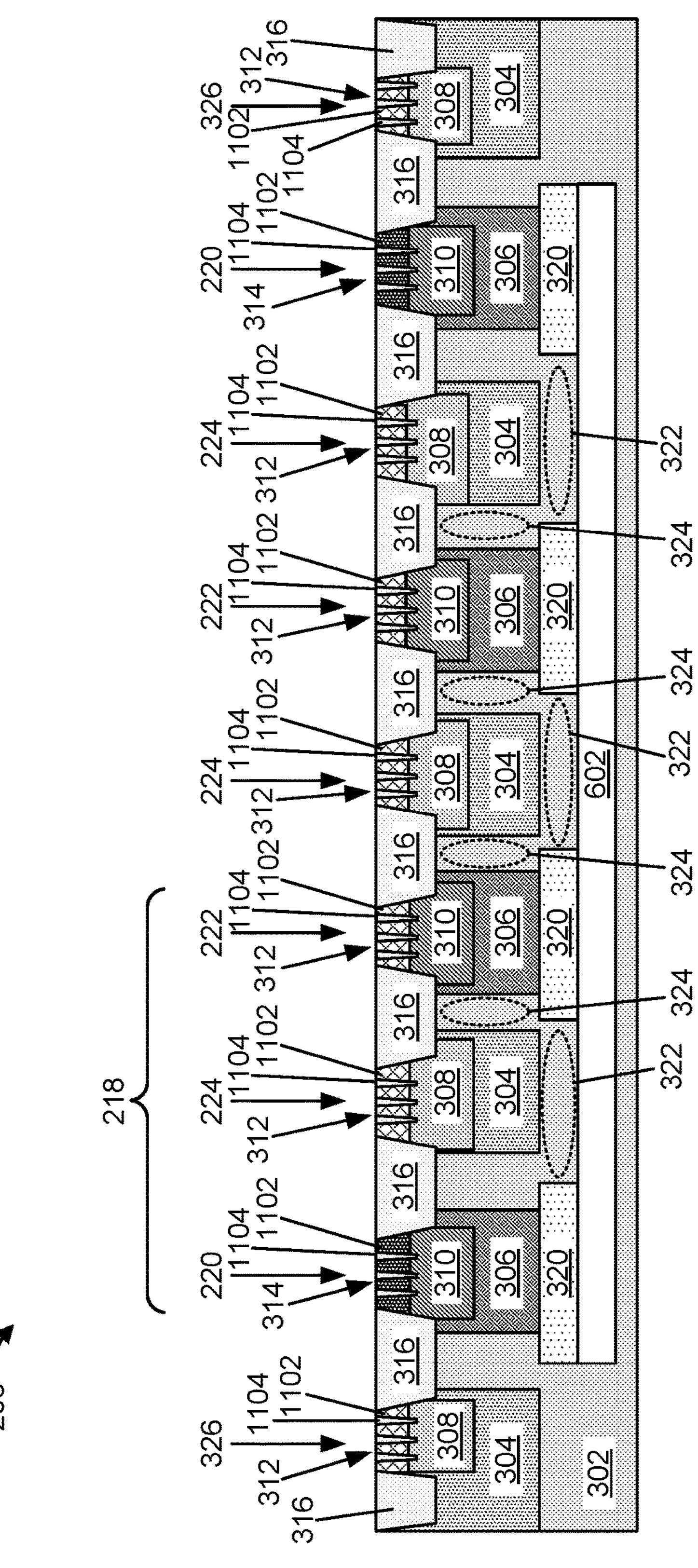

FIG. 11C illustrates an example implementation 1108 of an ESD triggering circuit 206 that may be included in a semiconductor device. As shown in FIG. 11C, the example implementation 1108 of the ESD triggering circuit 206 may include a similar arrangement of layers and/or structures as the example implementation 1100 of the ESD triggering circuit 206 illustrated and described in connection with FIG. 10A. For example, the example implementation 1108 of the ESD triggering circuit 206 may include components 302-316, 320-324, 1102, and 1104. However, in the example implementation 1108 of the ESD triggering circuit 206, a deep n-doped barrier layer 602 is included under the n-doped barrier regions 320. The deep n-doped barrier layer 602 may be included to provide additional charge carrier migration blocking (e.g., in combination with the n-doped barrier regions 320) with minimal decrease in breakdown voltage of the PNP ESD triggering device(s) 218 of the ESD triggering circuit 206.

Figure 11D:
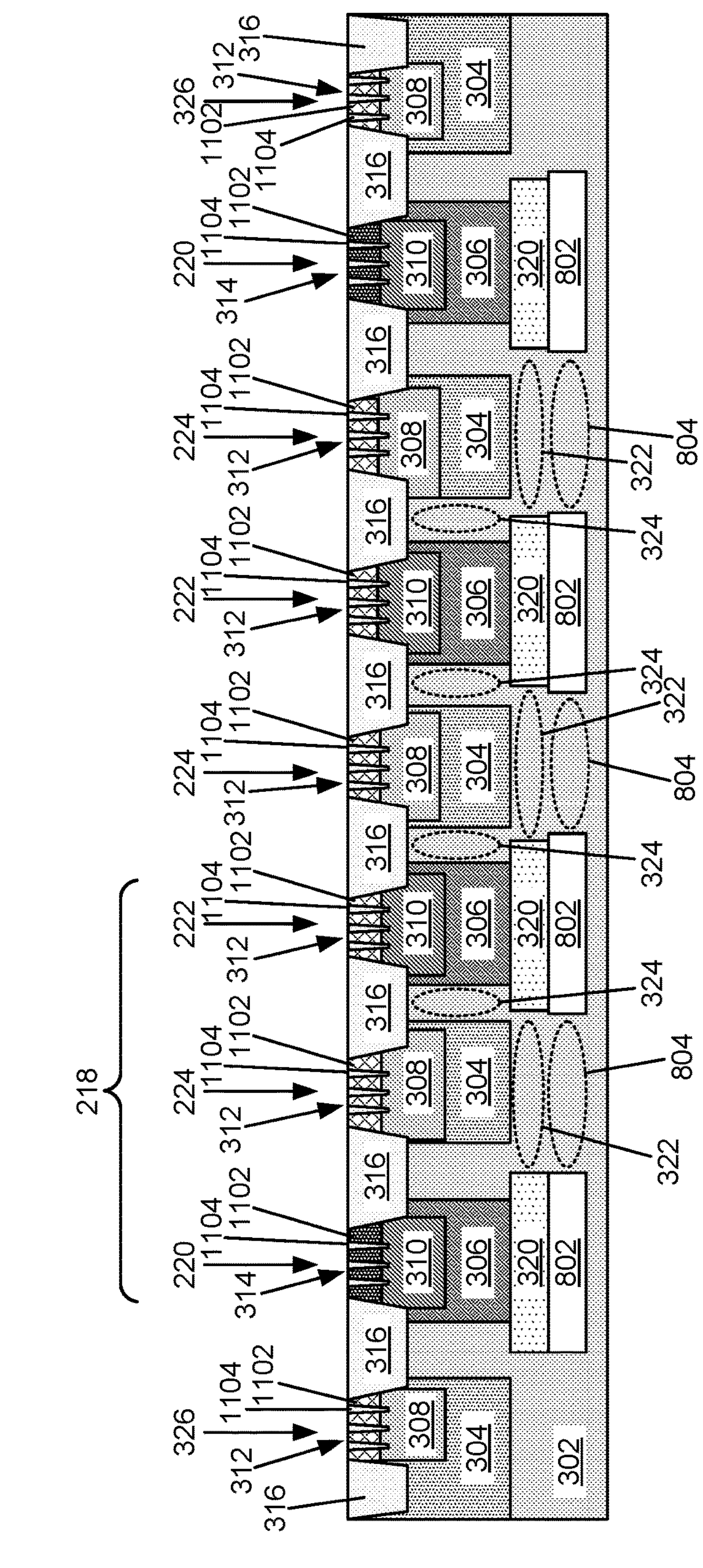

FIG. 11D illustrates an example implementation 1110 of an ESD triggering circuit 206 that may be included in a semiconductor device. As shown in FIG. 11D, the example implementation 1110 of the ESD triggering circuit 206 may include a similar arrangement of layers and/or structures as the example implementation 1100 of the ESD triggering circuit 206 illustrated and described in connection with FIG. 11A. For example, the example implementation 1110 of the ESD triggering circuit 206 may include components 302-316, 320-324, 1102, and 1104. However, in the example implementation 1110 of the ESD triggering circuit 206, deep n-doped barrier regions 802 are included under the n-doped barrier regions 320. The deep n-doped barrier regions 802 may be included to provide additional charge carrier migration blocking (e.g., in combination with the n-doped barrier regions 320). Adjacent deep n-doped barrier regions 802 may be spaced apart or separated by portions 804 of the substrate 302 below and/or under the p-doped wells 304 of the p-doped collectors 224 of the ESD triggering circuit 206, thereby providing minimal decrease in breakdown voltage of the PNP ESD triggering devices 218 of the ESD triggering circuit 206. The portions 804 of the substrate 302 may be located below and/or under the portions 322 of the substrate 302 between adjacent n-doped barrier regions 320.

Figure 11E:
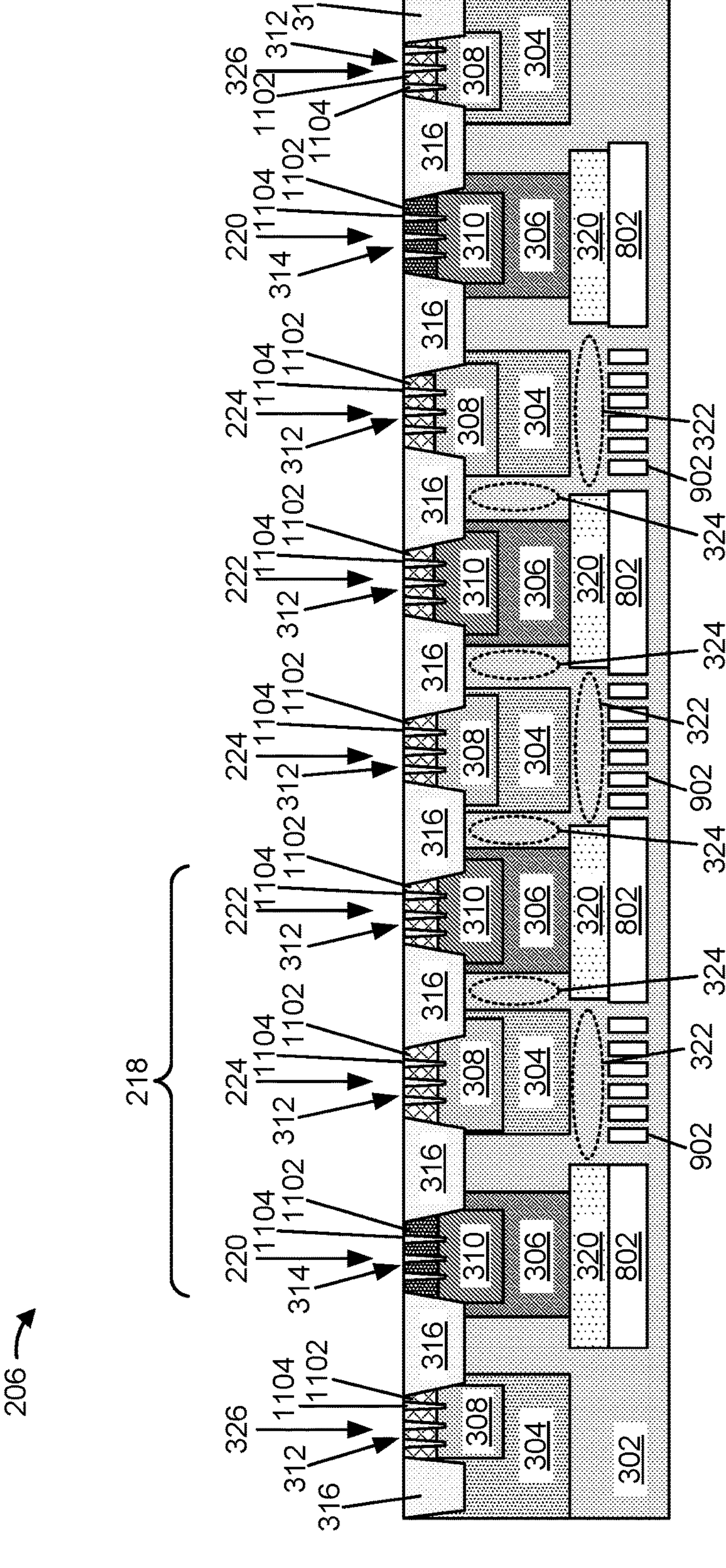

FIG. 11E illustrates an example implementation 1112 of an ESD triggering circuit 206 that may be included in a semiconductor device. As shown in FIG. 11E, the example implementation 1112 of the ESD triggering circuit 206 may include a similar arrangement of layers and/or structures as the example implementation 1110 of the ESD triggering circuit 206 illustrated and described in connection with FIG. 11D. For example, the example implementation 1112 of the ESD triggering circuit 206 may include components 302-

316, 320-324, 802, 1102, and 1104. However, in the example implementation 1112 of the ESD triggering circuit 206, deep n-doped barrier strips 902 are included in place of the portions 804 of the substrate 302 between adjacent deep n-doped barrier regions 802. The deep n-doped barrier strips 902 may be included to provide additional charge carrier migration blocking (e.g., in combination with the n-doped barrier regions 320) with minimal decrease in breakdown voltage of the PNP ESD triggering devices 218 of the ESD triggering circuit 206.

Figure 11F:
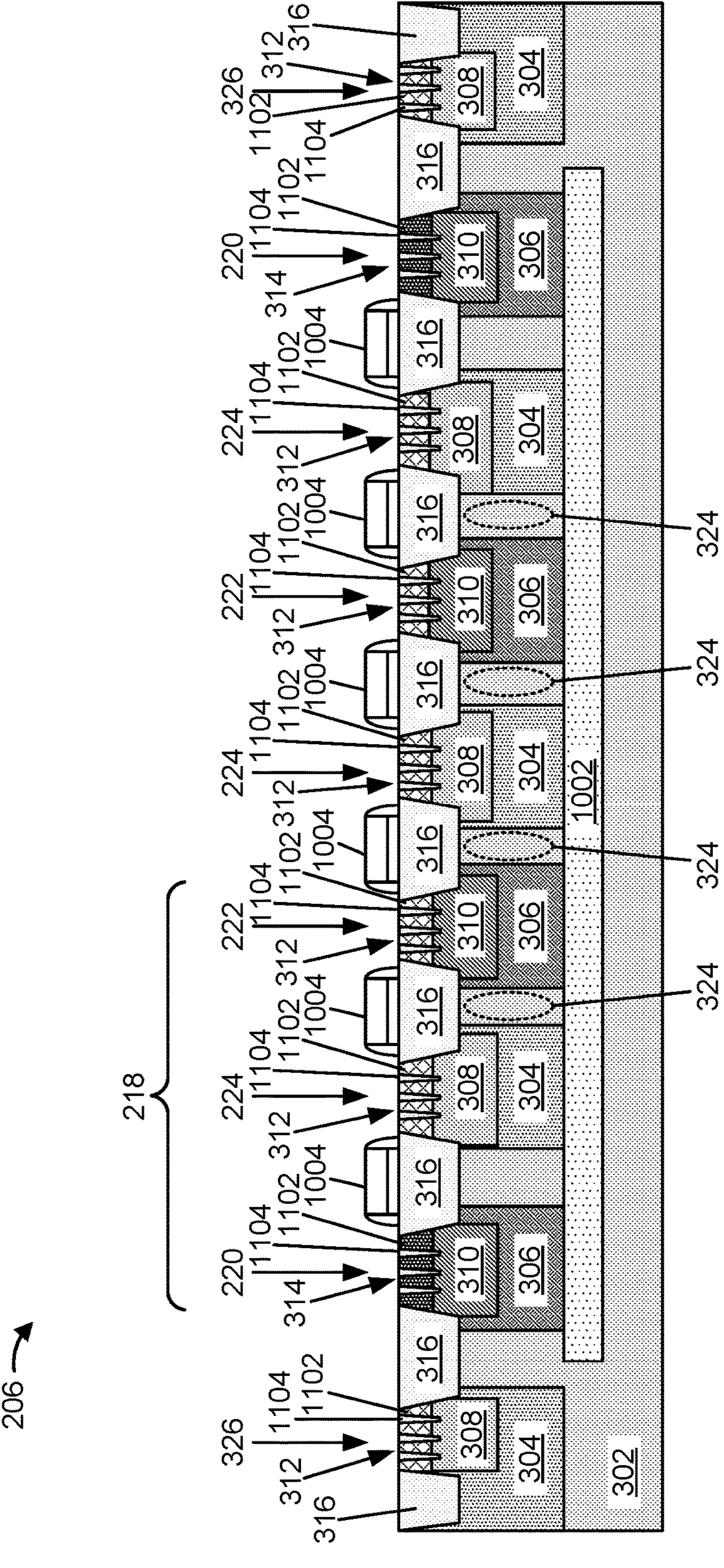

FIG. 11F illustrates an example implementation 1114 of an ESD triggering circuit 206 that may be included in a semiconductor device. As shown in FIG. 11F, the example implementation 1114 of the ESD triggering circuit 206 may include a similar arrangement of layers and/or structures as the example implementation 1000 of the ESD triggering circuit 206 illustrated and described in connection with FIG. 10A. For example, the example implementation 1114 of the ESD triggering circuit 206 may include components 302-316, 324, 1002, and 1004. However, in the example implementation 1114 of the ESD triggering circuit 206, fin-shaped structures 1102 are included in an n-doped base 220, in a p-doped emitter 222, and/or in a p-doped collector 224 of a PNP ESD triggering device 218 in the ESD triggering circuit 206. STI strips 1104 may be included between adjacent fin-shaped structures 1102. The fin-shaped structures 1102 and associated STI strips 1104 may enable even lower on resistance ($R_{on}$) to be achieved for the PNP ESD triggering device(s) 218 included in the ESD triggering circuit 206. Moreover, if the transistors 214 in the device circuit 202 of the semiconductor device are implemented as high voltage finFETs, the operations for forming the fin-shaped structures 1102 may be integrated into the fin formation process for forming the fin structures of the high voltage finFETs, thereby minimizing the process complexity for forming the fin-shaped structures 1102 and the associated STI strips 1104.

Figure 11G:
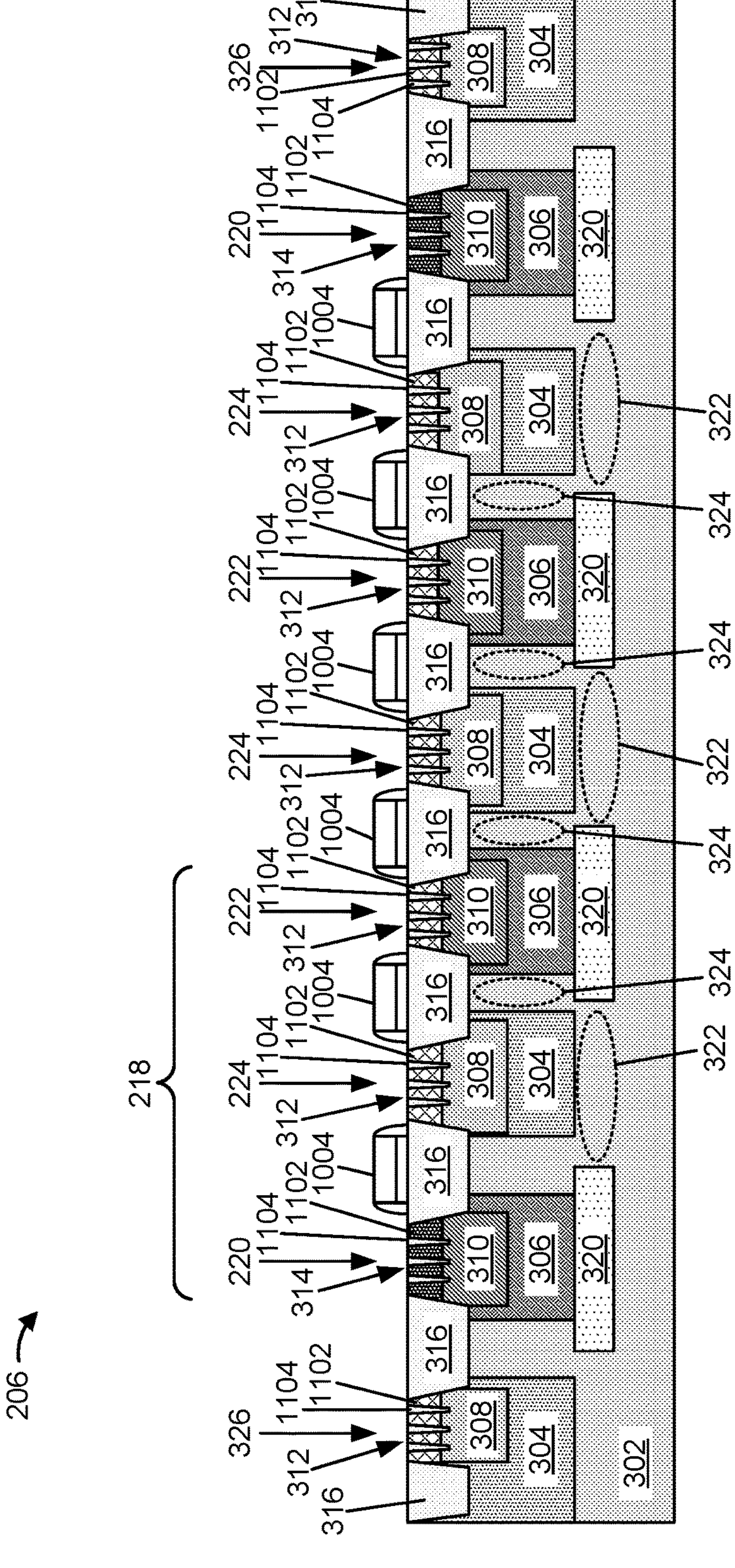

FIG. 11G illustrates an example implementation 1116 of an ESD triggering circuit 206 that may be included in a semiconductor device. As shown in FIG. 11G, the example implementation 1116 of the ESD triggering circuit 206 may include a similar arrangement of layers and/or structures as the example implementation 1114 of the ESD triggering circuit 206 illustrated and described in connection with FIG. 11F. For example, the example implementation 1116 of the ESD triggering circuit 206 may include components 302-316, 324, 1004, 1102, and 1104. However, in the example implementation 1116 of the ESD triggering circuit 206, the n-doped barrier regions 320 and the associated portions 322 of the substrate 302 between the n-doped barrier regions 320 are included instead of the n-doped barrier layer 1002 to further facilitate breakdown of the PNP ESD triggering device 218 between the p-doped collector 224 and the p-doped emitter 222. The n-doped barrier regions 320 may be included under one or more of the n-doped wells 306 in the ESD triggering circuit 206.

Figure 11H:
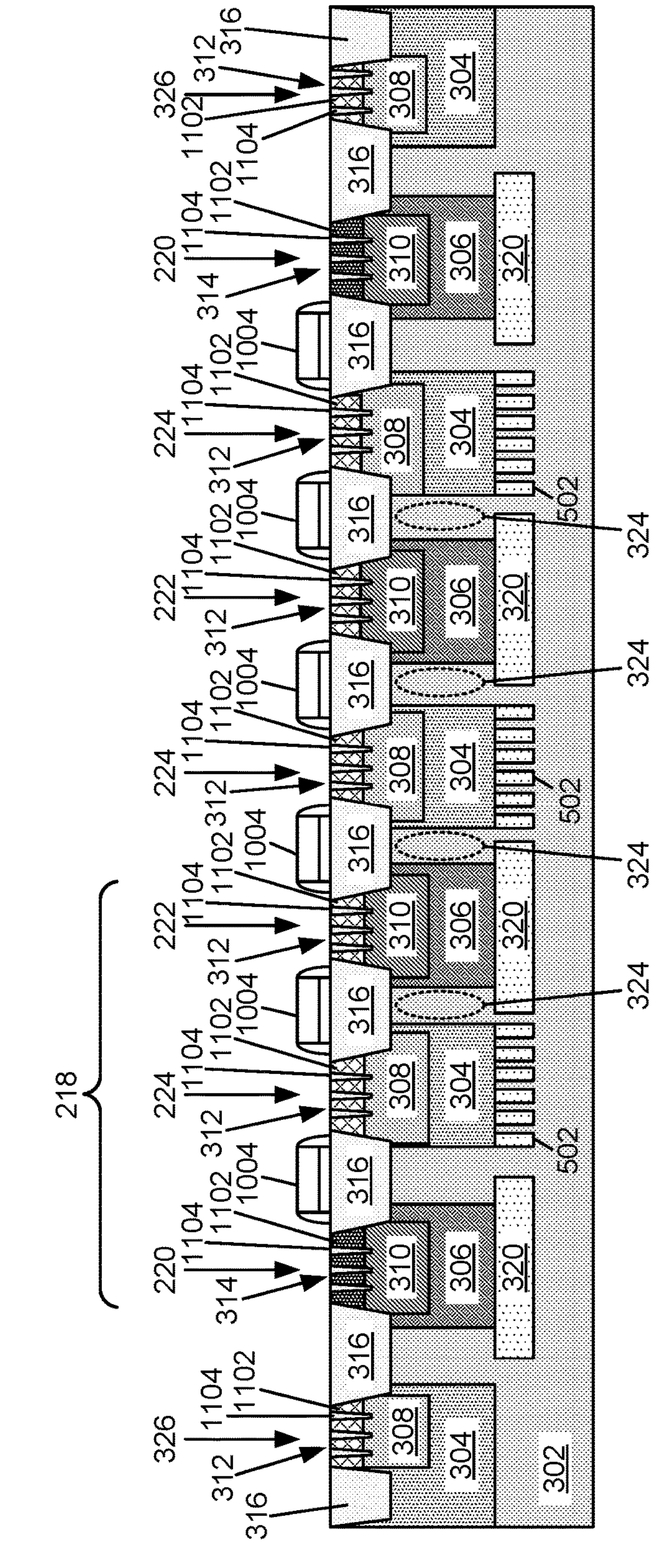

FIG. 11H illustrates an example implementation 1118 of an ESD triggering circuit 206 that may be included in a semiconductor device. As shown in FIG. 11H, the example implementation 1118 of the ESD triggering circuit 206 may include a similar arrangement of layers and/or structures as the example implementation 1116 of the ESD triggering circuit 206 illustrated and described in connection with FIG. 11G. For example, the example implementation 1118 of the ESD triggering circuit 206 may include components 302-316, 320, 324, 1004, 1102, and 1104. However, in the example implementation 1118 of the ESD triggering circuit 206, n-doped barrier strips 502 are included in the portions 322 of the substrate 302 between adjacent n-doped barrier regions 320. The n-doped barrier strips 502 may be included to provide additional charge carrier migration blocking (e.g., in combination with the n-doped barrier regions 320) with minimal decrease in breakdown voltage of the PNP ESD triggering device(s) 218 of the ESD triggering circuit 206.

Figure 11I:
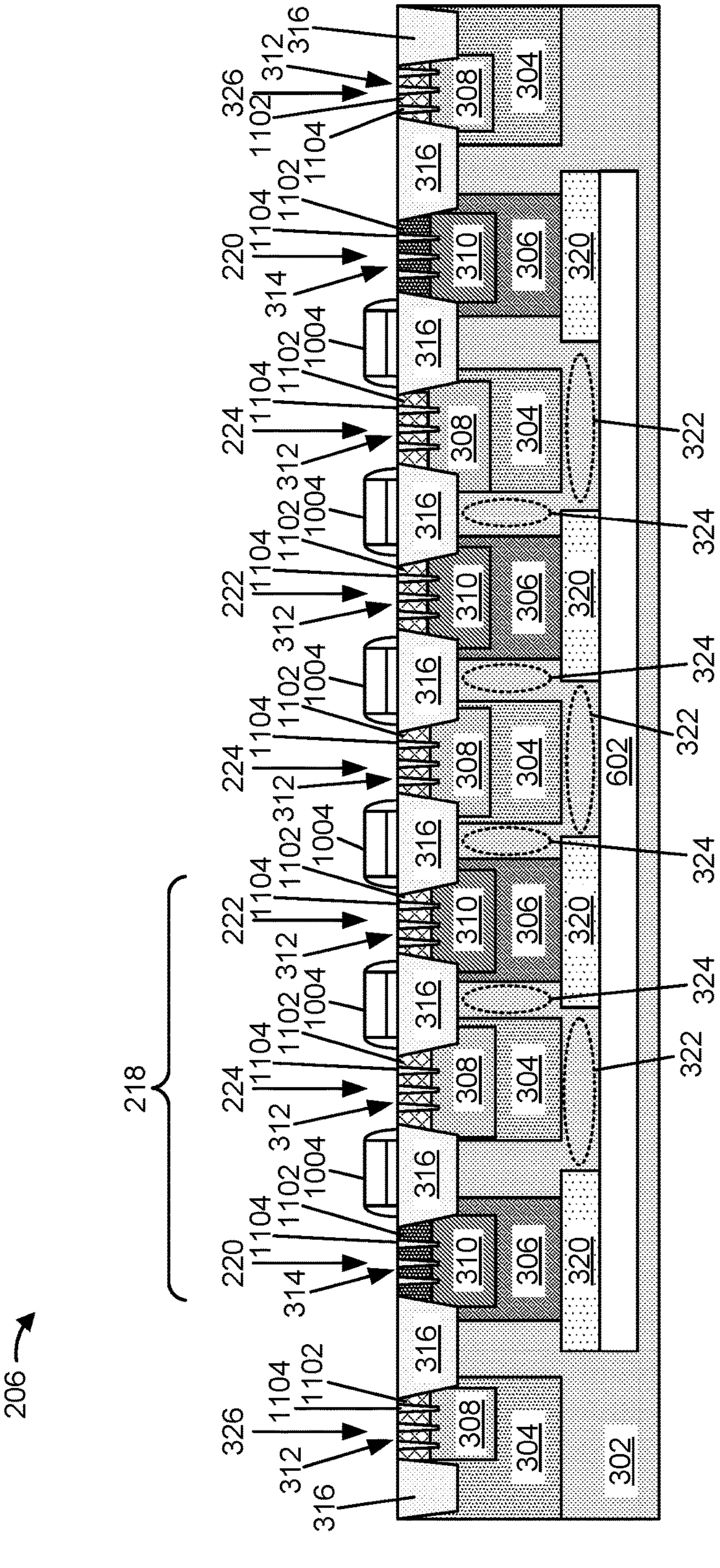

FIG. 11I illustrates an example implementation 1120 of an ESD triggering circuit 206 that may be included in a semiconductor device. As shown in FIG. 11I, the example implementation 1120 of the ESD triggering circuit 206 may include a similar arrangement of layers and/or structures as the example implementation 1116 of the ESD triggering circuit 206 illustrated and described in connection with FIG. 11G. For example, the example implementation 1120 of the ESD triggering circuit 206 may include components 302-316, 320-324, 1004, 1102, and 1104. However, in the example implementation 1120 of the ESD triggering circuit 206, a deep n-doped barrier layer 602 is included under the n-doped barrier regions 320. The deep n-doped barrier layer 602 may be included to provide additional charge carrier migration blocking (e.g., in combination with the n-doped barrier regions 320) with minimal decrease in breakdown voltage of the PNP ESD triggering device(s) 218 of the ESD triggering circuit 206.

Figure 11J:
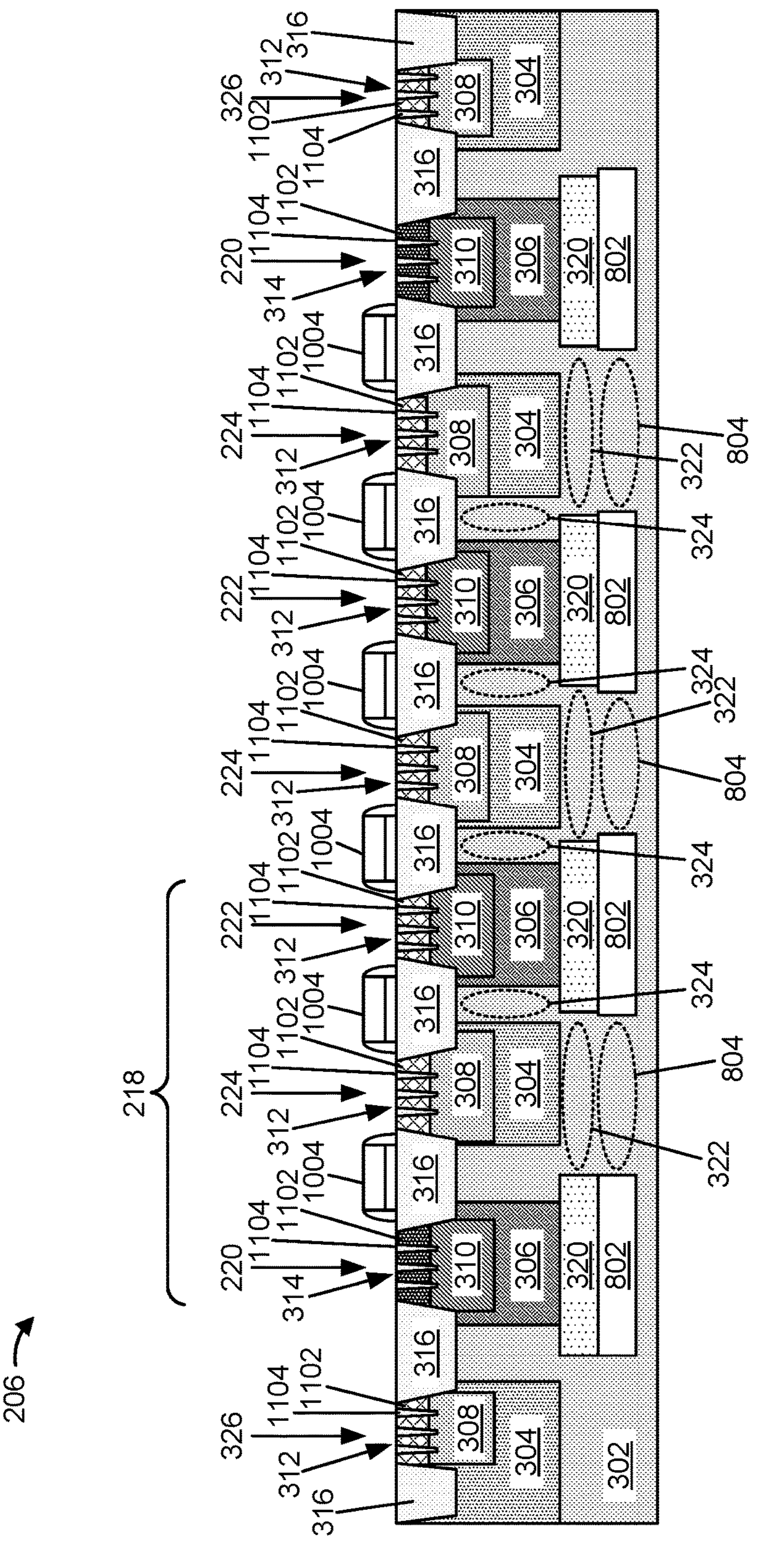

FIG. 11J illustrates an example implementation 1122 of an ESD triggering circuit 206 that may be included in a semiconductor device. As shown in FIG. 11J, the example implementation 1120 of the ESD triggering circuit 206 may include a similar arrangement of layers and/or structures as the example implementation 1116 of the ESD triggering circuit 206 illustrated and described in connection with FIG. 11G. For example, the example implementation 1122 of the ESD triggering circuit 206 may include components 302-316, 320-324, 1004, 1102, and 1104. However, in the example implementation 1122 of the ESD triggering circuit 206, deep n-doped barrier regions 802 are included under the n-doped barrier regions 320. The deep n-doped barrier regions 802 may be included to provide additional charge carrier migration blocking (e.g., in combination with the n-doped barrier regions 320). Adjacent deep n-doped barrier regions 802 may be spaced apart or separated by portions 804 of the substrate 302 below and/or under the p-doped wells 304 of the p-doped collectors 224 of the ESD triggering circuit 206, thereby providing minimal decrease in breakdown voltage of the PNP ESD triggering devices 218 of the ESD triggering circuit 206. The portions 804 of the substrate 302 may be located below and/or under the portions 322 of the substrate 302 between adjacent n-doped barrier regions 320.

Figure 11K:
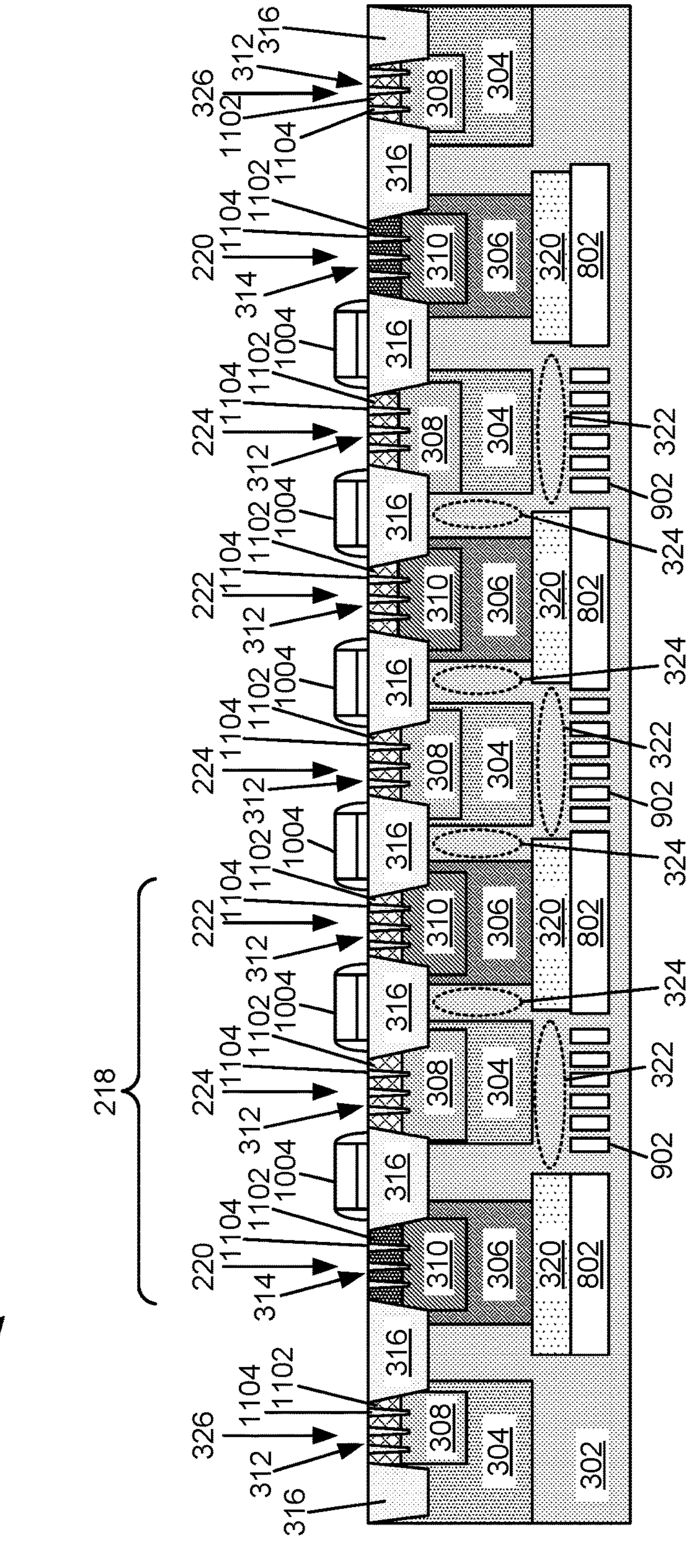

FIG. 11K illustrates an example implementation 1124 of an ESD triggering circuit 206 that may be included in a semiconductor device. As shown in FIG. 11K, the example implementation 1124 of the ESD triggering circuit 206 may include a similar arrangement of layers and/or structures as the example implementation 1122 of the ESD triggering circuit 206 illustrated and described in connection with FIG. 11J. For example, the example implementation 1124 of the ESD triggering circuit 206 may include components 302-316, 320-324, 802, 1004, 1102, and 1104. However, in the example implementation 1124 of the ESD triggering circuit 206, deep n-doped barrier strips 902 are included in place of the portions 804 of the substrate 302 between adjacent deep n-doped barrier regions 802. The deep n-doped barrier strips 902 may be included to provide additional charge carrier migration blocking (e.g., in combination with the n-doped barrier regions 320) with minimal decrease in breakdown voltage of the PNP ESD triggering devices 218 of the ESD triggering circuit 206.

As indicated above, FIGS. 11A-11K are provided as examples. Other examples may differ from what is described with regard to FIGS. 11A-11K.

Figure 12:
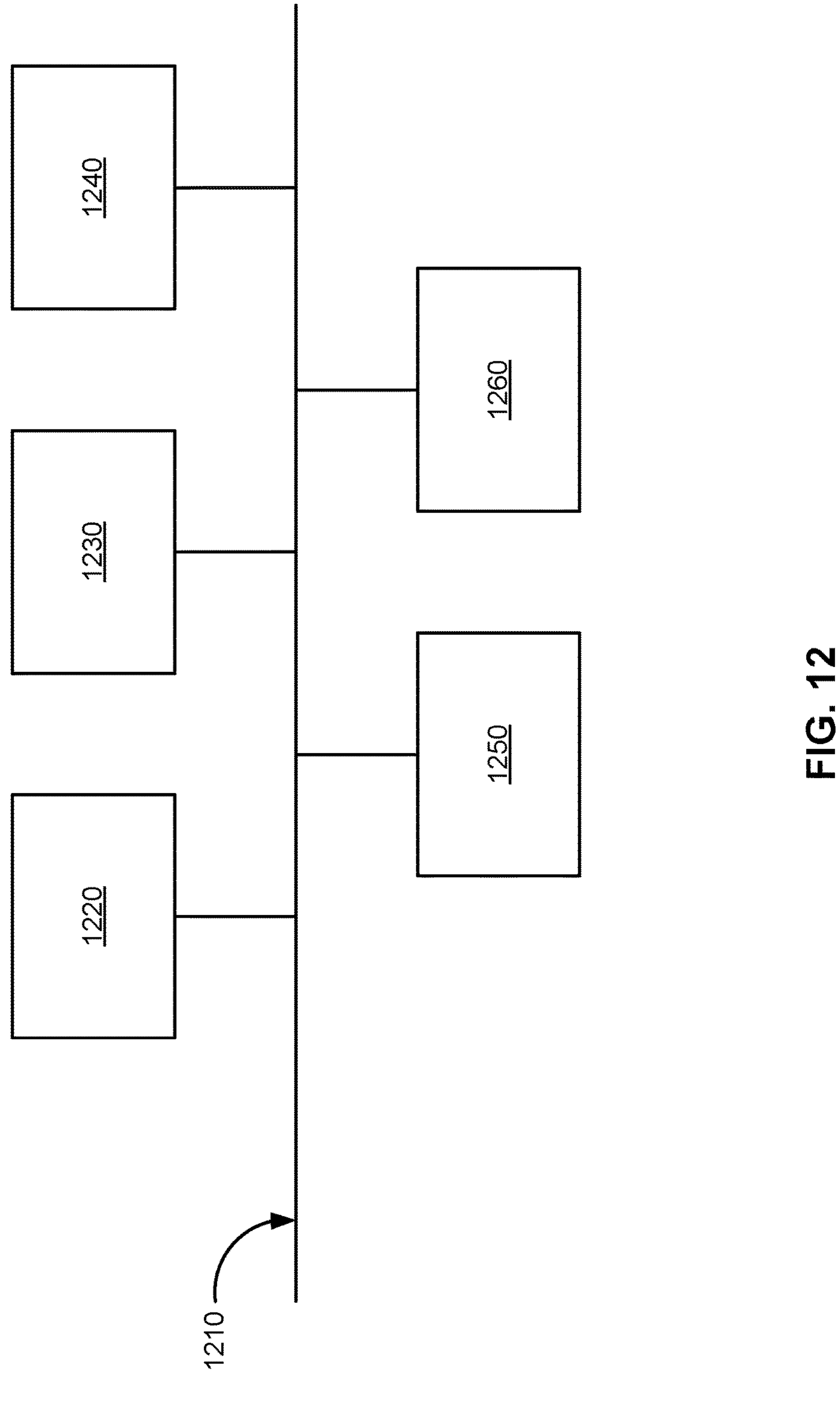
FIG. 12 is a diagram of example components of a device described herein.

FIG. 12 is a diagram of example components of a device 1200 described herein. In some implementations, one or more of the semiconductor processing tools 102-114 and/or the wafer/die transport tool 116 may include one or more devices 1200 and/or one or more components of the device 1200. As shown in FIG. 12, the device 1200 may include a bus 1210, a processor 1220, a memory 1230, an input component 1240, an output component 1250, and/or a communication component 1260.

The bus 1210 may include one or more components that enable wired and/or wireless communication among the components of the device 1200. The bus 1210 may couple together two or more components of FIG. 12, such as via operative coupling, communicative coupling, electronic coupling, and/or electric coupling. For example, the bus 1210 may include an electrical connection (e.g., a wire, a trace, and/or a lead) and/or a wireless bus. The processor 1220 may include a central processing unit, a graphics processing unit, a microprocessor, a controller, a microcontroller, a digital signal processor, a field-programmable gate array, an application-specific integrated circuit, and/or another type of processing component. The processor 1220 may be implemented in hardware, firmware, or a combination of hardware and software. In some implementations, the processor 1220 may include one or more processors capable of being programmed to perform one or more operations or processes described elsewhere herein.

The memory 1230 may include volatile and/or nonvolatile memory. For example, the memory 1230 may include random access memory (RAM), read only memory (ROM), a hard disk drive, and/or another type of memory (e.g., a flash memory, a magnetic memory, and/or an optical memory). The memory 1230 may include internal memory (e.g., RAM, ROM, or a hard disk drive) and/or removable memory (e.g., removable via a universal serial bus connection). The memory 1230 may be a non-transitory computer-readable medium. The memory 1230 may store information, one or more instructions, and/or software (e.g., one or more software applications) related to the operation of the device 1200. In some implementations, the memory 1230 may include one or more memories that are coupled (e.g., communicatively coupled) to one or more processors (e.g., processor 1220), such as via the bus 1210. Communicative coupling between a processor 1220 and a memory 1230 may enable the processor 1220 to read and/or process information stored in the memory 1230 and/or to store information in the memory 1230.

The input component 1240 may enable the device 1200 to receive input, such as user input and/or sensed input. For example, the input component 1240 may include a touch screen, a keyboard, a keypad, a mouse, a button, a microphone, a switch, a sensor, a global positioning system sensor, a global navigation satellite system sensor, an accelerometer, a gyroscope, and/or an actuator. The output component 1250 may enable the device 1200 to provide output, such as via a display, a speaker, and/or a light-emitting diode. The communication component 1260 may enable the device 1200 to communicate with other devices via a wired connection and/or a wireless connection. For example, the communication component 1260 may include a receiver, a transmitter, a transceiver, a modem, a network interface card, and/or an antenna.

The device 1200 may perform one or more operations or processes described herein. For example, a non-transitory computer-readable medium (e.g., memory 1230) may store a set of instructions (e.g., one or more instructions or code) for execution by the processor 1220. The processor 1220 may execute the set of instructions to perform one or more operations or processes described herein. In some implementations, execution of the set of instructions, by one or more processors 1220, causes the one or more processors 1220 and/or the device 1200 to perform one or more operations or processes described herein. In some implementations, hardwired circuitry may be used instead of or in combination with the instructions to perform one or more operations or processes described herein. Additionally, or alternatively, the processor 1220 may be configured to perform one or more operations or processes described herein. Thus, implementations described herein are not limited to any specific combination of hardware circuitry and software.

The number and arrangement of components shown in FIG. 12 are provided as an example. The device 1200 may include additional components, fewer components, different components, or differently arranged components than those shown in FIG. 12. Additionally, or alternatively, a set of components (e.g., one or more components) of the device 1200 may perform one or more functions described as being performed by another set of components of the device 1200.

Figure 13:
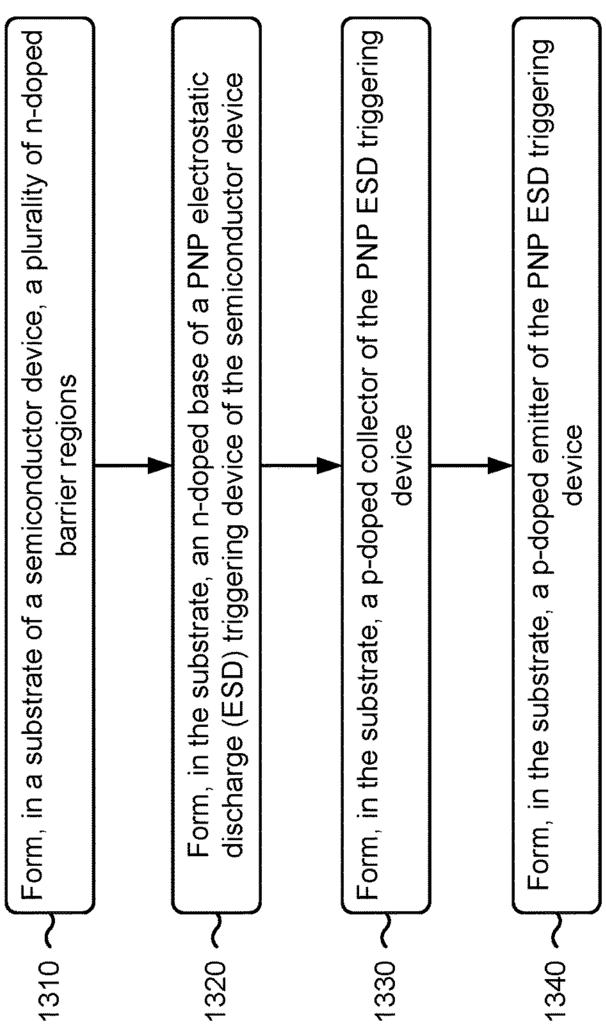
FIG. 13 is a flowchart of an example process associated with forming a semiconductor device described herein.

FIG. 13 is a flowchart of an example process 1300 associated with forming a semiconductor device described herein. In some implementations, one or more process blocks of FIG. 13 are performed by one or more semiconductor processing tools (e.g., one or more of the semiconductor processing tools 102-114). Additionally, or alternatively, one or more process blocks of FIG. 13 may be performed by one or more components of device 1200, such as processor 1220, memory 1230, input component 1240, output component 1250, and/or communication component 1260.

As shown in FIG. 13, process 1300 may include forming, in a substrate of a semiconductor device, a plurality of n-doped barrier regions (block 1310). For example, one or more of the semiconductor processing tools 102-114 may form, in a substrate 302 of a semiconductor device, a plurality of n-doped barrier regions 320, as described herein. The semiconductor device may be the semiconductor device 200, the semiconductor device 226, the semiconductor device 228, and/or another semiconductor device.

As further shown in FIG. 13, process 1300 may include forming, in the substrate, an n-doped base of a PNP ESD triggering device of the semiconductor device (block 1320). For example, one or more of the semiconductor processing tools 102-114 may form, in the substrate 302, an n-doped base 220 of a PNP ESD triggering device 218 of the semiconductor device, as described herein.

As further shown in FIG. 13, process 1300 may include forming, in the substrate, a p-doped collector of the PNP ESD triggering device (block 1330). For example, one or more of the semiconductor processing tools 102-114 may form, in the substrate 302, a p-doped collector 224 of the PNP ESD triggering device 218, as described herein. In some implementations, a first portion 324 of the substrate 302 is located between a first n-doped well 306 of the n-doped base and a p-doped well 304 of the p-doped collector 224.

As further shown in FIG. 13, process 1300 may include forming, in the substrate, a p-doped emitter of the PNP ESD triggering device (block 1340). For example, one or more of the semiconductor processing tools 102-114 may form, in the substrate 302, a p-doped emitter 222 of the PNP ESD triggering device 218, as described herein. In some implementations, a first n-doped barrier region 320 is located under the first n-doped well 306 of the n-doped base 220. In some implementations, a second n-doped barrier region 320 is located under the second n-doped well 306 of the p-doped collector 224. In some implementations, a third portion 322 of the substrate 302 is located between the first n-doped barrier region 320 and the second n-doped barrier region 320.

Process 1300 may include additional implementations, such as any single implementation or any combination of implementations described below and/or in connection with one or more other processes described elsewhere herein.

In a first implementation, process 1300 includes forming an STI region 316 and an RPO structure 318, where the STI region 316 is located above the first portion 324 of the substrate 302 and between the n-doped base 220 and the p-doped collector 224, and where the RPO structure 318 above the second portion 324 of the substrate 302 and between the p-doped collector 224 and the p-doped emitter 222.

In a second implementation, alone or in combination with the first implementation, process 1300 includes forming a first STI region 316 and a second STI region 316, where the first STI region 316 is located above the first portion 324 of the substrate 302 and between the n-doped base 220 and the p-doped collector 224, and where the second STI region 316 is located above the second portion 324 of the substrate 302 and between the p-doped collector 224 and the p-doped emitter 222.

In a third implementation, alone or in combination with one or more of the first and second implementations, process 1300 includes forming a deep n-doped barrier layer 602 in the substrate 302, where the plurality of n-doped barrier regions 320 are located above the deep n-doped barrier layer 602 in the substrate 302, and where the deep n-doped barrier layer 602 extends continuously between the plurality of n-doped barrier regions 320.

In a fourth implementation, alone or in combination with one or more of the first through third implementations, process 1300 includes forming a deep n-doped barrier layer 602 in the substrate 302 prior to forming the plurality of n-doped barrier regions 320, where forming the plurality of n-doped barrier regions 320 includes forming the plurality of n-doped barrier regions 320 above the deep n-doped barrier layer 602.

In a fifth implementation, alone or in combination with one or more of the first through fourth implementations, process 1300 includes forming plurality of deep n-doped barrier regions 802 in the substrate 302, including a first deep n-doped barrier region 802 and a second deep n-doped barrier region 802, where the first n-doped barrier region 320 is located over first deep n-doped barrier region 802 is located, where the second n-doped barrier region 320 is located over the a second deep n-doped barrier region 802, and where a fourth portion 804 of the substrate 302 is located between the first deep n-doped barrier region 802 and the second deep n-doped barrier region 802.

In a sixth implementation, alone or in combination with one or more of the first through fifth implementations, process 1300 includes forming a plurality of deep n-doped barrier strips 902 in the fourth portion 804 of the substrate between the first deep n-doped barrier region 802 and the second deep n-doped barrier region 802.

In a seventh implementation, alone or in combination with one or more of the first through sixth implementations, process 1300 includes forming a plurality of n-doped barrier strips 502 in the third portion 322 of the substrate 302 between the first n-doped barrier region 320 and the second n-doped barrier region 320.

Although FIG. 13 shows example blocks of process 1300, in some implementations, process 1300 includes additional blocks, fewer blocks, different blocks, or differently arranged blocks than those depicted in FIG. 13. Additionally, or alternatively, two or more of the blocks of process 1300 may be performed in parallel.

Figure 14:
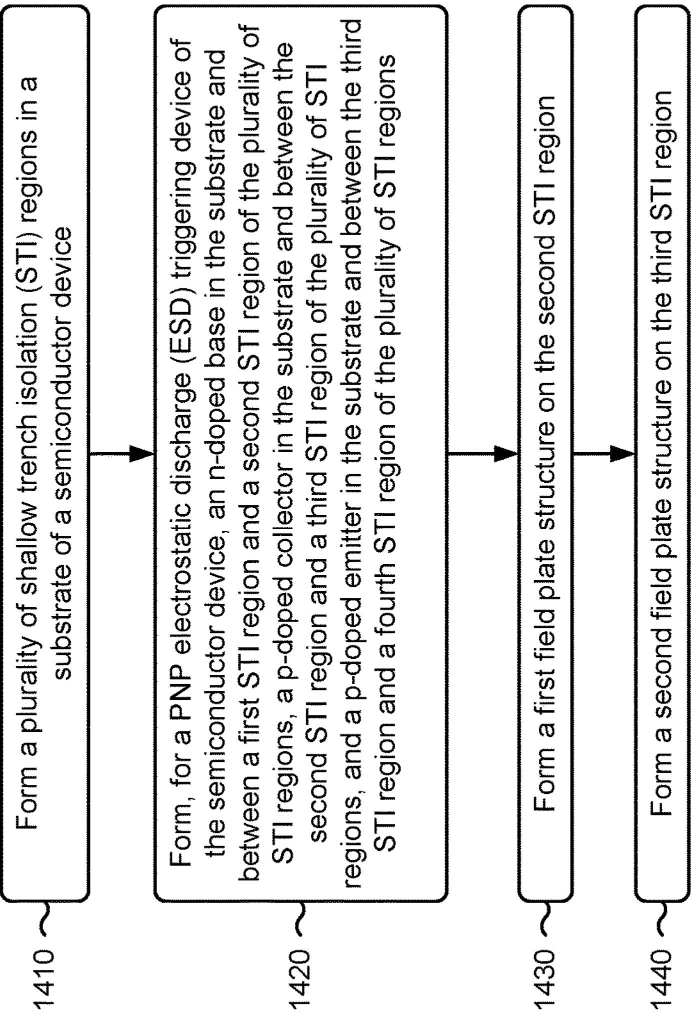
FIG. 14 is a flowchart of an example process associated with forming a semiconductor device described herein.

FIG. 14 is a flowchart of an example process 1400 associated with forming a semiconductor device described herein. In some implementations, one or more process blocks of FIG. 14 are performed by one or more semiconductor processing tools (e.g., one or more of the semiconductor processing tools 102-114). Additionally, or alternatively, one or more process blocks of FIG. 14 may be performed by one or more components of device 1200, such as processor 1220, memory 1230, input component 1240, output component 1250, and/or communication component 1260.

As shown in FIG. 14, process 1400 may include forming a plurality of STI regions in a substrate of a semiconductor device (block 1410). For example, one or more of the semiconductor processing tools 102-114 may form a plurality of STI regions 316 in a substrate 302 of a semiconductor device, as described herein. The semiconductor device may be the semiconductor device 200, the semiconductor device 226, the semiconductor device 228, and/or another semiconductor device.

As further shown in FIG. 14, process 1400 may include forming, for a PNP ESD triggering device of the semiconductor device, an n-doped base in the substrate and between a first STI region and a second STI region of the plurality of STI regions, a p-doped collector in the substrate and between the second STI region and a third STI region of the plurality of STI regions, and a p-doped emitter in the substrate and between the third STI region and a fourth STI region of the plurality of STI regions (block 1420). For example, one or more of the semiconductor processing tools 102-114 may form, for a PNP ESD triggering device 218 of the semiconductor device, an n-doped base 220 in the substrate 302 and between a first STI region 316 and a second STI region 316 of the plurality of STI regions 316, a p-doped collector 224 in the substrate 302 and between the second STI region 316 and a third STI region 316 of the plurality of STI regions 316, and a p-doped emitter 222 in the substrate 302 and between the third STI region 316 and a fourth STI region 316 of the plurality of STI regions 316, as described herein. In some implementations, a first portion 324 of the substrate 302 is located between a first n-doped well 306 of the n-doped base 220 and a p-doped well 304 of the p-doped collector 224. In some implementations, a second portion 324 of the substrate 302 is located between the p-doped well 304 of the p-doped collector 224 and a second n-doped well 306 of the p-doped emitter 222.

As further shown in FIG. 14, process 1400 may include forming a first field plate structure on the second STI region (block 1430). For example, one or more of the semiconductor processing tools 102-114 may form a first field plate structure 1004 on the second STI region 316, as described herein.

As further shown in FIG. 14, process 1400 may include forming a second field plate structure on the third STI region (block 1440). For example, one or more of the semiconductor processing tools 102-114 may form a second field plate structure 1004 on the third STI region 316, as described herein.

Process 1400 may include additional implementations, such as any single implementation or any combination of implementations described below and/or in connection with one or more other processes described elsewhere herein.

In a first implementation, process 1400 includes forming an n-doped barrier layer 1002 in the substrate 302 prior to forming the plurality of STI regions 316, where forming the n-doped base 220, the p-doped collector 224, and the p-doped emitter 222 includes forming the n-doped base 220, the p-doped collector 224, and the p-doped emitter 222 above the n-doped barrier layer 1002.

In a second implementation, alone or in combination with the first implementation, process 1400 includes forming a plurality of n-doped barrier regions 320 in the substrate 302 prior to forming the plurality of STI regions 316, where forming the n-doped base 220 includes forming the n-doped base 220 above a first n-doped barrier region 320 of the plurality of n-doped barrier regions 320, and forming the p-doped emitter 222 includes forming the p-doped emitter 222 above a second n-doped barrier region 320 of the plurality of n-doped barrier regions 320.

In a third implementation, alone or in combination with one or more of the first and second implementations, process 1400 includes forming a plurality of n-doped barrier strips 502 in the substrate 302 between the first n-doped barrier region 320 and the second n-doped barrier region 320.

In a fourth implementation, alone or in combination with one or more of the first through third implementations, process 1400 includes forming a deep n-doped barrier layer 602 in the substrate 302 prior to forming the plurality of n-doped barrier regions 320, where forming the plurality of n-doped barrier regions 320 includes forming the plurality of n-doped barrier regions 320 above the deep n-doped barrier layer 602.

In a fifth implementation, alone or in combination with one or more of the first through fourth implementations, process 1400 includes forming a plurality of deep n-doped barrier regions 802 in the substrate 302 prior to forming the plurality of n-doped barrier regions 320, where forming the plurality of n-doped barrier regions 320 includes forming the first n-doped barrier region 320 above a first deep n-doped barrier region 802 of the plurality of deep n-doped barrier regions 802, and forming the second n-doped barrier region 320 above a second deep n-doped barrier region 802 of the plurality of deep n-doped barrier regions 802.

Although FIG. 14 shows example blocks of process 1400, in some implementations, process 1400 includes additional blocks, fewer blocks, different blocks, or differently arranged blocks than those depicted in FIG. 14. Additionally, or alternatively, two or more of the blocks of process 1400 may be performed in parallel.

Figure 15:
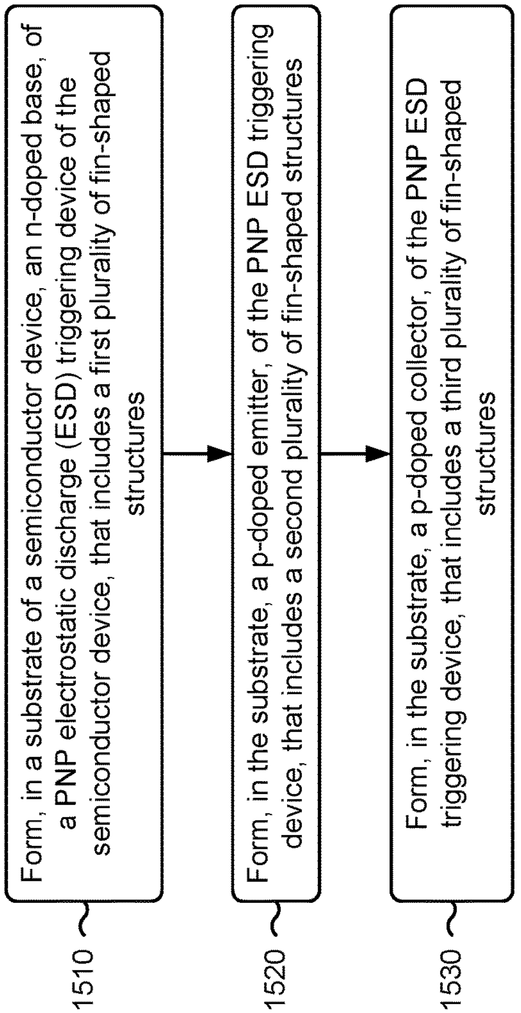
FIG. 15 is a flowchart of an example process associated with forming a semiconductor device described herein.

FIG. 15 is a flowchart of an example process 1500 associated with forming a semiconductor device described herein. In some implementations, one or more process blocks of FIG. 15 are performed by one or more semiconductor processing tools (e.g., one or more of the semiconductor processing tools 102-114). Additionally, or alternatively, one or more process blocks of FIG. 15 may be performed by one or more components of device 1200, such as processor 1220, memory 1230, input component 1240, output component 1250, and/or communication component 1260.

As shown in FIG. 15, process 1500 may include forming, in a substrate of a semiconductor device, an n-doped base, of a PNP ESD triggering device substrate of the semiconductor device, that includes a first plurality of fin-shaped structures (block 1510). For example, one or more of the semiconductor processing tools 102-114 may form, in a substrate 302 of a semiconductor device, an n-doped base 220, of a PNP ESD triggering device 218 of the semiconductor device, that includes a first plurality of fin-shaped structures 1102, as described herein. The semiconductor device may be the semiconductor device 200, the semiconductor device 226, the semiconductor device 228, and/or another semiconductor device.

As further shown in FIG. 15, process 1500 may include forming, in the substrate, a p-doped emitter, of the PNP ESD triggering device, that includes a second plurality of fin-shaped structures (block 1520). For example, one or more of the semiconductor processing tools 102-114 may form, in the substrate 302, a p-doped emitter 222, of the PNP ESD triggering device 218, that includes a second plurality of fin-shaped structures 1102, as described herein. In some implementations, a first portion 324 of the substrate 302 is located between a first n-doped well 306 of the n-doped base 220 and a p-doped well 304 of the p-doped emitter 222.

As further shown in FIG. 15, process 1500 may include forming, in the substrate, a p-doped collector, of the PNP ESD triggering device, that includes a third plurality of fin-shaped structures (block 1530). For example, one or more of the semiconductor processing tools 102-114 may form, in the substrate 302, a p-doped collector 224, of the PNP ESD triggering device 218, that includes a third plurality of fin-shaped structures 1102, as described herein. In some implementations, a second portion 324 of the substrate 302 is located between the p-doped well 304 of the p-doped emitter 222 and a second n-doped well 306 of the p-doped collector 224.

Process 1500 may include additional implementations, such as any single implementation or any combination of implementations described below and/or in connection with one or more other processes described elsewhere herein.

In a first implementation, process 1500 includes forming a plurality of n-doped barrier regions 320 in the substrate 302, where the first n-doped well 306 of the n-doped base 220 is located over a first n-doped barrier region 320 of the plurality of n-doped barrier regions 320, where the second n-doped well 306 of the p-doped collector 224 is located over a second n-doped barrier region 320 of the plurality of n-doped barrier regions 320, and where a third portion 322 of the substrate 302 is located between the first n-doped barrier region 320 and the second n-doped barrier region 320.

In a second implementation, alone or in combination with the first implementation, process 1500 includes forming a deep n-doped barrier layer 602, where the plurality of n-doped barrier regions 320 are located above the deep n-doped barrier layer 602 in the substrate 302, and where the deep n-doped barrier layer 602 extends continuously between the plurality of n-doped barrier regions 320.

In a third implementation, alone or in combination with one or more of the first and second implementations, process 1500 includes forming a plurality of deep n-doped barrier regions 802 in the substrate 302, where the first n-doped barrier region 320 is located over a first deep n-doped barrier region 802 of the plurality of deep n-doped barrier regions 802, where the second n-doped barrier region is located over a second deep n-doped barrier region 802 of the plurality of deep n-doped barrier regions 802, and where a fourth portion 804 of the substrate 302 is located between the first deep n-doped barrier region 802 and the second deep n-doped barrier region 802.

In a fourth implementation, alone or in combination with one or more of the first through third implementations, process 1500 includes forming a plurality of deep n-doped barrier strips 902 in the fourth portion 804 of the substrate 302 between the first deep n-doped barrier region 802 and the second deep n-doped barrier region 802.

In a fifth implementation, alone or in combination with one or more of the first through fourth implementations, process 1500 includes forming a first STI region 316 above the first portion 324 of the substrate 302, where the first STI region 316 is located between the n-doped base 220 and the p-doped collector 224, forming a second STI region 316 above the second portion 324 of the substrate 302, where the second STI region 316 is located between the p-doped collector 224 and the p-doped emitter 222, forming a first field plate structure 1004 on the first STI region 316, and forming a second field plate structure 1004 on the second STI region 316.

In a sixth implementation, alone or in combination with one or more of the first through fifth implementations, process 1500 includes forming an n-doped barrier layer 1002 in the substrate 302, where the n-doped base 220, the p-doped emitter 222, and the p-doped collector 224 are located above the n-doped barrier layer 1002, and where the deep n-doped barrier layer 602 extends continuously between the n-doped base 220, the p-doped emitter 222, and the p-doped collector 224.

Although FIG. 15 shows example blocks of process 1500, in some implementations, process 1500 includes additional blocks, fewer blocks, different blocks, or differently arranged blocks than those depicted in FIG. 15. Additionally, or alternatively, two or more of the blocks of process 1500 may be performed in parallel.

In this way, a semiconductor device may include an ESD protection circuit and a high voltage ESD triggering circuit that is configured to trigger ESD protection for high voltage circuits of the semiconductor device. The high voltage ESD triggering circuit may be implemented by one or more of the example implementations of high voltage ESD triggering circuits described herein. The example implementations of high voltage ESD triggering circuits described herein are capable of handle high voltages of the high voltage circuits included in the semiconductor device. This reduces the likelihood of and/or prevents premature triggering of ESD protection during normal operation for these high voltage circuits, and enables the high voltage circuits to be protected from high voltage ESD events.

As described in greater detail above, some implementations described herein provide a semiconductor device. The semiconductor device includes a device circuit. The semiconductor device includes an ESD circuit coupled with the device circuit. The semiconductor device includes an ESD triggering circuit, coupled with the ESD circuit and the device circuit, comprising, a substrate a PNP ESD triggering device, in the substrate, comprising: an n-doped base a p-doped collector, where a first portion of the substrate is located between a first n-doped well of the n-doped base and a p-doped well of the p-doped collector a p-doped emitter, where a second portion of the substrate is located between the p-doped well of the p-doped collector and a second n-doped well of the p-doped emitter a plurality of n-doped barrier regions in the substrate, comprising: a first n-doped barrier region under the first n-doped well of the n-doped base a second n-doped barrier region under the second n-doped well of the p-doped collector, where a third portion of the substrate is located between the first n-doped barrier region and the second n-doped barrier region.

As described in greater detail above, some implementations described herein provide a method. The method includes forming a plurality of STI regions in a substrate of a semiconductor device. The method includes forming, for a PNP ESD triggering device of the semiconductor device, an n-doped base in the substrate and between a first STI region and a second STI region of the plurality of STI regions a p-doped collector in the substrate and between the second STI region and a third STI region of the plurality of STI regions, where a first portion of the substrate is located between a first n-doped well of the n-doped base and a p-doped well of the p-doped collector, and a p-doped emitter in the substrate and between the third STI region and a fourth STI region of the plurality of STI regions, where a second portion of the substrate is located between the p-doped well of the p-doped collector and a second n-doped well of the p-doped emitter. The method includes forming a first field plate structure on the second STI region. The method includes forming a second field plate structure on the third STI region.

As described in greater detail above, some implementations described herein provide a semiconductor device. The semiconductor device includes a device circuit. The semiconductor device includes an ESD circuit coupled with the device circuit. The semiconductor device includes an ESD triggering circuit, coupled with the ESD circuit and the device circuit, comprising, a substrate a PNP ESD triggering device, in the substrate, comprising: an n-doped base including a first plurality of fin-shaped structures a p-doped emitter including a second plurality of fin-shaped structures, where a first portion of the substrate is located between a first n-doped well of the n-doped base and a p-doped well of the p-doped emitter a p-doped collector including a third plurality of fin-shaped structures, where a second portion of the substrate is located between the p-doped well of the p-doped emitter and a second n-doped well of the p-doped collector.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a device circuit;

an electrostatic discharge (ESD) circuit coupled with the device circuit; and an ESD triggering circuit, coupled with the ESD circuit and the device circuit, comprising:

a substrate;

a PNP ESD triggering device, in the substrate, comprising:

an n-doped base;

a p-doped collector, wherein a first portion of the substrate is located between a first n-doped well of the n-doped base and a p-doped well of the p-doped collector; and a p-doped emitter, wherein a second portion of the substrate is located between the p-doped well of the p-doped collector and a second n-doped well of the p-doped emitter;

a plurality of n-doped barrier regions in the substrate, comprising:

a first n-doped barrier region under the first n-doped well of the n-doped base; and a second n-doped barrier region under the second n-doped well of the p-doped emitter, wherein a third portion of the substrate is located between the first n-doped barrier region and the second n-doped barrier region; and a plurality of deep n-doped barrier regions in the substrate, comprising:

a first deep n-doped barrier region under the first n-doped barrier region; and a second deep n-doped barrier region under the second n-doped barrier region, wherein a fourth portion of the substrate is located between the first deep n-doped barrier region and the second deep n-doped barrier region, wherein the fourth portion of the substrate is located under the third portion of the substrate, and wherein the third portion of the substrate and the fourth portion of the substrate are located under the p-doped well of the p-doped collector.

2. The semiconductor device of claim 1, further comprising:

a shallow trench isolation (STI) region above the first portion of the substrate and between the n-doped base and the p-doped collector; and a resist protective oxide (RPO) structure above the second portion of the substrate and between the p-doped collector and the p-doped emitter.

3. The semiconductor device of claim 1, further comprising:

a first shallow trench isolation (STI) region above the first portion of the substrate and between the n-doped base and the p-doped collector; and a second STI region above the second portion of the substrate and between the p-doped collector and the p-doped emitter.

4. The semiconductor device of claim 1, further comprising:

a plurality of deep n-doped barrier strips in the fourth portion of the substrate between the first deep n-doped barrier region and the second deep n-doped barrier region.

5. The semiconductor device of claim 1, further comprising:

a plurality of n-doped barrier strips in the third portion of the substrate between the first n-doped barrier region and the second n-doped barrier region.

6. A semiconductor device, comprising:

a device circuit;

an electrostatic discharge (ESD) circuit coupled with the device circuit; and an ESD triggering circuit, coupled with the ESD circuit and the device circuit, comprising:

a substrate; and a PNP ESD triggering device, in the substrate, comprising:

an n-doped base including a first plurality of fin-shaped structures;

a p-doped collector including a second plurality of fin-shaped structures, wherein a first portion of the substrate is located between a first n-doped well of the n-doped base and a p-doped well of the p-doped collector; and a p-doped emitter including a third plurality of fin-shaped structures, wherein a second portion of the substrate is located between the p-doped well of the p-doped collector and a second n-doped well of the p-doped emitter;

a plurality of n-doped barrier regions in the substrate, comprising:

a first n-doped barrier region under the first n-doped well of the n-doped base; and a second n-doped barrier region under the second n-doped well of the p-doped emitter, wherein a third portion of the substrate is located between the first n-doped barrier region and the second n-doped barrier region; and a plurality of deep n-doped barrier regions in the substrate, comprising:

a first deep n-doped barrier region under the first n-doped barrier region; and a second deep n-doped barrier region under the second n-doped barrier region, wherein a fourth portion of the substrate is located between the first deep n-doped barrier region and the second deep n-doped barrier region, wherein the fourth portion of the substrate is located under the third portion of the substrate, and wherein the third portion of the substrate and the fourth portion of the substrate are located under the p-doped well of the p-doped collector.

7. The semiconductor device of claim 6, further comprising:

a plurality of deep n-doped barrier strips in the fourth portion of the substrate between the first deep n-doped barrier region and the second deep n-doped barrier region.

8. The semiconductor device of claim 6, further comprising:

a first shallow trench isolation (STI) region above the first portion of the substrate and between the n-doped base and the p-doped collector;

a second STI region above the second portion of the substrate and between the p-doped collector and the p-doped emitter;

a first field plate structure on the first STI region; and a second field plate structure on the second STI region.

9. A semiconductor device, comprising:

a substrate;

a plurality of shallow trench isolation (STI) regions in the substrate;

a PNP electrostatic discharge (ESD) triggering device comprising:

an n-doped base in the substrate between a first STI region and a second STI region of the plurality of STI regions;

a p-doped collector in the substrate between the second STI region and a third STI region of the plurality of STI regions, wherein a first portion of the substrate is located between a first n-doped well of the n-doped base and a p-doped well of the p-doped collector; and a p-doped emitter in the substrate between the third STI region and a fourth STI region of the plurality of STI regions, wherein a second portion of the substrate is located between the p-doped well of the p-doped collector and a second n-doped well of the p-doped emitter;

a first n-doped barrier region in the substrate under the n-doped base;

a second n-doped barrier region in the substrate under the p-doped emitter, wherein a third portion of the substrate is located between the first n-doped barrier region and the second n-doped barrier region;

a first deep n-doped barrier region under the first n-doped barrier region; and a second deep n-doped barrier region under the second n-doped barrier region, wherein a fourth portion of the substrate is located between the first deep n-doped barrier region and the second deep n-doped barrier region, wherein the fourth portion of the substrate is located under the third portion of the substrate, and wherein the third portion of the substrate and the fourth portion of the substrate are located under the p-doped well of the p-doped collector.

10. The semiconductor device of claim 9, further comprising:

a first field plate structure on the second STI region; and a second field plate structure on the third STI region.

11. The semiconductor device of claim 9, further comprising a plurality of n-doped barrier strips in the substrate between the first n-doped barrier region and the second n-doped barrier region.

12. The semiconductor device of claim 2, wherein part of the third portion overlaps the STI region.

13. The semiconductor device of claim 2, wherein part of the fourth portion overlaps the STI region.

14. The semiconductor device of claim 3, further comprising:

a first field plate structure on the first STI region; and a second field plate structure on the second STI region.

15. The semiconductor device of claim 8, wherein parts of the third portion overlap the first STI region and the second STI region.

16. The semiconductor device of claim 8, wherein parts of the fourth portion overlap the first STI region and the second STI region.

17. The semiconductor device of claim 6, wherein the third portion of the substrate and the fourth portion of the substrate are located under the second plurality of fin-shaped structures.

18. The semiconductor device of claim 9, wherein parts of the third portion overlap the second STI region and the third STI region.

19. The semiconductor device of claim 9, wherein parts of the fourth portion overlap the second STI region and the third STI region.

20. The semiconductor device of claim 9, further comprising a field plate structure on at least one of the second STI region, the third STI region, or the fourth STI region.

* * * * *